United States Patent
Kim et al.

(10) Patent No.: US 9,209,407 B2
(45) Date of Patent: Dec. 8, 2015

(54) AMINE-BASED COMPOUND AND ORGANIC LIGHT-EMITTING DEVICE INCLUDING THE SAME

(71) Applicant: SAMSUNG DISPLAY CO., LTD., Yongin, Gyeonggi-do (KR)

(72) Inventors: Young-Kook Kim, Yongin (KR); Seok-Hwan Hwang, Yongin (KR); Hye-Jin Jung, Yongin (KR); Jun-Ha Park, Yongin (KR); Eun-Young Lee, Yongin (KR); Jin-O Lim, Yongin (KR); Sang-Hyun Han, Yongin (KR); Eun-Jae Jeong, Yongin (KR); Soo-Yon Kim, Yongin (KR); Jong-Hyuk Lee, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 154 days.

(21) Appl. No.: 13/800,971

(22) Filed: Mar. 13, 2013

(65) Prior Publication Data
US 2014/0138632 A1    May 22, 2014

(30) Foreign Application Priority Data

Nov. 19, 2012 (KR) .................. 10-2012-0131109

(51) Int. Cl.
*H01L 51/50* (2006.01)
*H01L 51/00* (2006.01)

(52) U.S. Cl.
CPC .......... *H01L 51/006* (2013.01); *H01L 51/0052* (2013.01); *H01L 51/0054* (2013.01); *H01L 51/0061* (2013.01); *H01L 51/0067* (2013.01); *H01L 51/0072* (2013.01); *H01L 51/0073* (2013.01); *H01L 51/0094* (2013.01); *H01L 51/5056* (2013.01)

(58) Field of Classification Search
None
See application file for complete search history.

(56) References Cited

U.S. PATENT DOCUMENTS

| | | | |
|---|---|---|---|
| 5,153,073 | A | 10/1992 | Ohnuma et al. |
| 5,635,308 | A | 6/1997 | Inoue et al. |
| 5,972,247 | A | 10/1999 | Shi et al. |
| 6,455,720 | B1 | 9/2002 | Suzuki et al. |
| 6,465,115 | B2 | 10/2002 | Shi et al. |
| 6,596,415 | B2 | 7/2003 | Shi et al. |
| 2004/0214035 | A1 | 10/2004 | Ikeda et al. |
| 2007/0018569 | A1* | 1/2007 | Kawamura et al. ........... 313/504 |
| 2009/0153039 | A1 | 6/2009 | Kim et al. |
| 2011/0240979 | A1* | 10/2011 | Kim et al. ........................ 257/40 |

FOREIGN PATENT DOCUMENTS

| | | | |
|---|---|---|---|
| JP | 08-012600 A | 1/1996 | |
| JP | 2000-003782 A | 1/2000 | |
| JP | 2001-207167 A | 7/2001 | |
| JP | 2011-084717 A | 4/2011 | |
| KR | 2002-0070333 A | 9/2002 | |
| KR | 10-2009-0051647 A | 5/2009 | |
| KR | 10-2011-0034977 A | 4/2011 | |
| KR | 10-2011-0034977 | * 10/2012 | ............. C09K 11/06 |

\* cited by examiner

*Primary Examiner* — Gregory Clark
(74) *Attorney, Agent, or Firm* — Robert E. Bushnell, Esq.

(57) ABSTRACT

An amine-based compound and an organic light-emitting diode including the amine-based compound are provided. The amine-based compound may be used between a pair of electrodes of an organic light-emitting diode. For example, the amine-based compound may be used in an emission layer and/or between the emission layer and an anode (for example, in a hole injection layer, a hole transport layer, a functional layer having a hole injection ability and a hole transport ability). Accordingly, an organic light-emitting diode including a first electrode, a second electrode facing the first electrode, and an organic layer that is interposed between the first electrode and the second electrode, and includes the amine-based compound is provided.

17 Claims, 1 Drawing Sheet

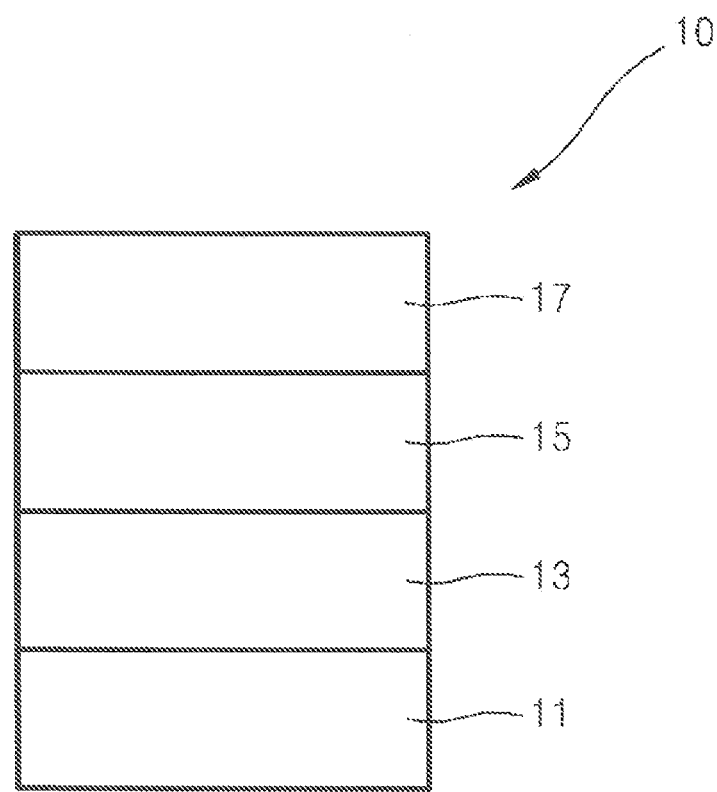

AMINE-BASED COMPOUND AND ORGANIC LIGHT-EMITTING DEVICE INCLUDING THE SAME

CLAIM OF PRIORITY

This application claims the benefit of Korean Patent Application No. 10-2012-0131109, filed on Nov. 19, 2012 in the Korean Intellectual Property Office, the disclosure of which is incorporated herein in its entirety by reference.

BACKGROUND OF THE INVENTION

1. Field of the Invention

The present invention relates to a compound for an organic light-emitting diode and an organic light-emitting diode.

2. Description of the Related Art

Organic light-emitting diodes (OLEDs), which are self-emitting diodes, have advantages such as wide viewing angles, excellent contrast, quick response, high brightness, and excellent driving voltage characteristics, and can provide multicolored images.

A typical OLED has a structure including a substrate, and an anode, a hole transport layer (HTL), an emission layer (EML), an electron transport layer (ETL), and a cathode which are sequentially stacked on the substrate. The HTL, the EML, and the ETL are organic thin films formed of organic compounds.

An operating principle of an OLED having the above-described structure is as follows.

When a voltage is applied between the anode and the cathode, holes injected from the anode move to the EML via the HTL, and electrons injected from the cathode move to the EML via the ETL. The holes and electrons (carriers) recombine in the organic EML to generate excitons. When the excitons drop from an excited state to a ground state, light is emitted.

SUMMARY OF THE INVENTION

The present invention provides an amine-based compound having a novel structure and an organic light-emitting diode including the same.

According to an aspect of the present invention, there is provided an amine-based compound according to an embodiment of the present invention is represented by Formula 1 below:

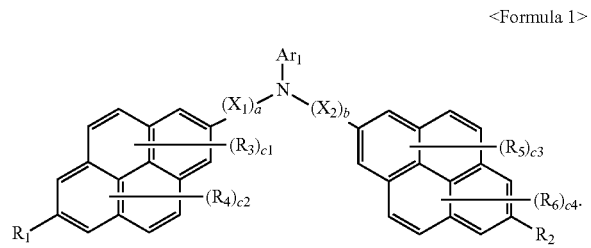

<Formula 1>

In Formula 1, $X_1$ and $X_2$ may be each independently a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

a and b may be each independently an integer of 0 to 5;

$Ar_1$ may be a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group;

$R_1$ to $R_6$ may be each independently a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_2$-$C_{60}$ heteroaryl group; and c1 to c4 may be each independently an interger of 1 to 4.

According to another embodiment of the present invention, there is provided an organic light-emitting diode comprising: a first electrode; a second electrode facing the first electrode; and an organic layer interposed between the first electrode and the second electrode, and the organic layer comprises one or more kinds of the amine-based compound.

BRIEF DESCRIPTION OF THE DRAWINGS

The above and other features and advantages of the present invention will become more apparent by describing in detail exemplary embodiments thereof with reference to FIG. 1 that is a cross-sectional view of the structure of an organic light-emitting diode according to an embodiment of the present invention.

DETAILED DESCRIPTION OF THE INVENTION

An amine-based compound according to the present invention is represented by Formula 1 below:

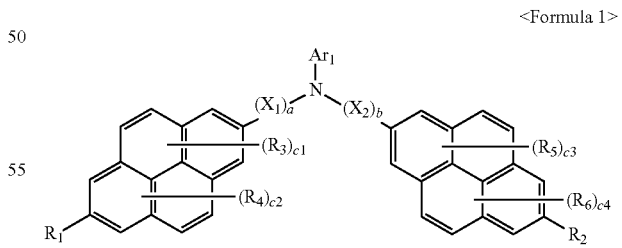

<Formula 1>

$X_1$ and $X_2$ in Formula 1 may be each independently a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group.

For example, $X_1$ and $X_2$ may be each a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzofuranylene group, a substituted or unsubstituted dibenzothiophenylene group, or a substituted or unsubstituted benzocarbazolyl group.

According to another embodiment of the present invention, $X_1$ and $X_2$ may be each independently represented by one of Formulae 2-1 to 2-24 below:

Formula 2-1
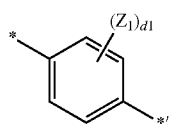

Formula 2-2
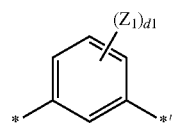

Formula 2-3
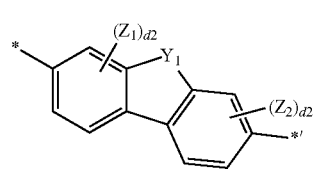

Formula 2-4
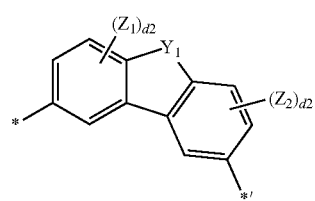

Formula 2-5
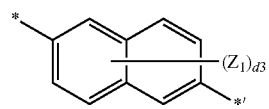

Formula 2-6
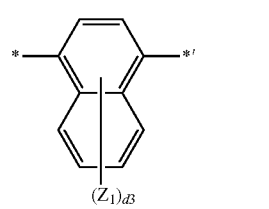

Formula 2-7
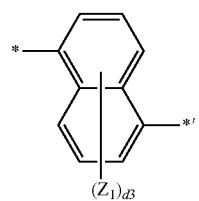

Formula 2-8
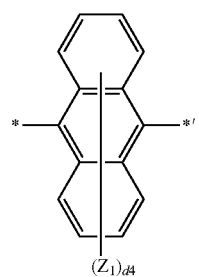

Formula 2-9
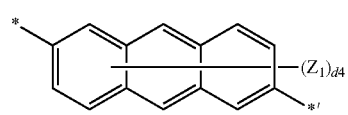

Formula 2-10
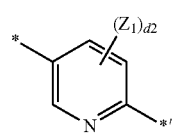

Formula 2-11 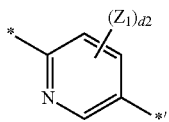

Formula 2-12 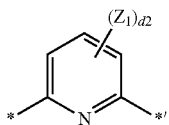

Formula 2-13 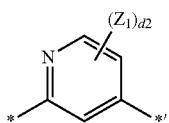

Formula 2-14 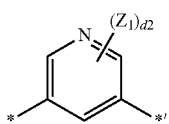

Formula 2-15 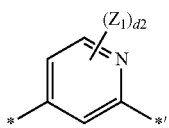

Formula 2-16 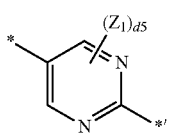

Formula 2-17 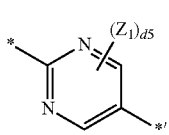

Formula 2-18 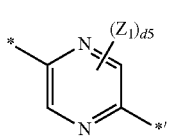

Formula 2-19 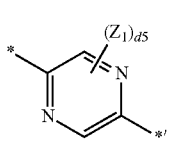

Formula 2-20 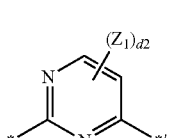

Formula 2-21 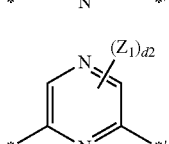

Formula 2-22 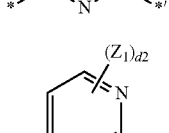

Formula 2-23 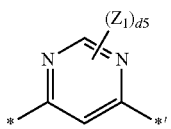

Formula 2-24 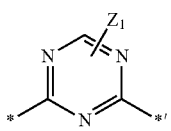

Y1 in Formulae 2-1 to 2-24 may be O, S, C(R21)(R22), or N(R23).

Z1, Z2, and R21 to R23 in Formulae 2-1 to 2-24 may be each independently the same or different within a formula and across formulas selected from: a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a C1-C20 alkyl group, and a C1-C20 alkoxy group; a C1-C20 alkyl group and a C1-C20 alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a C6-C20 aryl group and a C2-C20 heteroaryl group; a C6-C20 aryl group and C2-C20 heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a C1-C60 alkyl group, a C2-C60 alkenyl group, a C2-C60 alkynyl group, a C1-C60 alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; or —Si(Q13)(Q14)(Q15) where Q13 to Q15 may be each independently a C1-C20 alkyl group, a C1-C20 alkoxy group, a C6-C20 aryl group, or a C2-C20 heteroaryl group.

For example, Z1, Z2, and R21 to R23 may be each independently selected from: a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a C1-C20 alkyl group, and a C1-C20 alkoxy group; a C1-C20 alkyl group and C1-C20 alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one selected from a deuterium atom, a halogen atom, a hydroxyl group, a cyano group, a nitro group, an amino group, an amidino group, a hydrazine, a a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —Si(Q13)(Q14)(Q15) where Q13 to Q15 may be each independently a C1-C20 alkyl group, a C1-C20 alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group, but is not limited thereto.

In Formulae 2-1 to 2-24, d1 is an integer of 1 to 4, d2 is an integer of 1 to 3, d3 is an integer of 1 to 6, d4 is an integer of 1 to 8, and d5 is an integer of 1 or 2.

In Formulae 2-1 to 2-24, * refers to a binding site with "N" in Formula 1 or a binding site with neighboring $X_1$ or $X_2$, and *' refers to a binding site with a $2^{th}$ carbon of a pyrene ring in Formula 1 or a binding site with a neighboring $X_1$ or $X_2$. These may be easily recognized with reference to Compounds 1 to 54.

According to an embodiment of the present invention, $X_1$ and $X_2$ in Formula 1 may be each independently represented by one of Formulae 3-1 to 3-9 below, but is not limited thereto.

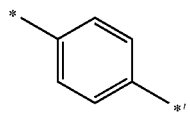

Formula 3-1

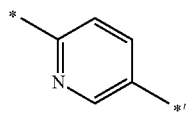

Formula 3-2

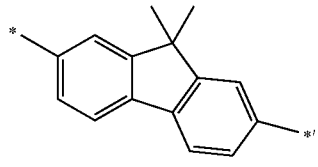

Formula 3-3

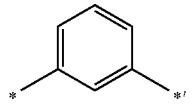

Formula 3-4

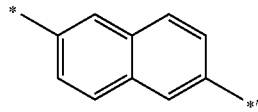

Formula 3-5

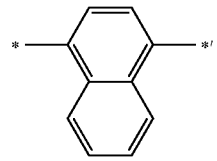

Formula 3-6

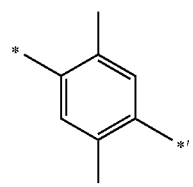

Formula 3-7

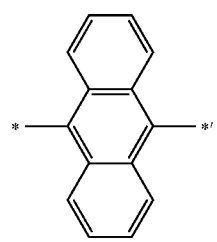

Formula 3-8

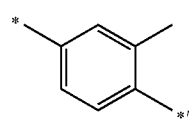

Formula 3-9

In Formula 1, a refers to the number of $X_1$, and b refers to the number of $X_2$, and a and b may be each independently an integer of 0 to 5. When a and/or b are 0, the $2^{th}$ carbon of "pyrene" in Formula 1 is directly connected to "N" of Formula 1. When a is 2 or more, 2 or more of $X_1$ may be identical to or different from each other. When b is 2 or more, 2 or more of $X_2$ may be identical to or different from each other.

According to an embodiment of the present invention, in Formula 1, a=0 and b=0, a=1 and b=0, a=2 and b=0, or a=1 and b=1, but the values of a and b are not limited thereto.

$Ar_1$ in Formula 1 may be a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group.

For example. $Ar_1$ may be a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenanthrolinyl group, a substituted or unsubstituted benzooxazolyl, a substituted or unsubstituted benzoimidazolyl a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl, a substituted or unsubstituted dibenzofuranyl group, a substituted or unsubstituted dibenzothiophenyl group, or a substituted or unsubstituted benzocarbazolyl group.

According to an embodiment of the present invention, $Ar_1$ may be each independently represented by one of Formulae 4-1 to 4-22 below:

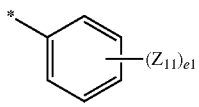

Formula 4-1

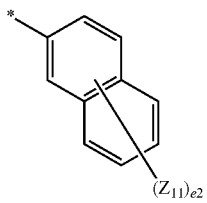

Formula 4-2

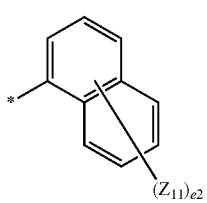

Formula 4-3

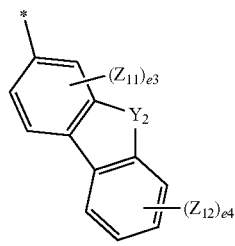

Formula 4-4

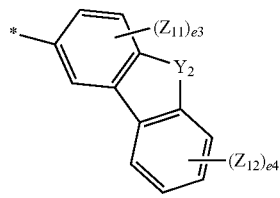

Formula 4-5

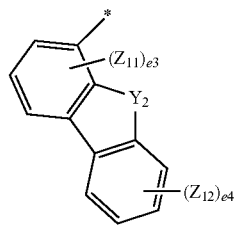

Formula 4-6

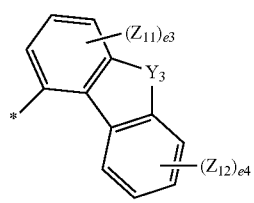

Formula 4-7

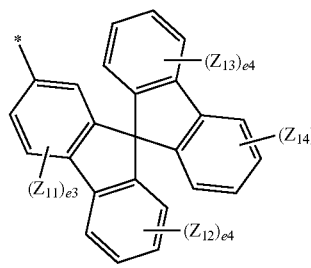

Formula 4-8

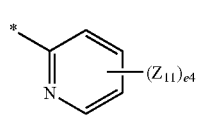

Formula 4-9

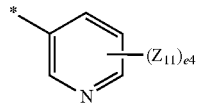

Formula 4-10

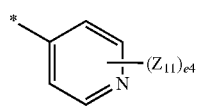

Formula 4-11

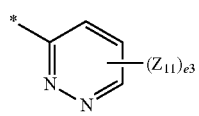

Formula 4-12

Formula 4-13

Formula 4-14

Formula 4-15

Formula 4-16

Formula 4-17

Formula 4-18

Formula 4-19

Formula 4-20

Formula 4-21

Formula 4-22

$Y_2$ in Formulae 4-1 to 4-22 may be O, S, $C(R_{25})(R_{26})$, or $N(R_{27})$.

$Z_{11}$ to $Z_{14}$ and $R_{25}$ to $R_{27}$ in Formulae 4-1 to 4-22 may be each independently the same or different within a formula and across formulas selected from: a hydrogen atom, a deuterium atom, a halogen atom, a hydroxyl group, a cyano group, a nitro group, an amino an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, substituted with at least one selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a $C_6$-$C_{20}$ aryl group and a $C_2$-$C_{20}$ heteroaryl group; a $C_6$-$C_{20}$ aryl group and a $C_2$-$C_{20}$ heteroaryl group, substituted with at least one selected from a deuterium atom, a halogen atom, a hydroxyl group, a cyano group, a nitro group, an amino group, an amidino group, a hydrazine, a a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —$Si(Q_{13})(Q_{14})(Q_{15})$ where $Q_{13}$ to $Q_{15}$ may be each independently a $C_1$-$C_{20}$ alkyl group, a $C_1$-$C_{20}$ alkoxy group, a $C_6$-$C_{20}$ aryl group, or a $C_2$-$C_{20}$ heteroaryl group.

For example, $Z_{11}$ to $Z_{14}$ and $R_{25}$ to $R_{27}$ may be each independently selected from: a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —$Si(Q_{13})(Q_{14})(Q_{15})$ where $Q_{13}$ to $Q_{15}$ may be each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group, but are not limited thereto.

In Formulae 4-1 to 4-22, e1 may be is an integer of 1 to 5, e2 may be is an integer of 1 to 7, e3 may be is an integer of 1 to 3, e4 may be is an integer of 1 to 4, and e5 may be is an integer of 1 or 2.

In Formulae 4-1 to 4-22, * refers to a binding site with "N" in Formula 1.

For example, $Ar_1$ in Formula 1 may be represented by any one of Formulae 5-1 to 5-23, but is not limited thereto:

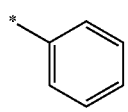

Formula 5-1

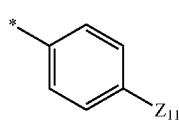

Formula 5-2

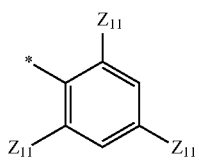

Formula 5-3

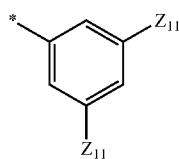

Formula 5-4

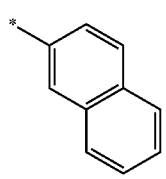

Formula 5-5

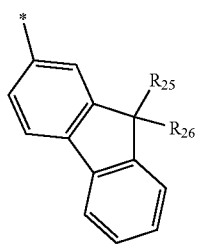

Formula 5-6

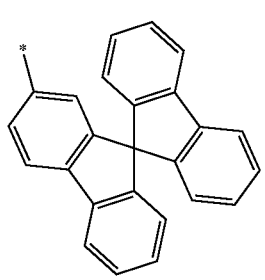

Formula 5-7

-continued

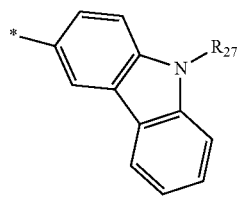

Formula 5-8

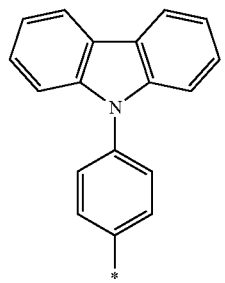

Formula 5-9

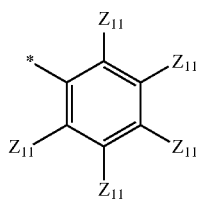

Formula 5-10

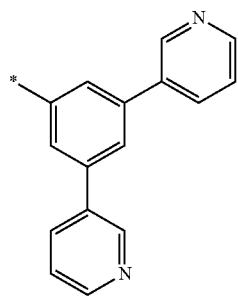

Formula 5-11

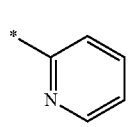

Formula 5-12

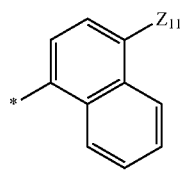

Formula 5-13

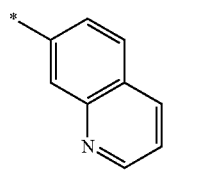

Formula 5-14

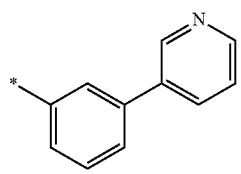

Formula 5-15

-continued

Formula 5-16
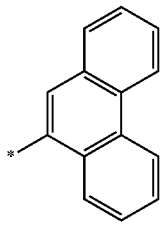

Formula 5-17
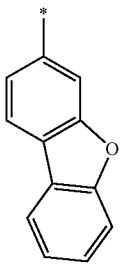

Formula 5-18
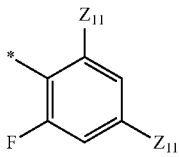

Formula 5-19
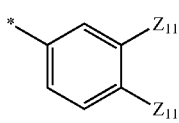

Formula 5-20
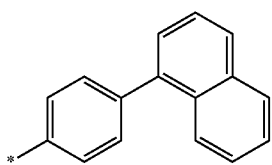

Formula 5-21
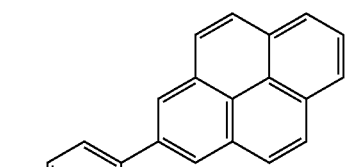

Formula 5-22
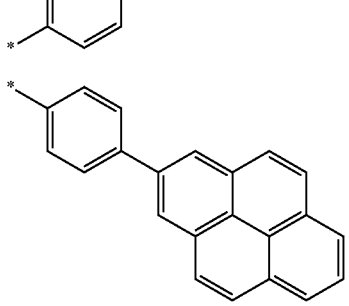

Formula 5-23
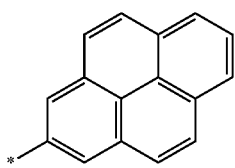

A description about $Z_{11}$ and $R_{25}$ to $R_{27}$ in Formulae 5-1 to 5-23 are the same as defined above. For example. $Z_{11}$ and $R_{25}$ to $R_{27}$ in Formulae 5-1 to 5-23 may be each independently selected from: a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; or —Si($Q_{13}$)($Q_{14}$)($Q_{15}$) where $Q_{13}$ to $Q_{15}$ may be each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group, but are not limited $R_1$ to $R_6$ in Formula 1 may be each independently a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_2$-$C_{60}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, or —Si($Q_3$)($Q_4$)($Q_5$) where $Q_3$ to $Q_5$ may be each independently a $C_1$-$C_{60}$ alkyl group, a $C_1$-$C_{60}$ alkoxy group, a $C_6$-$C_{60}$ aryl group, or a $C_2$-$C_{60}$ heteroaryl group.

For example, $R_1$ to $R_6$ may be each independently a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, dimethylfluorenyl group, diphenylfluorenyl group, carbazolyl group, phenylcarbazolyl group, pyridinyl group, pyrimidinyl group, pyrazinyl group, pyridazinyl group, triazinyl group, quinolinyl group, isoquinolinyl group, or —Si($Q_3$)($Q_4$)($Q_5$) where $Q_3$ to $Q_5$ may be each independently a $C_1$-$C_{20}$ alkyl group, a $C_1$-$C_{20}$ alkoxy group, a phenyl group, a naphthyl group, an anthryl group, a fluorenyl group, dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl, but are not limited thereto.

For example, $R_3$ to $R_6$ in Formula 1 may be hydrogen.

For example, the amine-based compound represented by Formula 1 may satisfy conditions as follows: $X_1$ and $X_2$ are each independently represented by one of Formulae 3-1 to 3-9; i) a=0 and b=0, ii) a=1 and b=0, iii) a=2 and b=0, or iv) a=1 and b=1; and $Ar_1$ is a compound represented by any one of Formulae 5-1 to 5-23 below, but the amine-based compound is not limited thereto.

The amine-based compound represented by Formula 1 may be, for example, one of Compounds 1 to 54 below, but is not limited thereto:

1

2

3

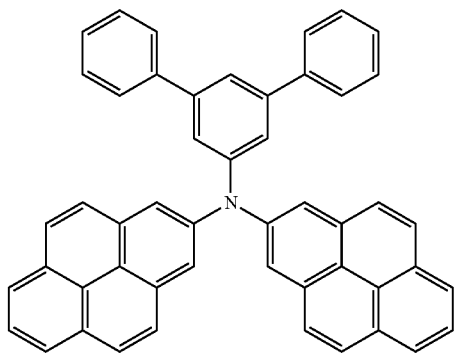

4

5

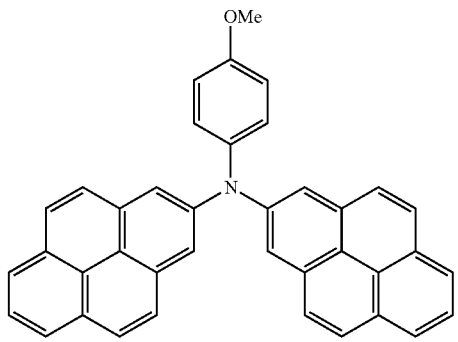

6

7

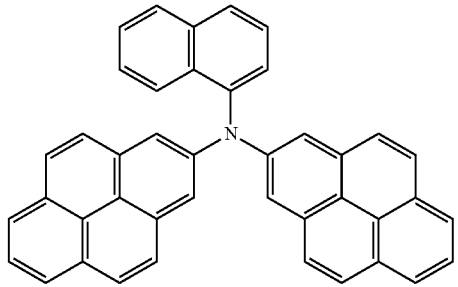

8

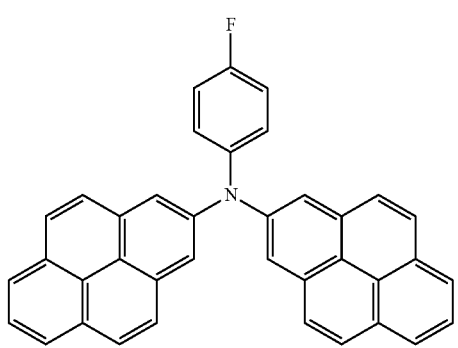

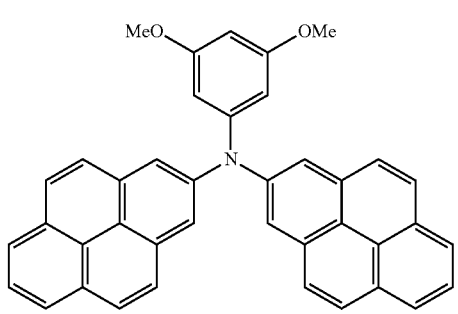

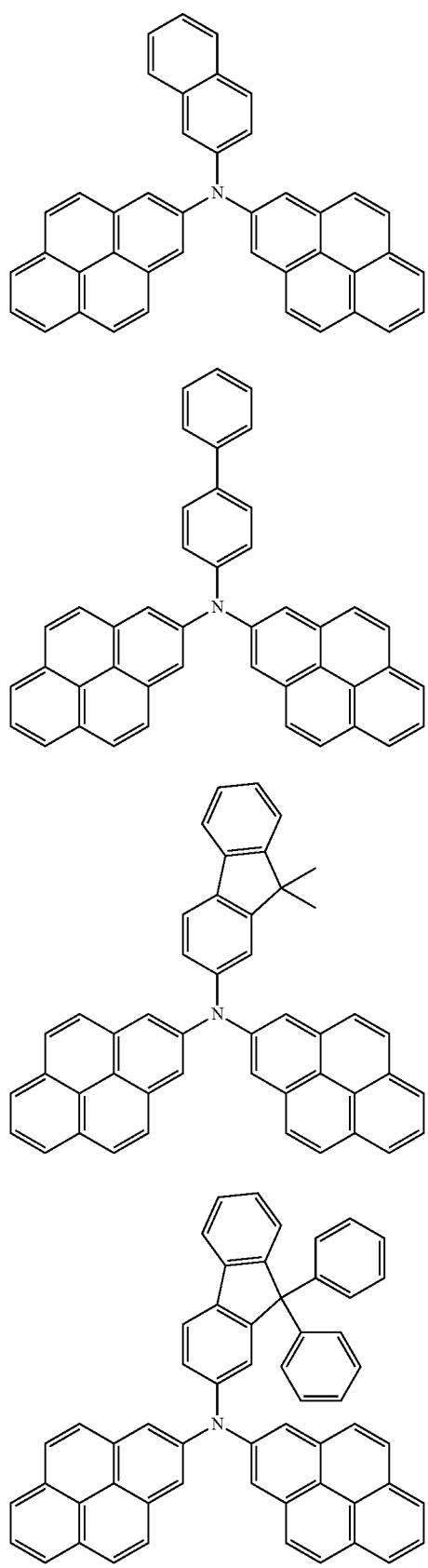
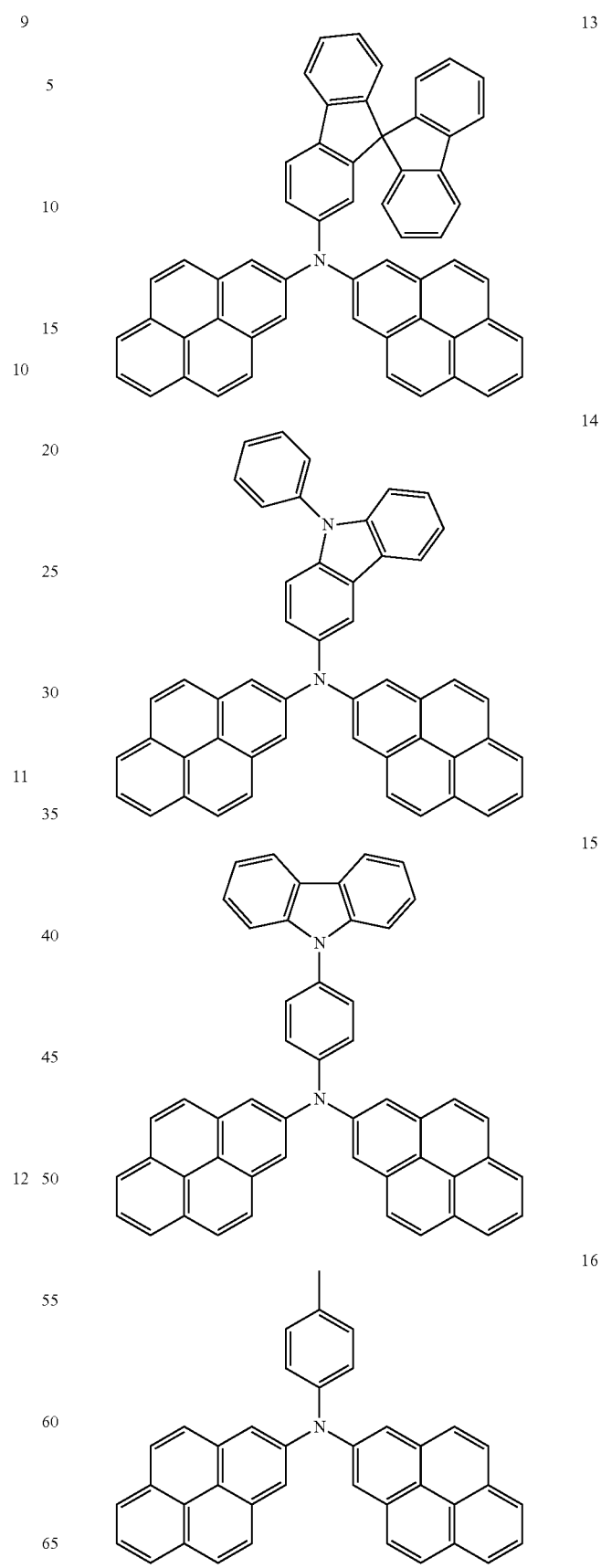

17
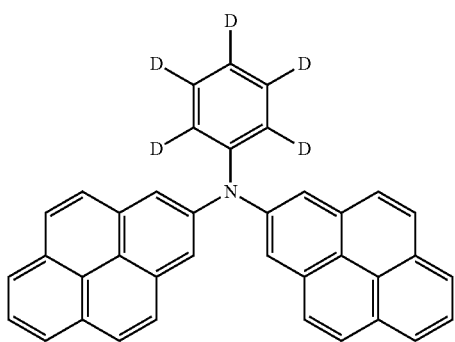
18
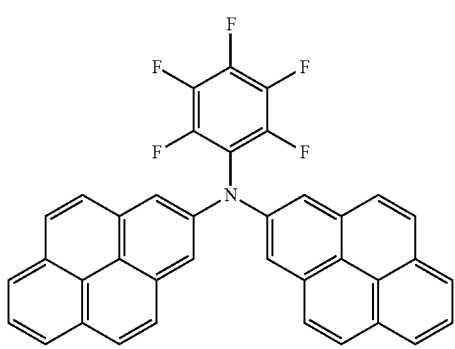
19
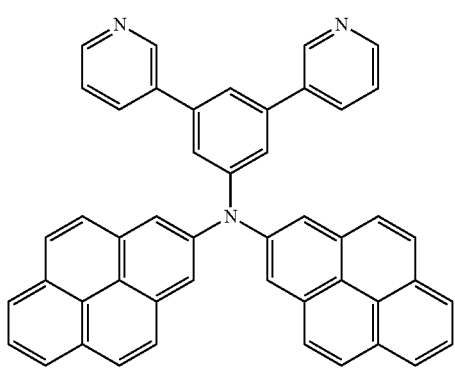
20
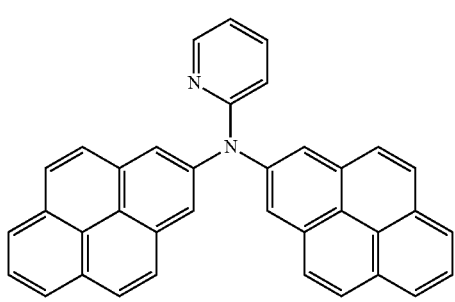
21
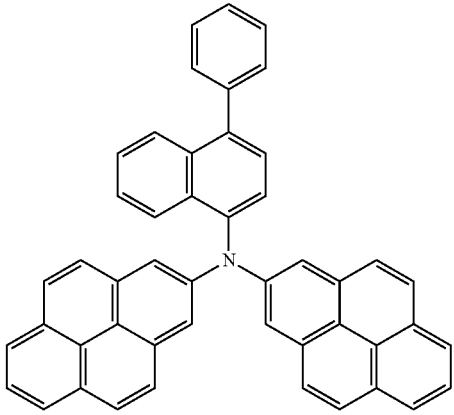
22
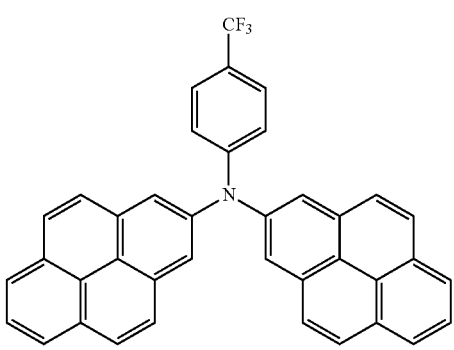
23
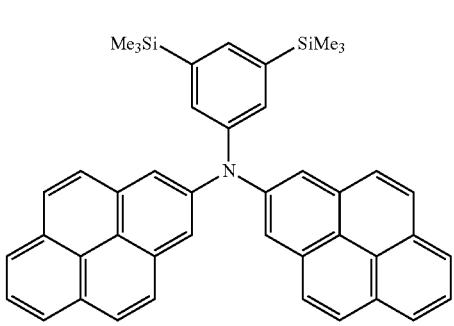
24
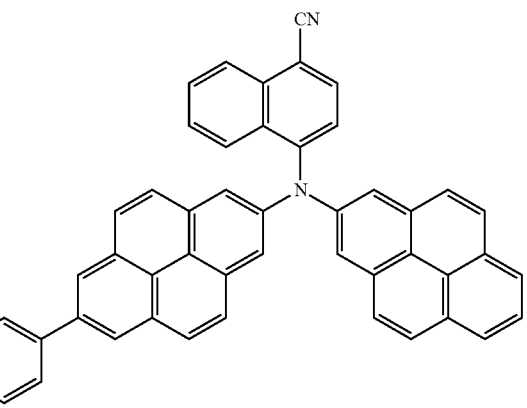

25
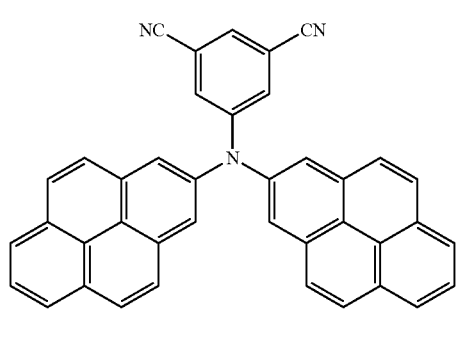
26
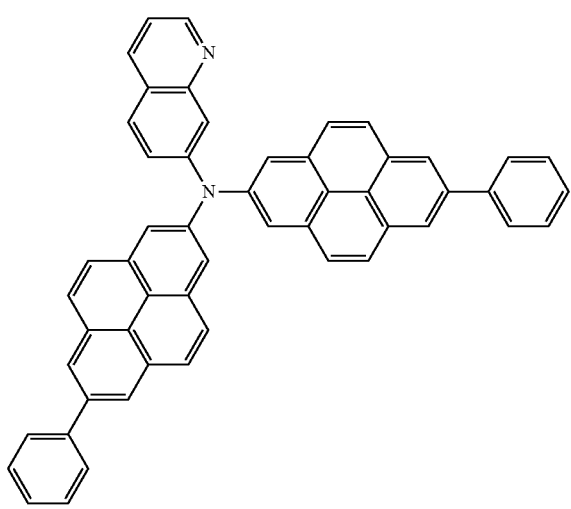
27
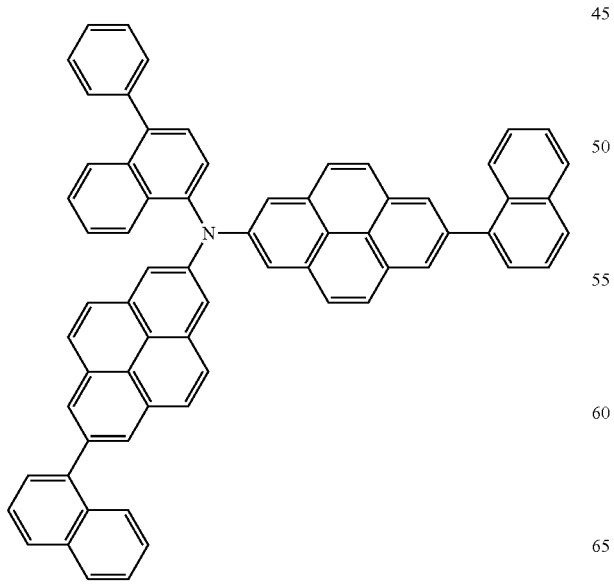
28
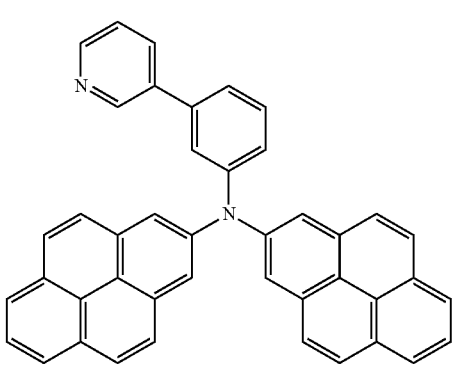
29
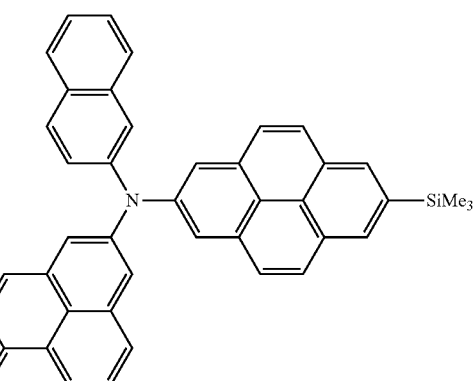
30
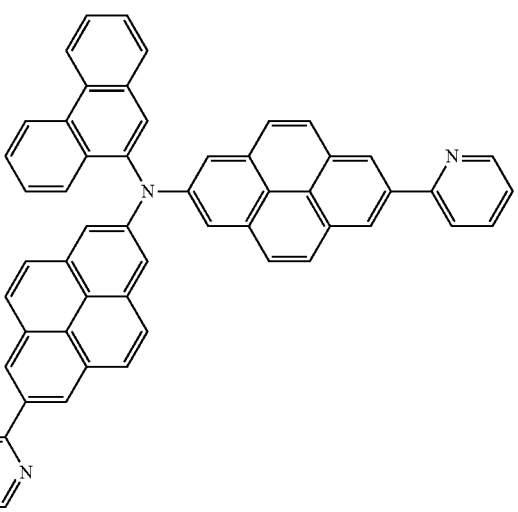

31
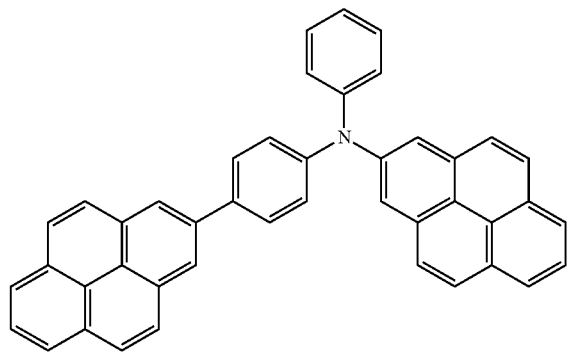
32
33
34
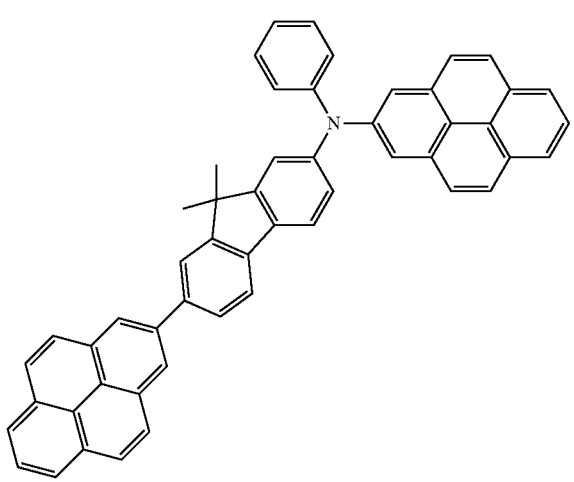
35
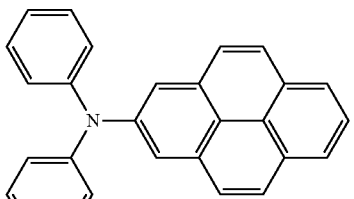
36
37
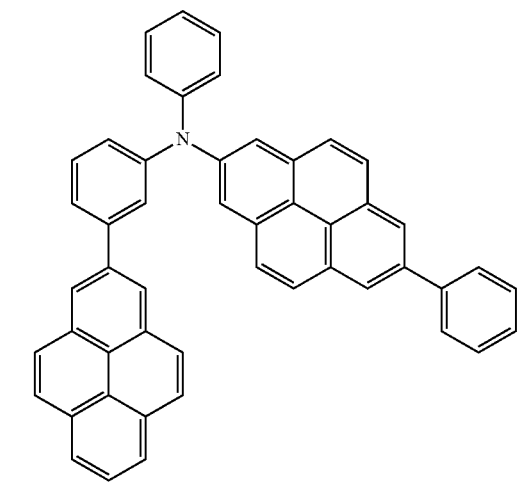

38
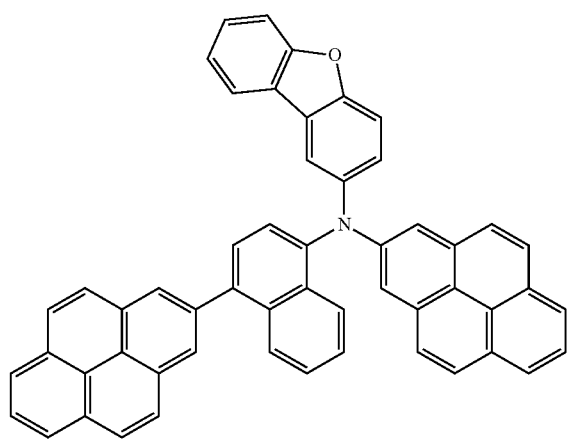
39
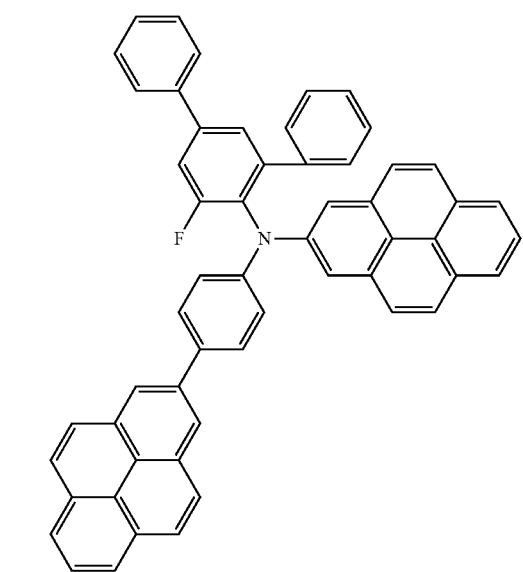
41
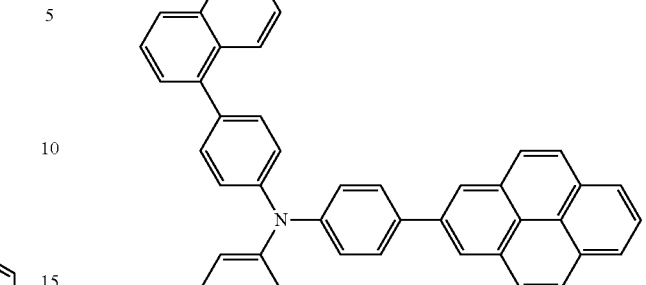
42
43
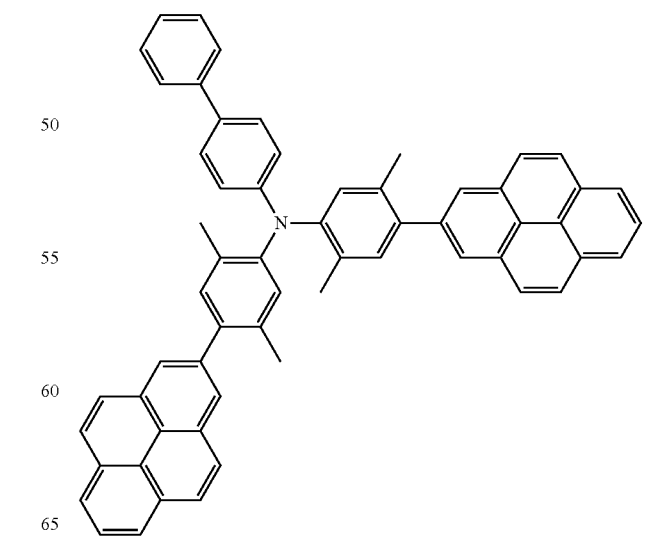

44
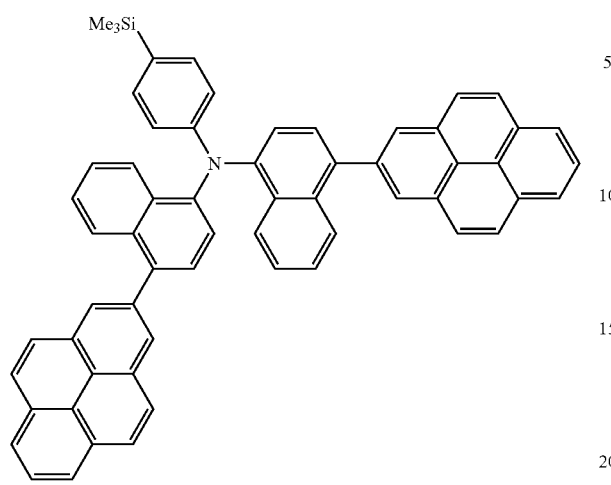
45
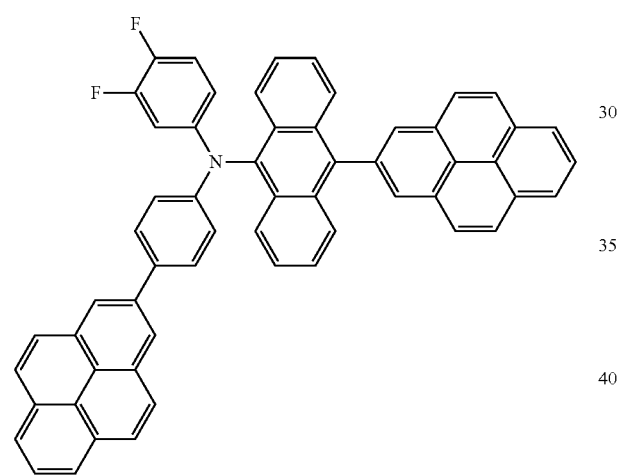
46
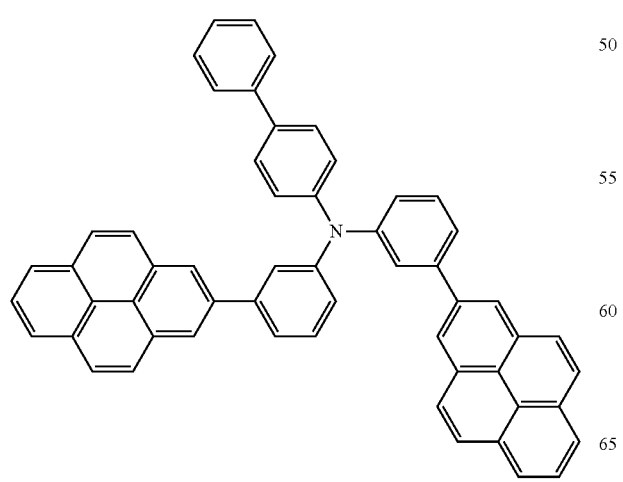
47
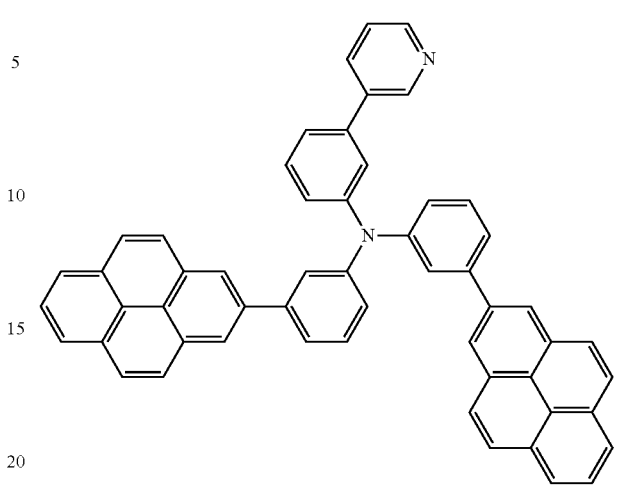
48
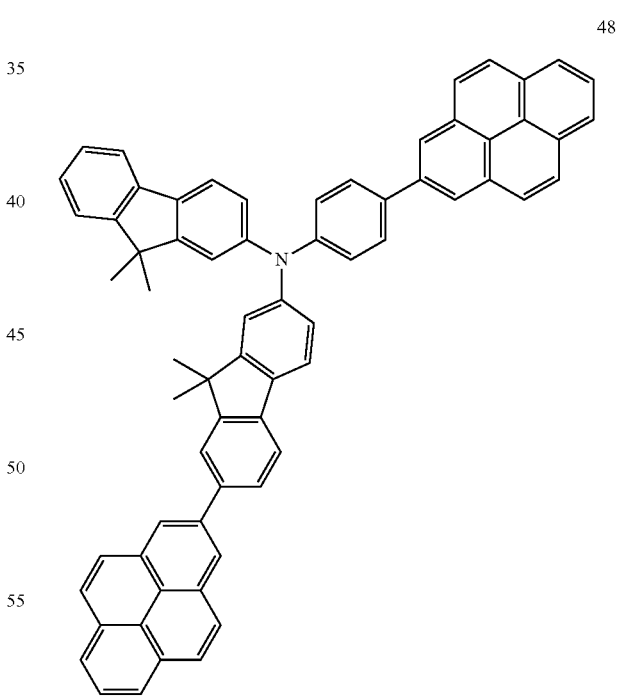

49
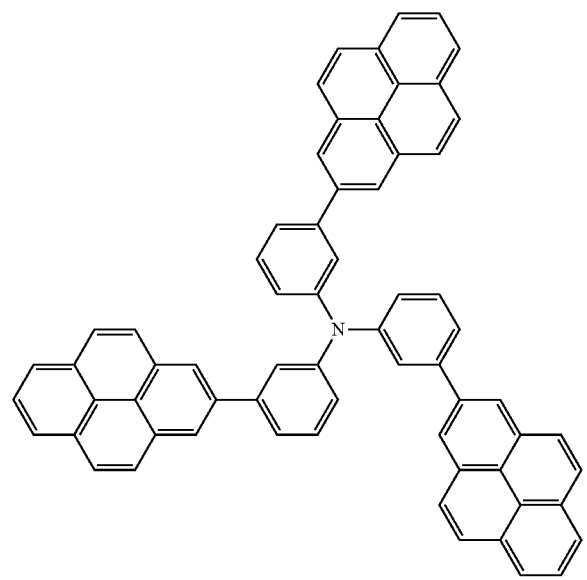
50
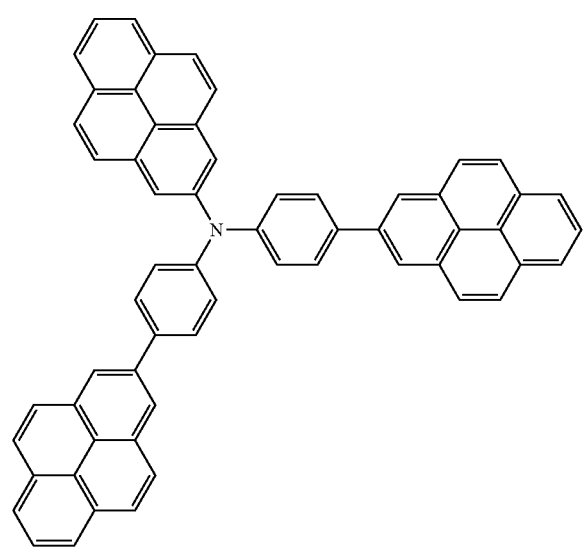
51
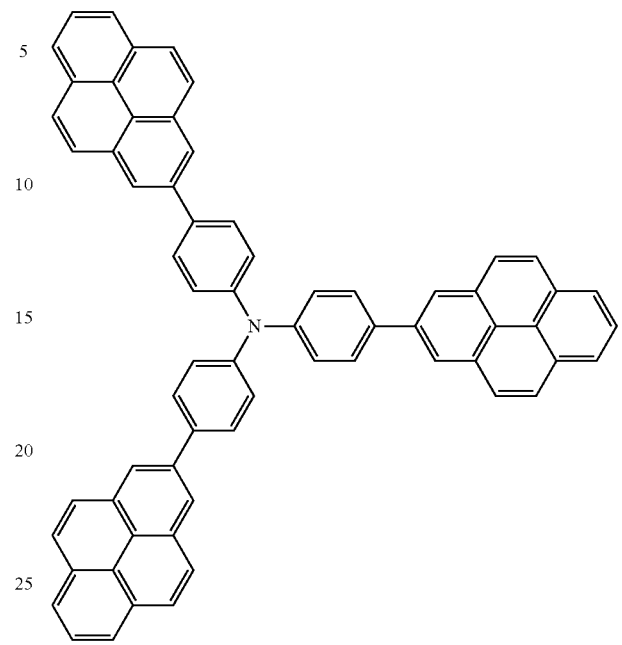
52
53

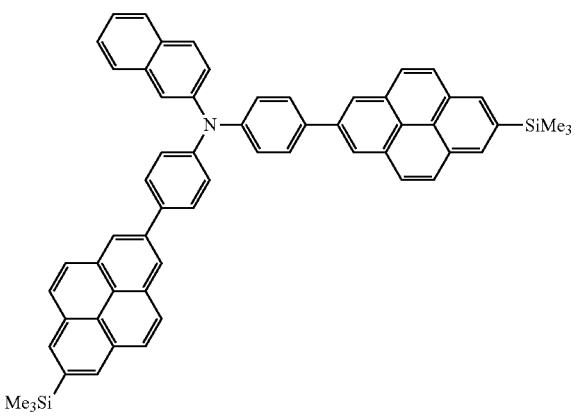

54

At least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{60}$ aryloxy group and the substituted $C_6$-$C_{60}$ arylthio group may be selected from: a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, substituted with at least one of a deuterium atom, a halogen atom, a hydroxyl group, a cyano group, a nitro group, an amino group, an amidino a hydrazine, a hydrazone, a carboxyl group or a salt thereof, a sulfonic acid group or a salt thereof, and a phosphoric acid group or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —Si($Q_{13}$)($Q_{14}$)($Q_{15}$) where $Q_{13}$ to $Q_{15}$ may be each independently a $C_1$-$C_{60}$ alkyl group, a $C_1$-$C_{60}$ alkoxy group, a $C_6$-$C_{60}$ aryl group, or a $C_2$-$C_{60}$ heteroaryl group, but is not limited thereto.

Regarding the amine-based compound of Formulae 1, the $2^{th}$ carbon of the pyrene ring bonds to N through a single bond (in the case of a=0 and/or b—0) or a linking group ($X_1$ and $X_2$) (see Formula 1' below), and thus, the pyrene ring may cause intermolecular aggregation. Accordingly, an organic light-emitting diode including the amine-based compound of Formula 1 as a material for forming an emission layer may emit light due to an eximer generated resulting from the intermolecular aggregation of the amine-based compound. Thus, an organic light-emitting diode including the amine-based compound of Formula 1 may have high efficiency and a long lifespan. In addition, the organic light-emitting diode including the amine-based compound of Formula 1 may emit blue light that is shifted toward a red light region (for example, greenish blue light), or green light. Furthermore, since the amine-based compound of Formula 1 includes two or more highly conjugated pyrene rings, a high hole transporting ability may be obtained.

<Formulae 1'>

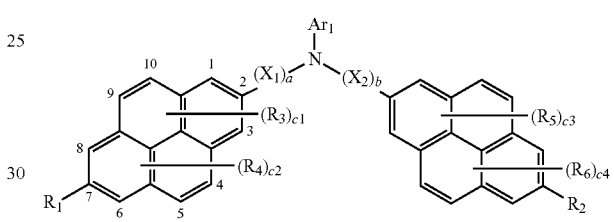

Accordingly, an organic light-emitting diode including the amine-based compound of Formula 1 may have a high driving voltage, high efficiency, high brightness, and a long lifespan.

The amine-based compound of Formula 1 may be synthesized by using known organosynthesis methods. The synthesis methods for the amine-based compound may be obvious to one of ordinary skill in the art in view of the examples below.

The amine-based compound of Formula 1 may be used between a pair of electrodes of an organic light-emitting diode. For example, the amine-based compound may be used in an emission layer and/or between the emission layer and an anode (for example, in a hole injection layer, a hole transport layer, a functional layer having a hole injection ability and a hole transport ability).

Accordingly, an organic light-emitting diode including a first electrode, a second electrode facing the first electrode, and an organic layer that is interposed between the first electrode and the second electrode, and includes the amine-based compound represented by Formulae 1 is provided.

The term "(an organic layer) includes at least one of the amine-based compound" used herein may be interpreted such that (an organic layer) may include one kind of the amine-based compound of Formula 1 or two or more different kinds of the amine-based compound of Formula 1.

For example, the organic layer may include only Compound 4 as the amine-based compound. In this regard, Compound 4 may exist in a hole transport layer of the organic light-emitting diode. According to another embodiment of the present invention, the organic layer may include, as the amine-based compound, Compound 4 and Compound 12. In this regard, Compound 4 and Compound 12 may exist in an identical layer (for example, Compound 4 and Compound 12 may exist in a hole transport layer), or may exist in different layers (for example, Compound 4 may exist in a hole transport layer and Compound 12 may exist in an emission layer.)

The organic layer may include at least one of a hole injection layer, a hole transport layer, a functional layer having a hole injection ability and a hole transport ability (hereinafter referred to as an "H-functional layer"), a buffer layer, an electron blocking layer, an emission layer, a hole blocking layer, an electron transport layer, an EIL, and a functional layer (hereinafter referred to as an "E-functional layer") having an electron transport ability and an electron injection ability.

The term "an organic layer" used herein refers to a single layer and/or a plurality of layers interposed between the first electrode and the second electrode of the organic light-emitting diode.

FIG. 1 is a schematic sectional view of an organic light-emitting diode 10 according to an embodiment of the present invention. Hereinafter, the structure and manufacturing method of an organic light-emitting diode according to an embodiment of the present invention is described in detail with reference to FIG. 1.

A substrate 11, which may be any substrate that is used in general organic light-emitting diodes, may be a glass substrate or a transparent plastic substrate with excellent mechanical strength, thermal stability, transparency, surface smoothness, ease of handling, and water resistance.

The first electrode 13 may be formed by, for example, depositing or sputtering a material for a first electrode on the substrate 11. When the first electrode 13 is an anode, the material for the first electrode may be selected from materials with a high work function to enable ease of hole injection. The first electrode 13 may be a reflective electrode or a transmissive electrode. The material for the first electrode may be a transparent material with high conductivity, and examples of such a material are indium tin oxide (ITO), indium zinc oxide (IZO), tin oxide (SnO2), and zinc oxide (ZnO). When magnesium (Mg), aluminum (Al), aluminum-lithium (Al—Li), calcium (Ca), magnesium-indium (Mg—In), magnesium-silver (Mg—Ag), or the like is used, the first electrode 13 may be used as a reflective electrode.

The first electrode 13 may be a single layer or may have a multi-layered structure including two or more layers. For example, the first electrode 13 may have a three-layered structure of ITO/Ag/ITO, but the structure thereof is not limited thereto.

The organic layer 15 may be disposed on the first electrode 13.

The organic layer 15 may include a hole injection layer, a hole transport layer, a buffer layer, an emission layer, an electron transport layer, and an EIL.

A hole injection layer (HIL) may be formed on the first electrode 13 by using various methods, such as vacuum deposition, spin coating, casting, Langmuir-Blodgett (LB) deposition.

When the HIL is formed using vacuum deposition, vacuum deposition conditions may vary according to the compound that is used to form the HIL, and the desired structure and thermal properties of the HIL to be formed. For example, vacuum deposition may be performed at a temperature of about 100° C. to about 500° C., a pressure of about $10^{-8}$ torr to about $10^{-3}$ torr, and a deposition rate of about 0.01 to about 100 Å/sec. However, the deposition conditions are not limited thereto.

When the HIL is formed using spin coating, the coating conditions may vary according to the compound that is used to form the HIL, and the desired structure and thermal properties of the HIL to be formed. For example, the coating rate may be in the range of about 2000 rpm to about 5000 rpm, and a temperature at which heat treatment is performed to remove a solvent after coating may be in the range of about 80° C. to about 200° C. However, the coating conditions are not limited thereto.

As a material for the HIL, the amine-based compound of Formula 1 may be used. Alternatively, as a known hole injection material, for example, N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4.4',4"-tris (3-methylphenylphenylamino)triphenylamine (m-MTDATA), N,N'-di(1-naphthyl)-N,N'-diphenylbenzidine(NPB), TDATA, 2-TNATA, polyaniline/dodecylbenzenesulfonic acid (Pani/DBSA), poly(3,4-ethylenedioxythiophene)/poly(4-styrenesulfonate)(PEDOT/PSS), polyaniline/camphor sulfonic acid (pani/CSA), or (polyaniline)/poly(4-styrenesulfonate) (PANI/PSS) may be used, but the hole injection material is not limited thereto:

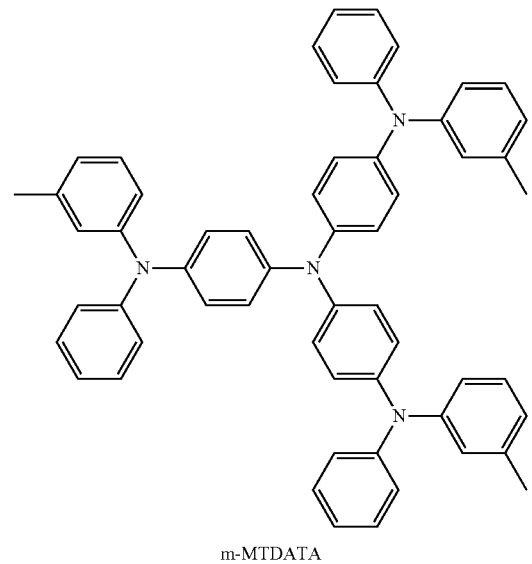

m-MTDATA

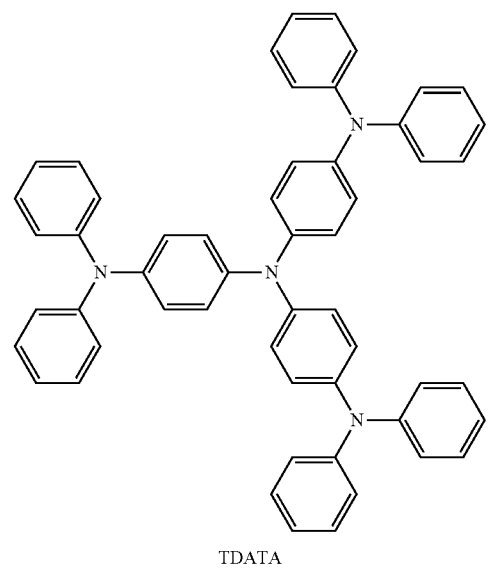

TDATA

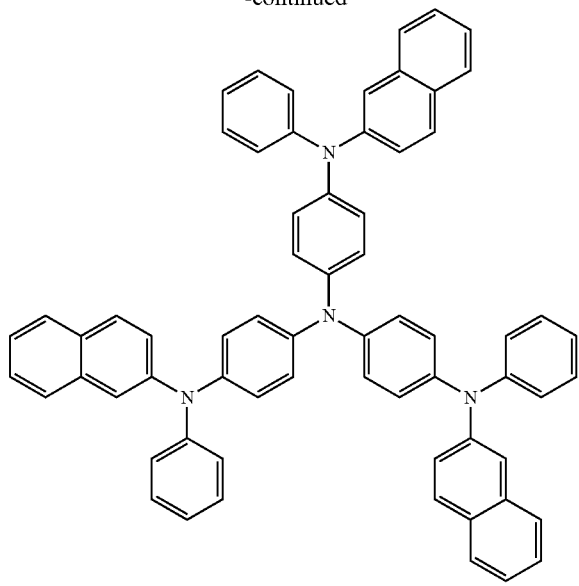

2-TNATA

A thickness of the HIL may be in a range of about 100 Å to about 10000 Å, for example, about 100 Å to about 1000 Å. When the thickness of the HIL is within the range described above, the HIL may have satisfactory hole injection characteristics without a substantial increase in a driving voltage.

Then, a hole transport layer (HTL) may be formed on the HIL by using vacuum deposition, spin coating, casting, LB deposition, or the like. When the HTL is formed using vacuum deposition or spin coating, the deposition and coating conditions may be similar to those for the formation of the HIL, though the deposition and coating conditions may vary according to a compound that is used to form the HTL.

As a material for the HTL, the amine-based compound of Formula 1 may be used. Alternatively, as a known material for a HTL, a carbazole derivative, such as N-phenylcarbazole, or polyvinylcarbazole, N,N'-bis(3-methylphenyl)-N,N'-diphenyl-[1,1-biphenyl]-4,4'-diamine (TPD), 4,4',4''-tris(N-carbazolyl)triphenylamine (TCTA), N,N'-di(1-naphthyl)-N,N'-diphenylbenzidine (NPB), or the like may be used, but the material for the HTL is not limited thereto.

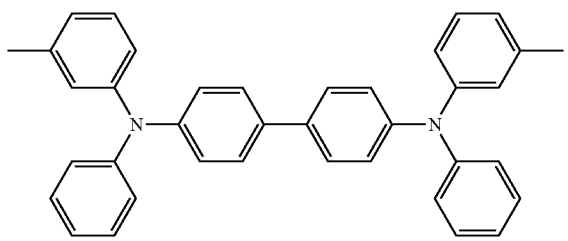

TPD

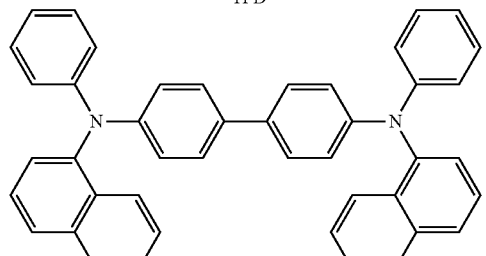

NPB

A thickness of the HTL may be in a range of about 50 Å to about 20000 Å, for example, about 100 Å to about 1500 Å. When the thickness of the HTL is within the range described above, the HTL may have satisfactory hole transport characteristics without a substantial increase in a driving voltage.

The H-functional layer (a functional layer having a hole injection ability and a hole transport ability) may include one or more materials selected from the materials for the HIL and the materials for the HTL. A thickness of the H-functional layer may be in a range of about 500 Å to about 10000 Å, for example, about 100 Å to about 1000 Å. When the thickness of the H-functional layer is within the range described above, the H-functional layer may have satisfactory hole injection and transport characteristics without a substantial increase in a driving voltage.

In addition, at least one layer of the hole injection layer, the hole transport layer, and the H-functional layer may include at least one of a compound represented by Formula 300 below and a compound represented by Formula 301 below:

<Formula 300>

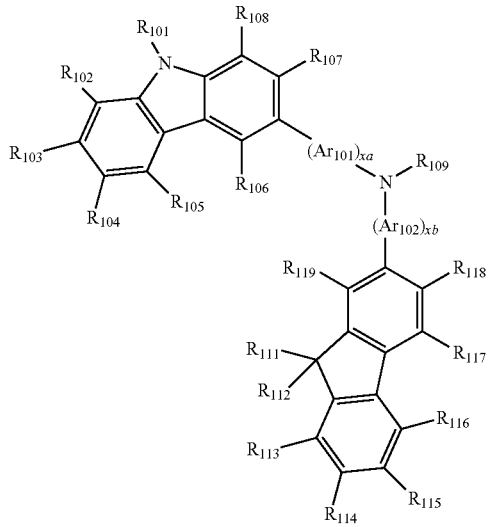

<Formulae 301>

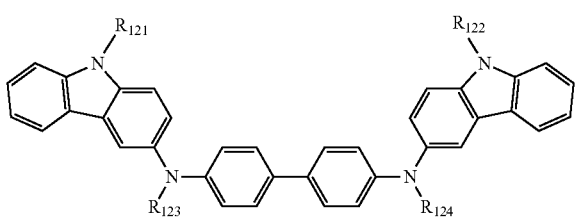

$Ar_{101}$ and $Ar_{102}$ in Formula 300 may be each independently selected from: a substituted or unsubstituted $C_6$-$C_6$ arylene group. For example, $Ar_{101}$ and $Ar_{102}$ may be each independently selected from a phenylene group, a pentalenylene group, an indenylene group, a naphthylene group, an azulenylene group, a heptalenylene group, a substituted or unsubstituted acenaphthylene group, a fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, and a pentacenylene group; and a phenylene group, a pentalenylene group, an indenylene group, a naphthylene group, an azulenylene group, a heptalenylene group, a substituted or unsubstituted acenaphthylene group, a fluorenylene group, a phenalenylene group, a phenanthrenylene group, an anthrylene group, a fluoranthenylene group, a triphenylenylene group, a pyrenylene group, a chrysenylene group, a naphthacenylene group, a picenylene group, a perylenylene group, and a pentacenylene group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl a $C_1$-$C_{60}$ alkoxy group, a $C_3$-$C_{10}$ cycloalkyl group, a $C_3$-$C_{10}$ cycloalkenyl group, a $C_3$-$C_{10}$ heterocycloalkyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group.

xa and xb in Formula 300 may be each independently an integer of 0 to 5, or 0, 1, or 2. For example, xa may be 1 and xb may be 0, but xa and xb are not limited thereto.

$R_{101}$ to $R_{108}$, $R_{111}$ to $R_{119}$, and $R_{121}$ to $R_{124}$ in Formula 300 and 301 may be each independently selected from: a hydrogen atom, a deuterium atom, a halogen atom, a hydroxyl group, a cyano group, a nitro group, an amino group, an amidino group, a hydrazine, a a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group. For example. $R_{51}$ to $R_{58}$, $R_{61}$ to $R_{69}$, and $R_{71}$ and $R_{72}$ may be each independently a hydrogen atom; a deuterium atom; a halogen atom; a hydroxyl group; a cyano group; a nitro group; an amino group; an amidino group; a hydrazine; a hydrazone; a carboxyl group or a salt thereof; a sulfonic acid group or a salt thereof; a phosphoric acid group or a salt thereof; a $C_1$-$C_{10}$ alkyl group (for example, a methyl group, an ethyl group, a propyl group, a butyl group, a pentyl group, a hexyl group, or the like); a $C_1$-$C_{10}$ alkoxy group (for example, a methoxy group, an ethoxy group, a propoxy group, a butoxy group, a pentoxy group, or the like); a $C_1$-$C_{10}$ alkyl group and a $C_1$-$C_{10}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group; a naphthyl group; an anthryl group; a fluorenyl group; a pyrenyl group; and a phenyl group, a naphthyl group, an anthryl group, a fluorenyl group, and a pyrenyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{10}$ alkyl group, and a $C_1$-$C_{10}$ alkoxy group, but is not limited thereto.

$R_{109}$ in Formula 300 may be selected from: a phenyl group; a naphthyl group; an anthryl group; a biphenyl group; a pyridyl group; and a phenyl group, a naphthyl group, an anthryl group, a biphenyl group, and a pyridyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

According to an embodiment of the present invention, the compound represented by Formula 300 may be represented by Formula 300A below, but the compound is not limited to the compound of Formula 300A:

<Formula 300A>

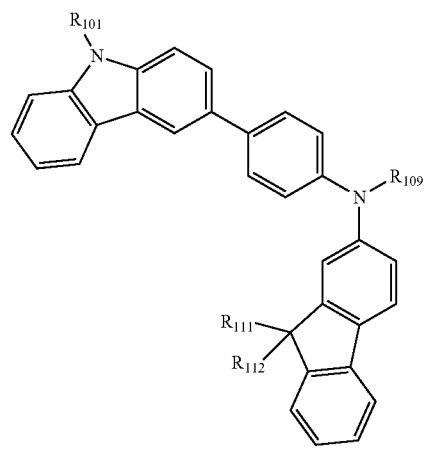

A detailed description of $R_{101}$, $R_{110}$, $R_{121}$ and $R_{109}$ in Formula 300A is already described above.

For example, at least one layer of the HIL, the HTL, and the H-functional layer may include at least one of Compounds 301 to 320, but is not limited thereto:

301

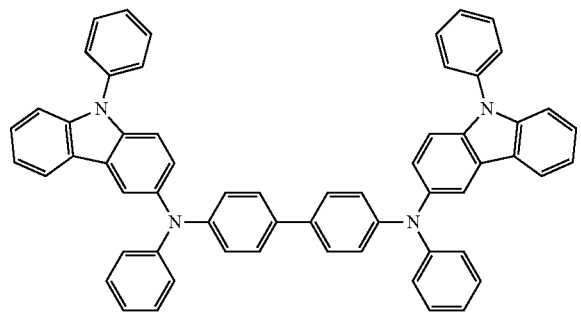

302

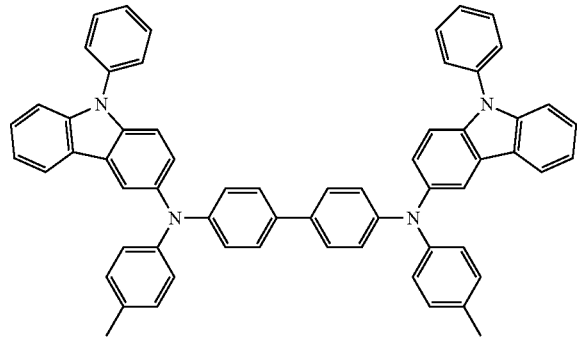

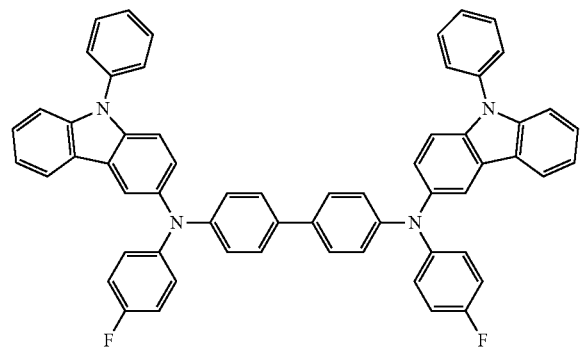
303
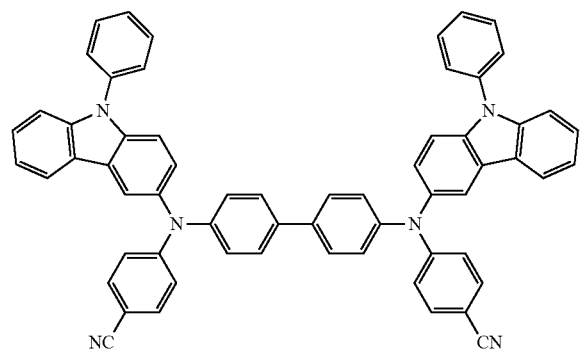
304
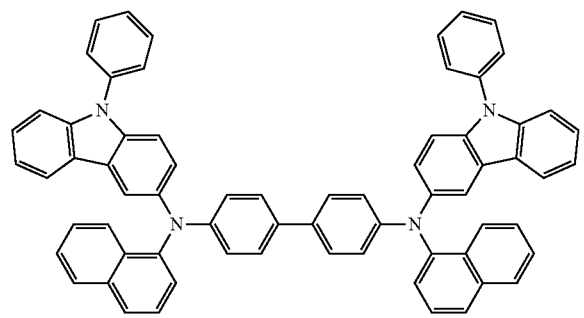
305
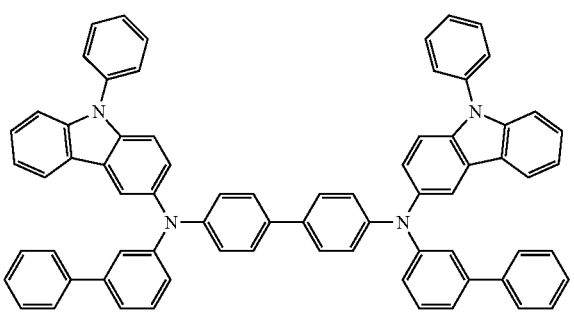
307
308
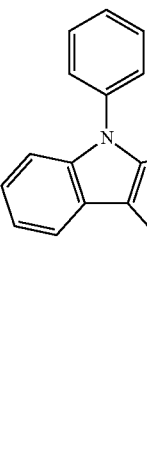
309

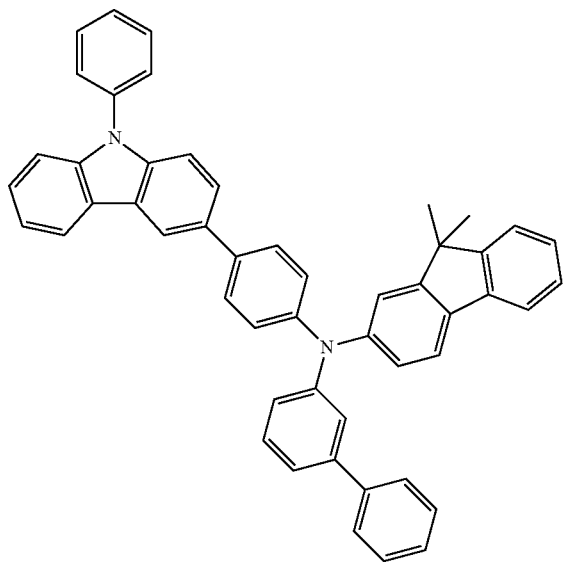
310
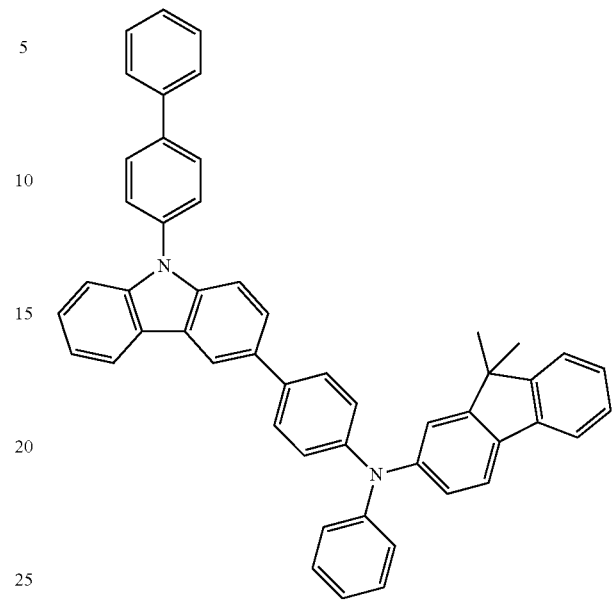
312
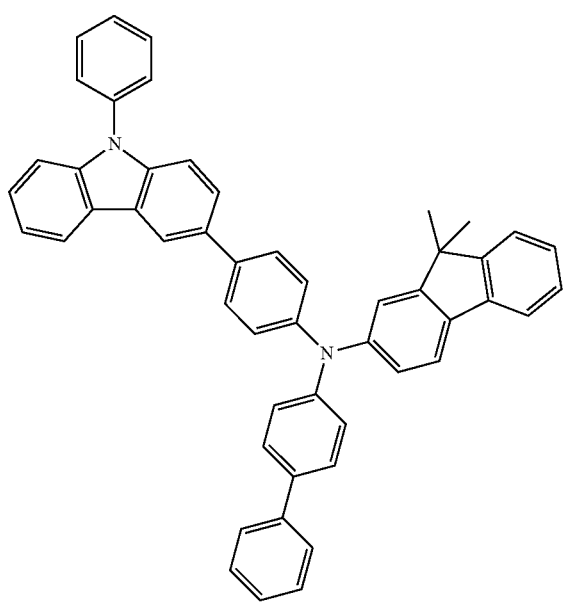
311
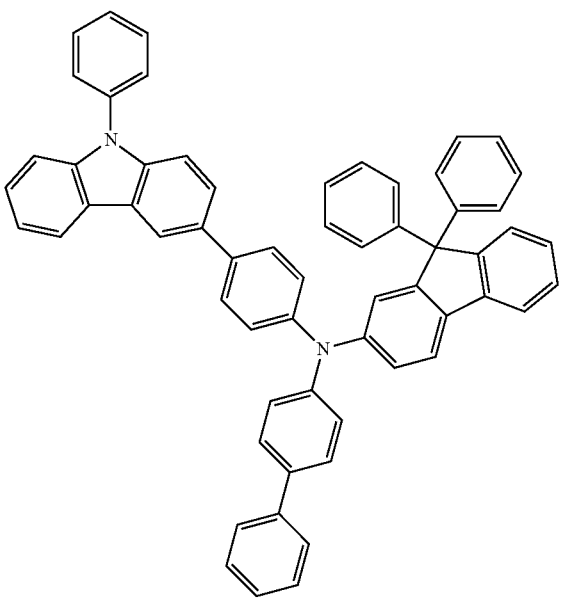
313

314
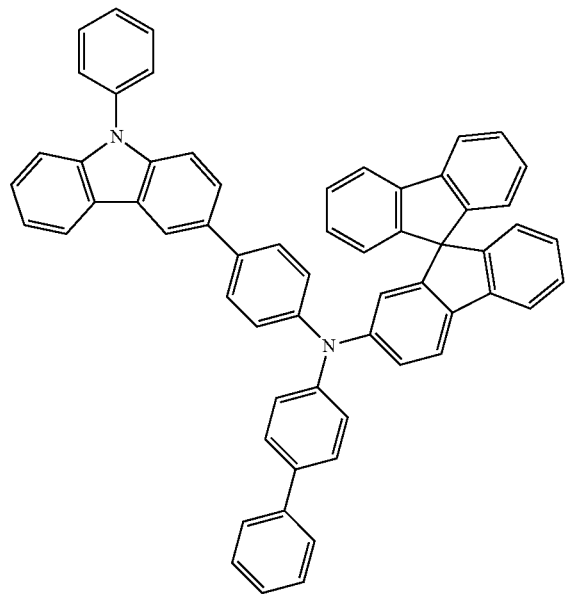
315
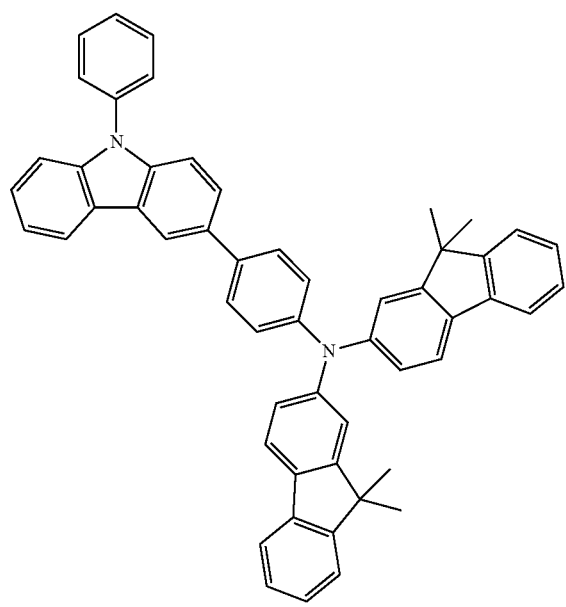
316
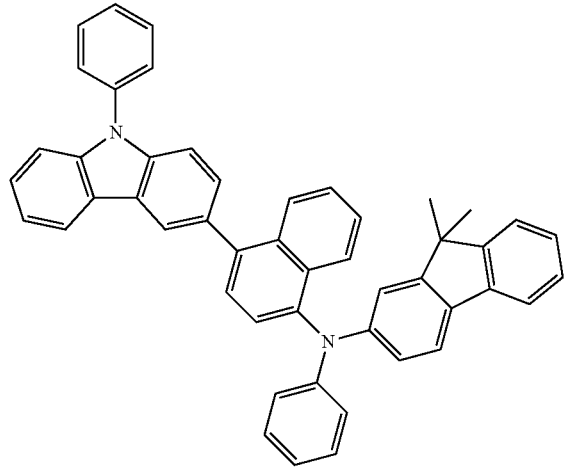
317
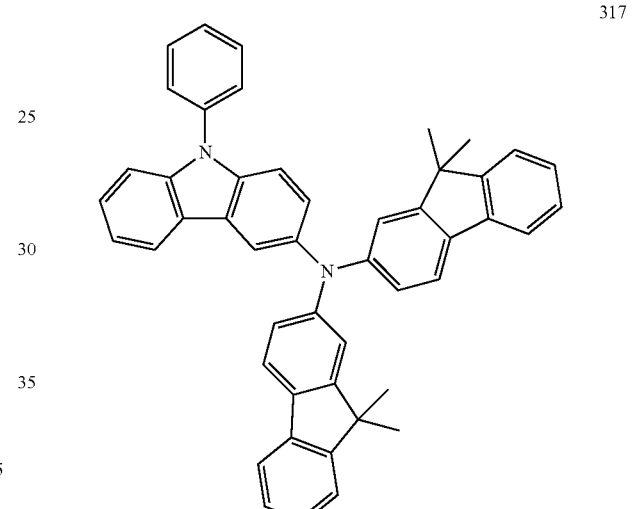
318
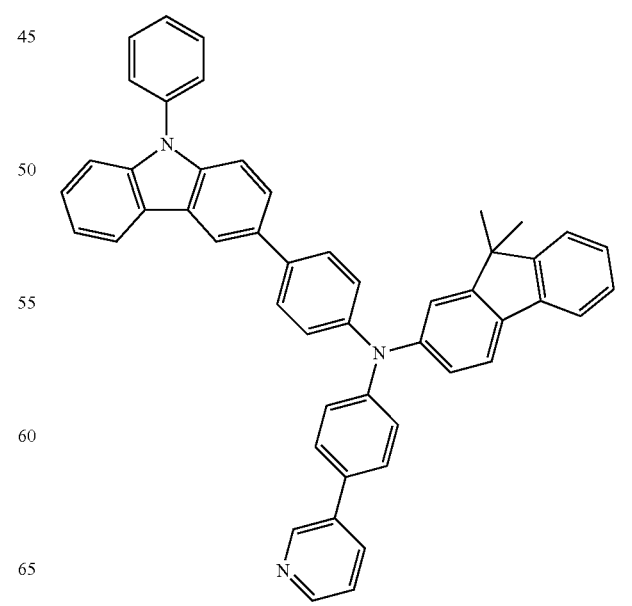

-continued

319

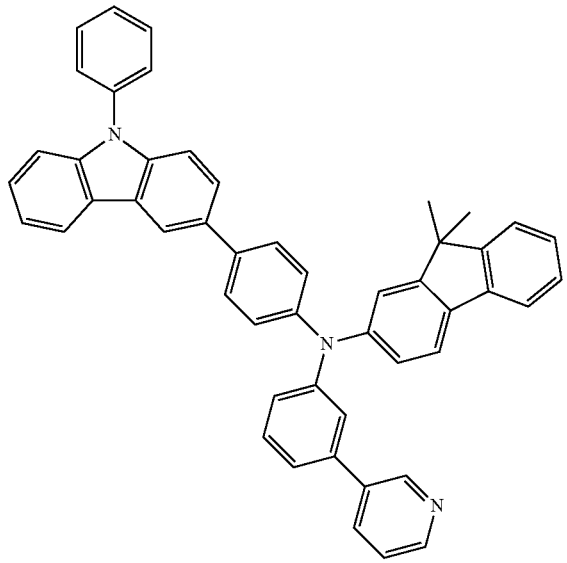

320

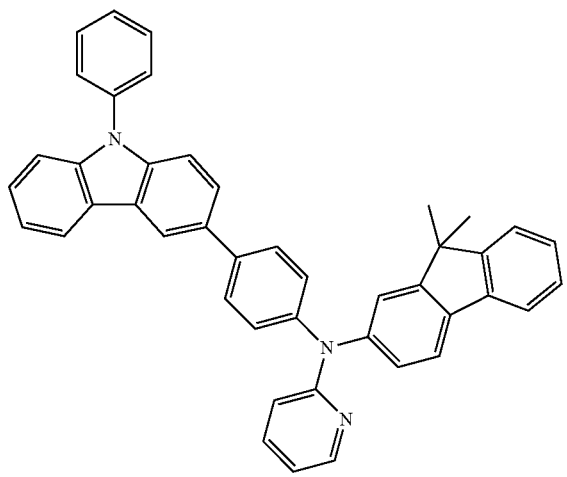

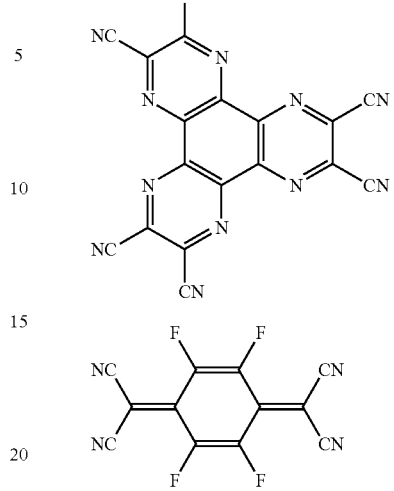

<Compound 200>

<F4-TCNQ>

When the HIL, the HTL, or the H-functional layer further includes the charge-generation material, the charge-generation material may be homogeneously or non-homogeneously dispersed in the HIL, the HTL, or the H-functional layer.

A buffer layer may be interposed between at least one of the HIL, the HTL, and the H-functional layer and the emission layer. The butfer layer may compensate for an optical resonance distance according to the wavelength of light emitted from the emission layer to increase efficiency. The buffer layer may include a known hole injection material or a hole transport material. According to another embodiment of the present invention, the buffer layer may include a material that is included in at least one of the HIL, the HTL, and the H-functional layer formed under the buffer layer.

Then, an emission layer (EML) may be formed on the HTL, the H-functional layer, or the buffer layer by vacuum deposition, spin coating, casting, LB deposition, or the like. When the EML is formed using vacuum deposition or spin coating, the deposition and coating conditions may be similar to those for the formation of the HIL, though the conditions for deposition and coating may vary according to the material that is used to form the EML.

The EML may include a host and a dopant.

As the host, Alq3,4,4'-N,N'-dicarbazol-biphenyl (CBP), poly(n-vinylcarbazole) (PVK), 9,10-di(naphthalen-2-yl)anthracene (ADN), TCTA, 1,3,5-tris(N-phenylbenzimidazole2-yl)benzene (TPBI), 3-tert-butyl-9,10-di(naphth-2-yl) anthracene (TBADN), E3, distyryl arylene (DSA), dmCBP (illustrated below), Compounds 501 to 509 below, or the like may be used, but the host is not limited thereto.

At least one of the HIL, the HTL, and the H-functional layer may further include a known hole injection material, a known hole transport material, and/or a material having a hole injection ability and a hole transport ability, a charge-generation material to improve conductivity of a film.

The charge-generation material may include, for example, a p-dopant. The p-dopant may be one of a quinone derivative, a metal oxide, and a cyano group-containing compound, but is not limited thereto. For example, unlimiting examples of the p-dopant are a quinone derivative, such as tetracyanoquinodimethane (TCNQ) and 2,3,5,6-tetrafluoro-tetracyano-1,4-benzoquinodimethane (F4-TCNQ); a metal oxide, such as tungsten oxide and a molybdenum oxide; and a cyano group-containing compound, such as Compound 200, but is not limited thereto.

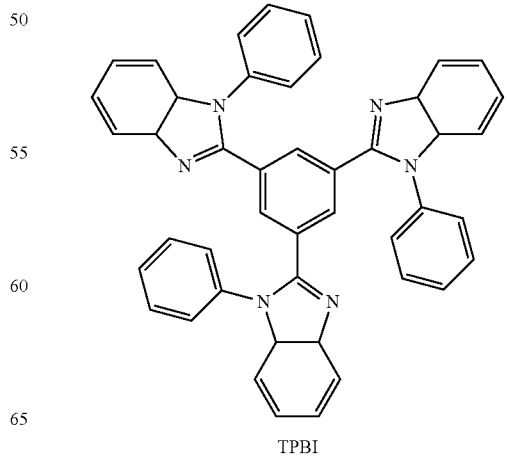

TPBI

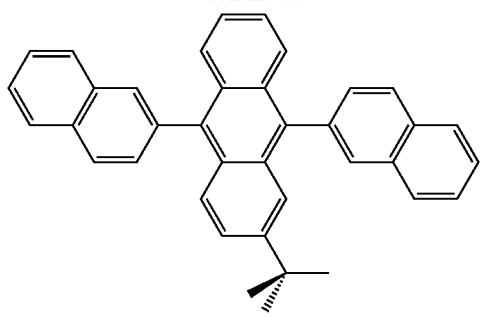
TBADN
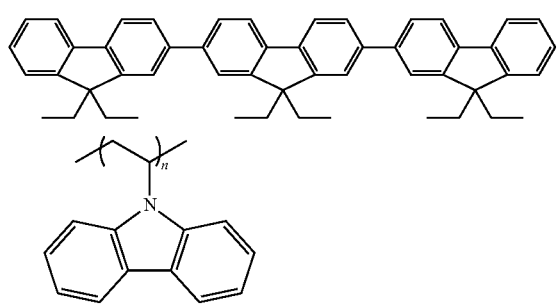
PVK
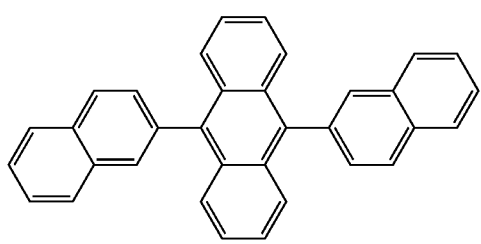
ADN
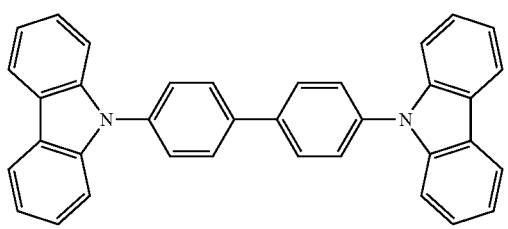
CBP
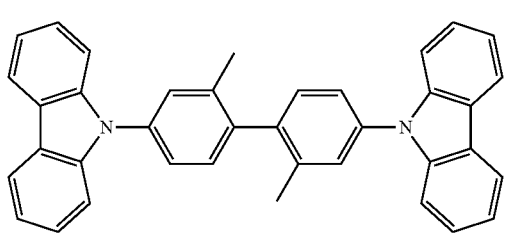
dmCBP
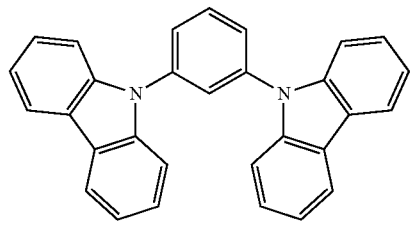
501
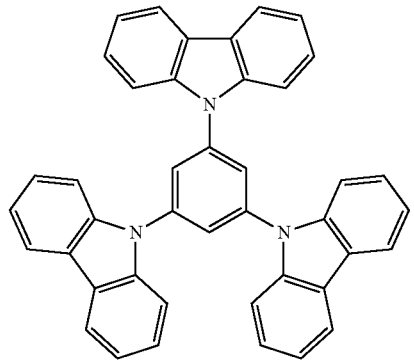
502
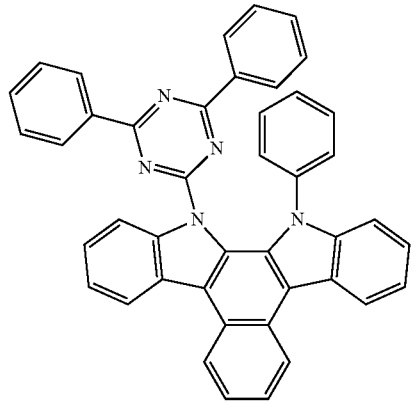
503
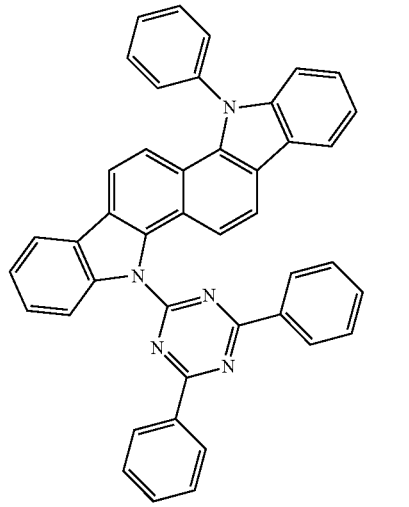
504

505 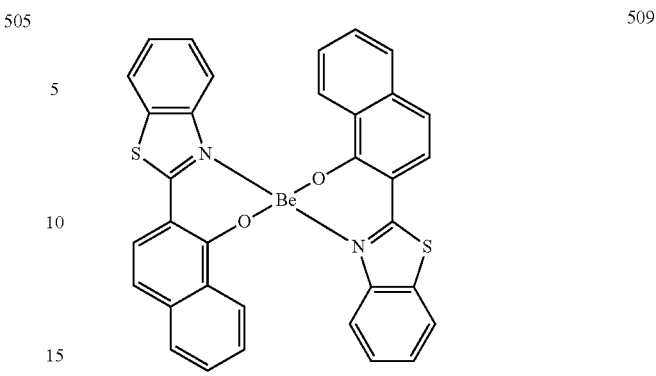

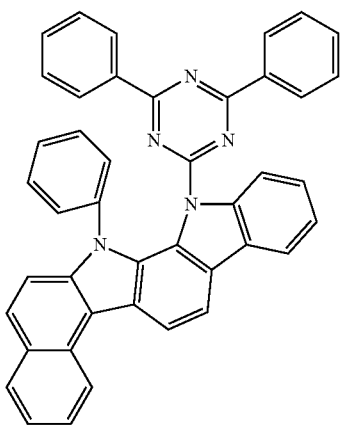
506

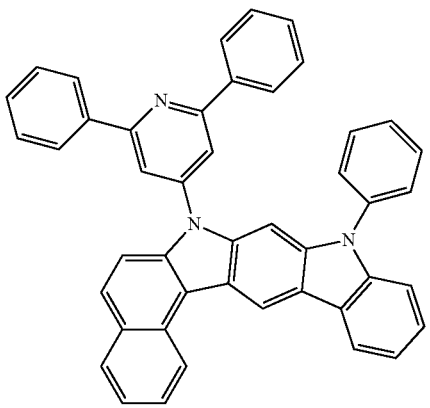
507

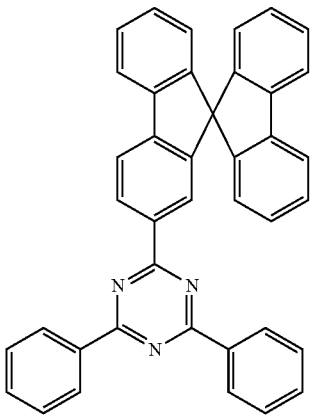
508

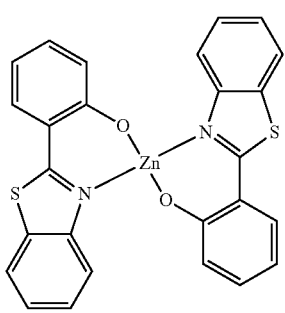

509 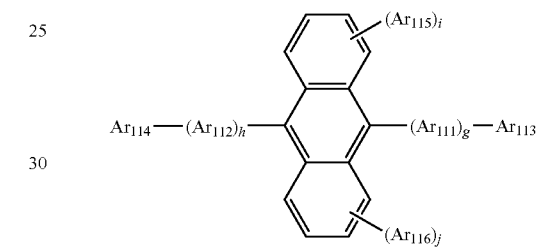

According to an embodiment of the present invention as the host, an anthracene-based compound represented by Formulae 400 below may be used:

<Formulae 400>

$$Ar_{114}-(Ar_{112})_h-\text{[anthracene with }(Ar_{115})_i,(Ar_{116})_j\text{]}-(Ar_{111})_g-Ar_{113}$$

In Formula 400. $Ar_{111}$ and $Ar_{112}$ may be each independently a substituted or unsubstituted $C_6$-$C_{60}$ arylene group; $Ar_{113}$ to $Ar_{16}$ may be each independently a substituted or unsubstituted $C_1$-$C_{10}$ alkyl group, or a substituted or unsubstituted $C_5$-$C_{60}$ aryl group; g, h, I, and j may be each independently an integer of 0 to 4.

For example, $Ar_{111}$ and $Ar_{112}$ in Formulae 400 may be each independently selected from: a phenylene group, a naphthylene group, a phenanthrenylene group, or a pyrenylene group; or a phenylene group, a naphtylene group, a phenanthrenylene group, a fluorenyl group, or a pyrenylene group, substituted with at least one of a phenyl group, a naphthyl group, and an anthryl group, but are not limited thereto.

g, h, i and j in Formula 400 may be each independently 0, 1, or 2.

$Ar_{113}$ to $Ar_{116}$ in Formula 400 may be each independently selected from: a $C_1$-$C_{10}$ alkyl group, substituted with at least one of a phenyl group, a naphthyl group, and an anthryl group; a phenyl group; a naphthyl group; an anthryl group; a pyrenyl group; a phenanthrenyl group; a fluorenyl group; a phenyl group, a naphthyl group, an anthryl group, a pyrenyl group, a phenanthrenyl group, and a fluorenyl group, substituted with at least one of a deuterium atom, a halogen atom, a hydroxyl group, a cyano group, a nitro group, an amino group, an amidino a hydrazine, a hydrazone, a carboxyl group or a salt thereof, a sulfonic acid group or a salt thereof, a phosphoric acid group or a salt thereof, $C_1$-$C_{60}$ alkyl group, $C_2$-$C_{60}$ alkenyl group, $C_2$-$C_{60}$ alkynyl group, $C_1$-$C_{60}$ alkoxy group, a phenyl group, a naphthyl group, an anthryl group, pyrenyl group, phenanthrenyl group and fluorenyl group; or

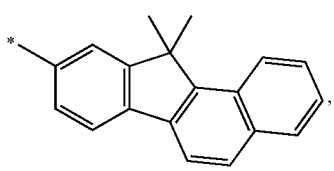 [SMILES: Cc1ccc2c(c1)C(C)(C)c1c-2ccc2ccccc12]
but are not limited thereto.
For example, the anthracene-based compound represented by Formulae 400 may be one of compounds illustrated below, but is not limited thereto:
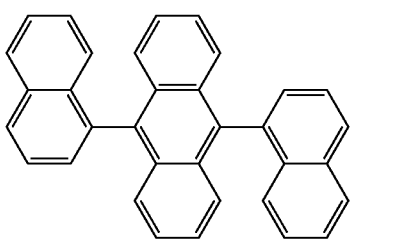
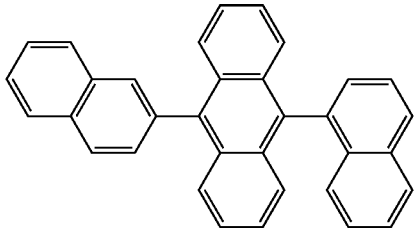
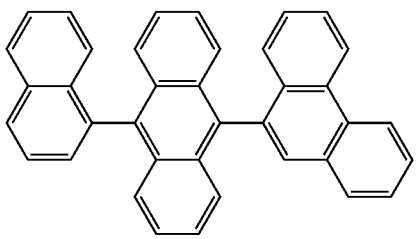
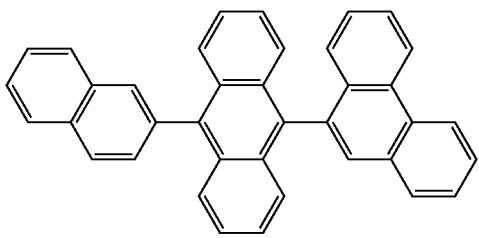
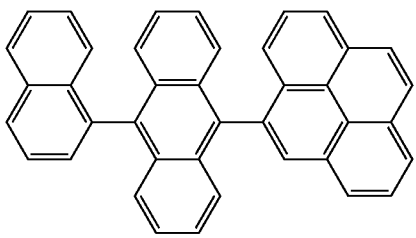
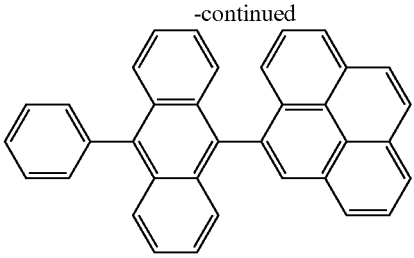
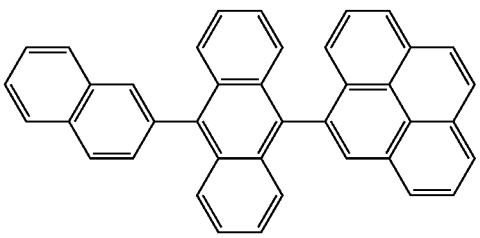
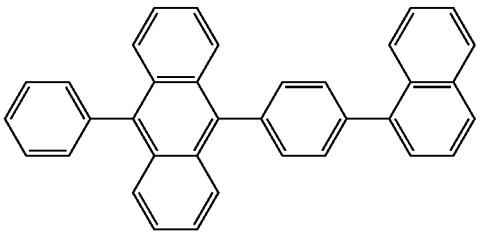
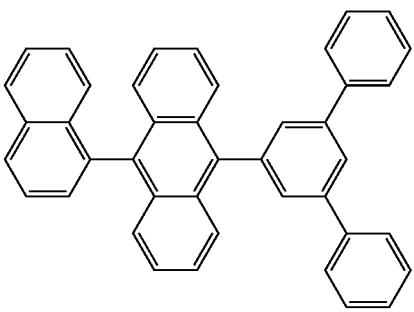
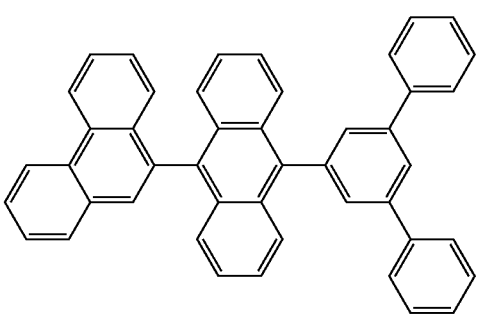
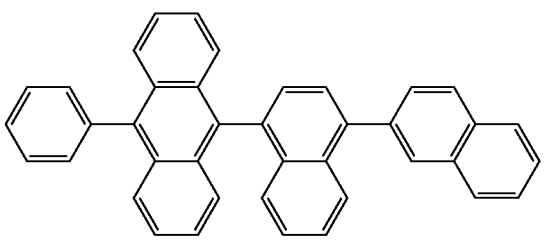 [SMILES: c1ccc2cc(-c3ccc(-c4c5ccccc5c(-c5cccc6ccccc56)c5ccccc45)c4ccccc34)ccc2c1]

-continued
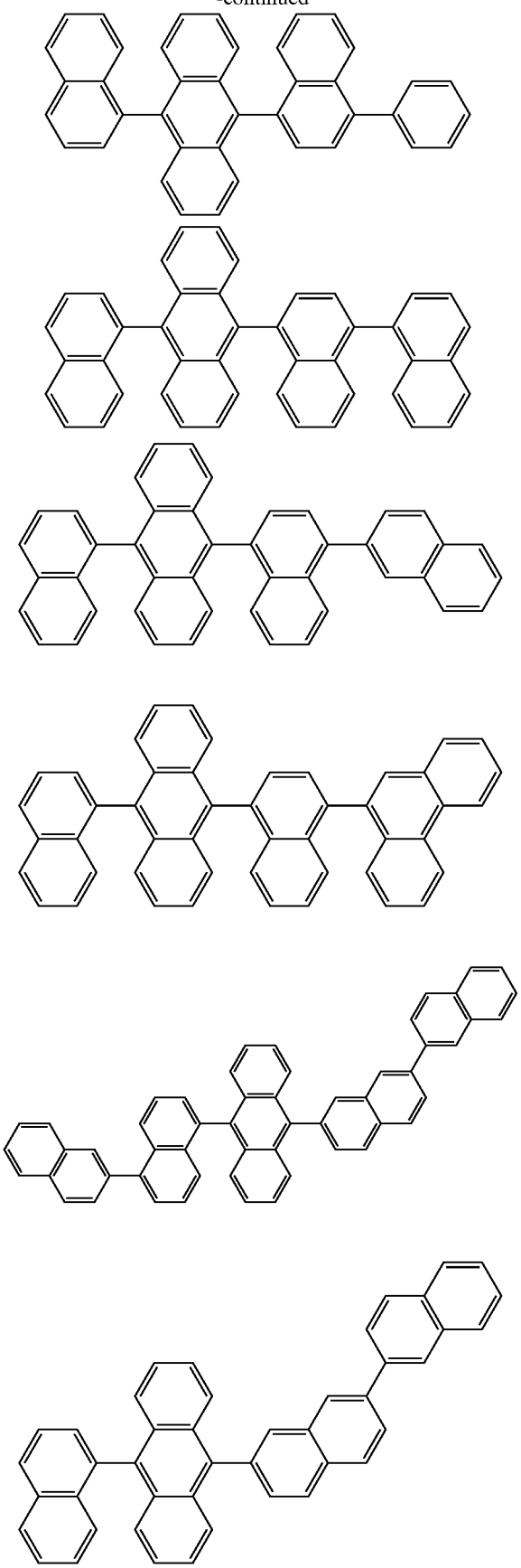
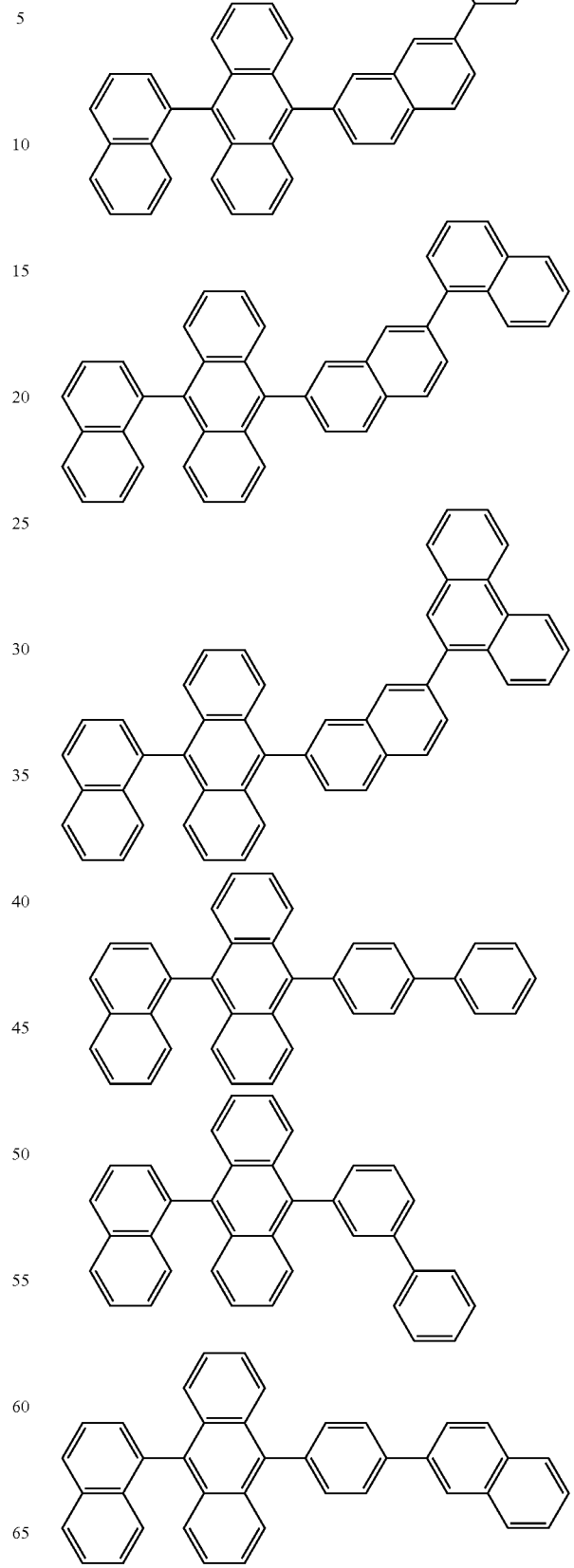

57
-continued
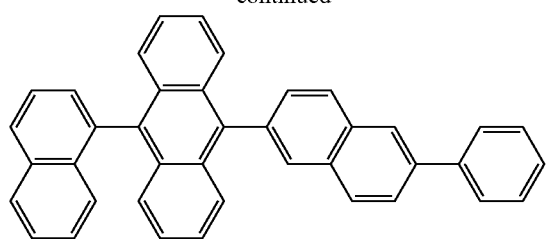
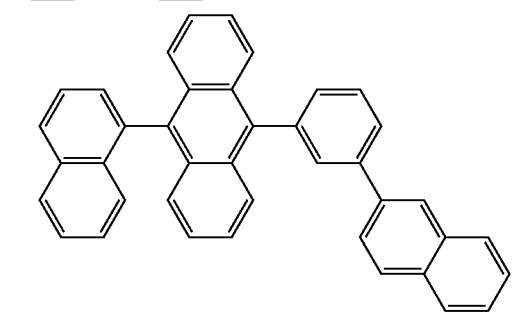
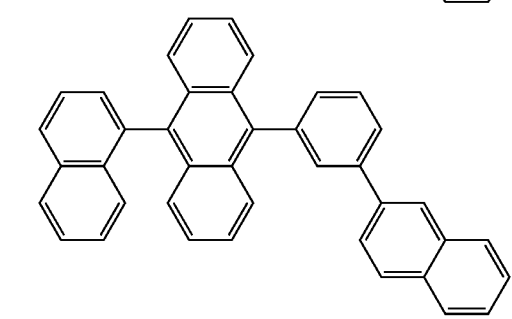
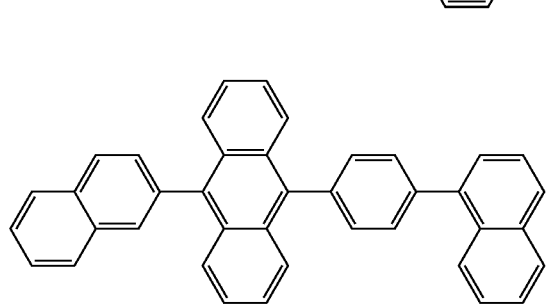
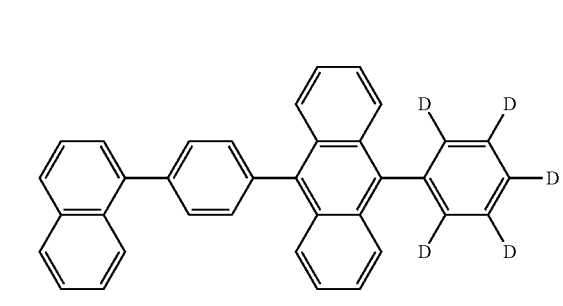
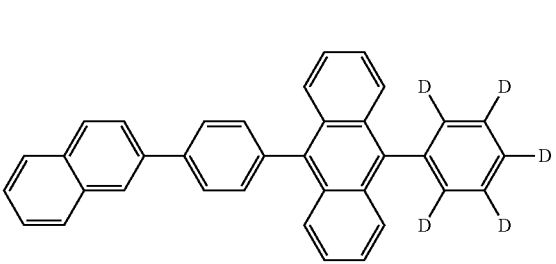
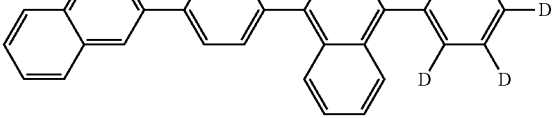
58
-continued
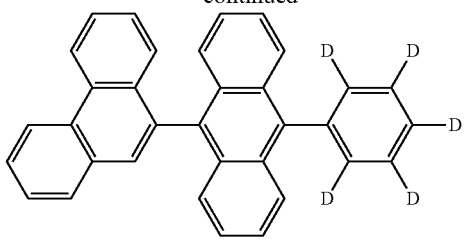
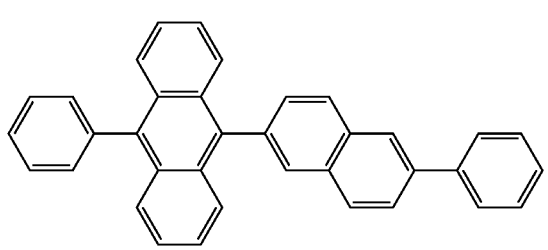
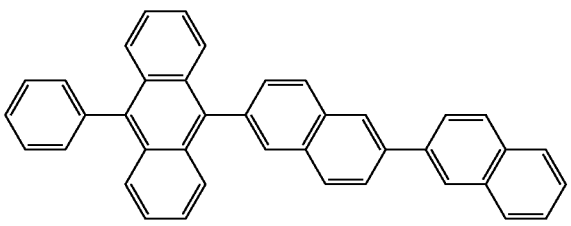
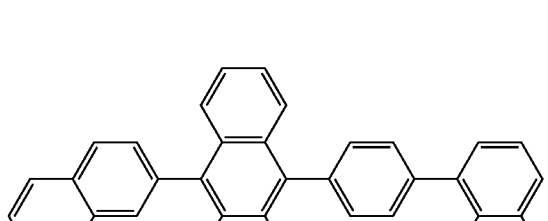

-continued

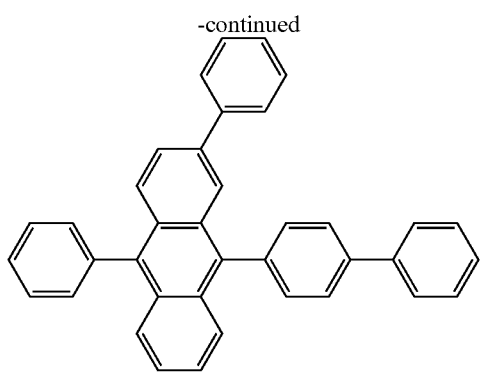

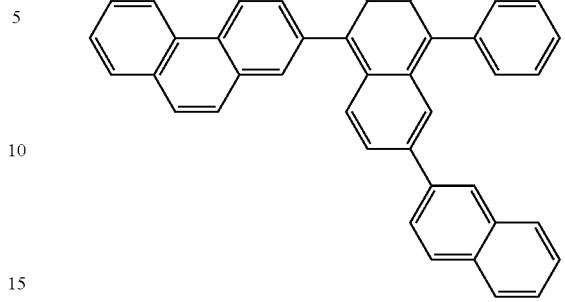

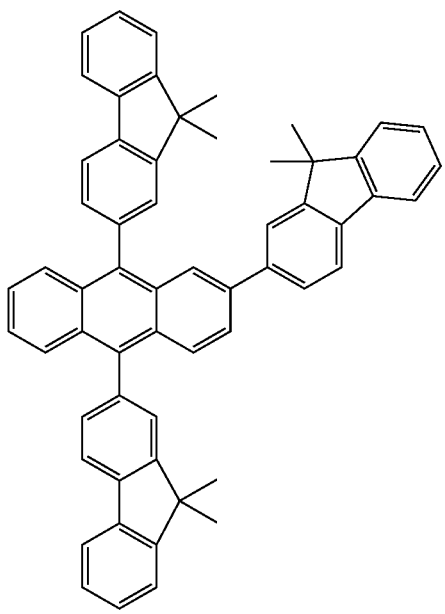

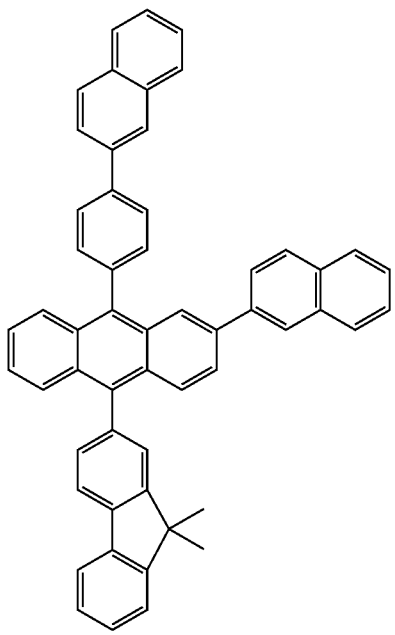

According to another embodiment of the present invention, as the host, an anthracene-based compound represented by Formulae 401 below may be used:

<Formulae 401>

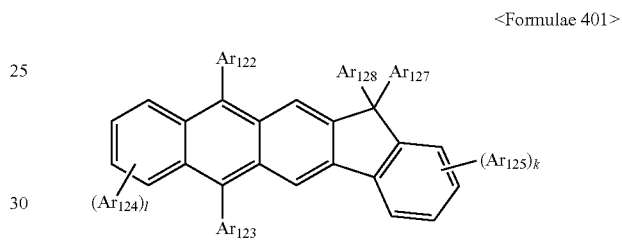

A detailed description of $Ar_{122}$ to $Ar_{125}$ in Formula 401 may be further understood with reference to the description of $Ar_{113}$ in Formulae 400.

$Ar_{126}$ and $Ar_{127}$ in Formula 401 may be each independently a $C_1$-$C_{10}$ alkyl group (for example, a methyl group, an ethyl group, or a propyl group).

k and l in Formula 401 may be each independently an integer of 0 to 4. For example, k and l may be an integer of 0, 1, or 2.

For example, the anthracene-based compound represented by Formulae 401 may be one of compounds below, but is not limited thereto:

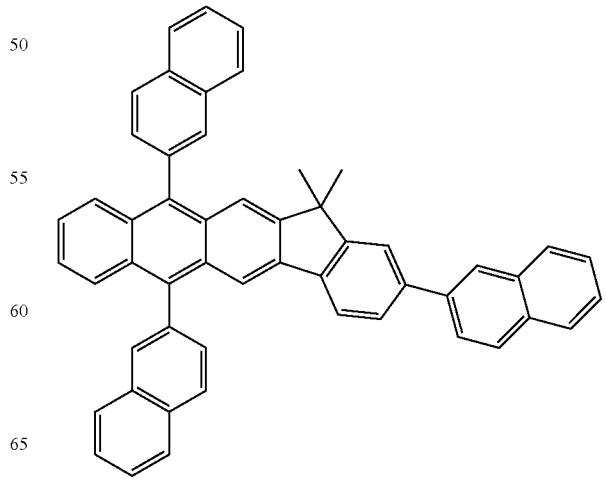

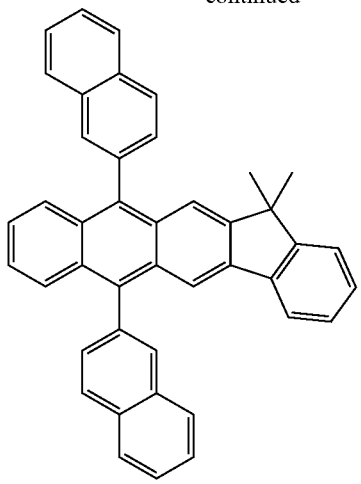

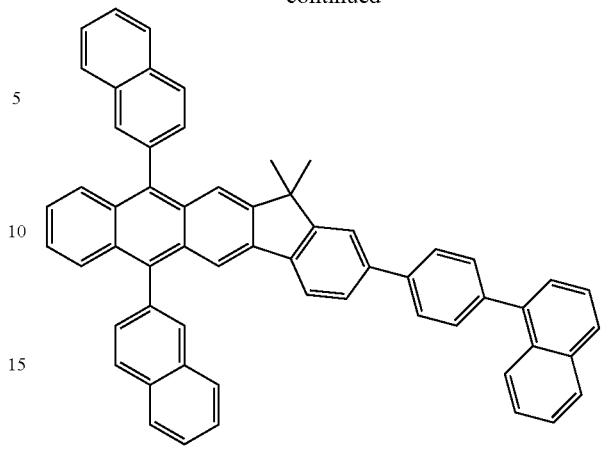

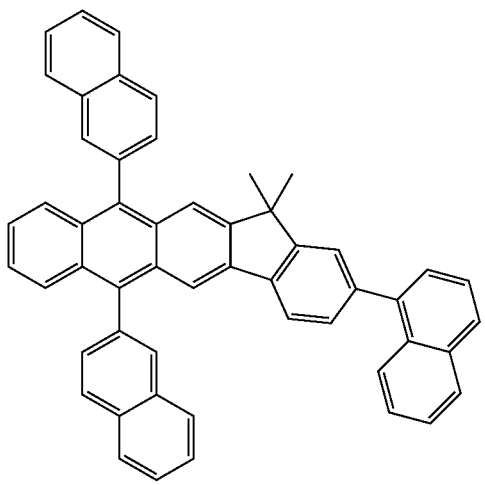

When the organic light-emitting diode is a full color organic light-emitting diode, the emission layer may be patterned into a red emission layer, a green emission layer, and a blue emission layer. According to another embodiment of the present invention, the EML may include a red EML, a green EML, and/or a blue EML and may emit white light.

The dopant in the EML may be the amine-based compound represented by Formula 1. In this regard, the amine-based compound may act as a fluorescent dopant that emits light according to an emission mechanism. For example, the amine-based compound may act as a fluorescent dopant emitting blue light, green light, or bluish green light, but is not limited thereto.

In addition, as a known dopant, dopants illustrated below may be used.

At least one of the red EML, the green EML, and the blue EML may include dopants illustrated below (ppy=phenylpyridine).

For example, compounds illustrated below may be used as a blue dopant, but is not limited thereto.

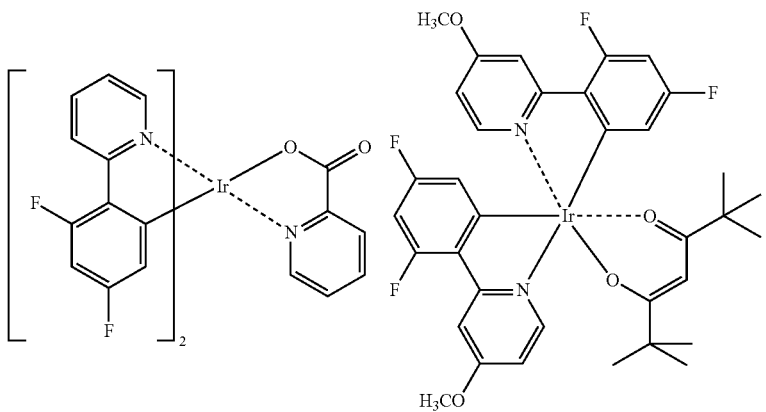

F₂Irpic          (F₂ppy)₂Ir(tmd)

-continued
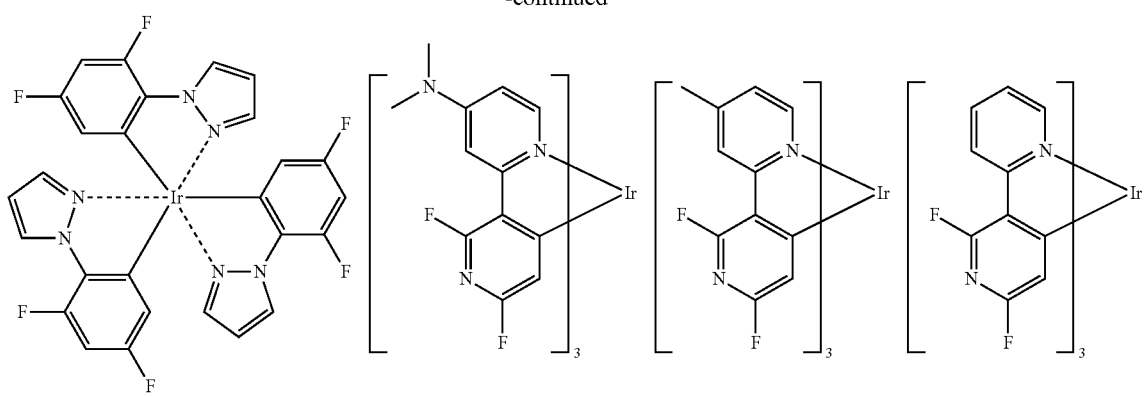
Ir(dfppz)₃
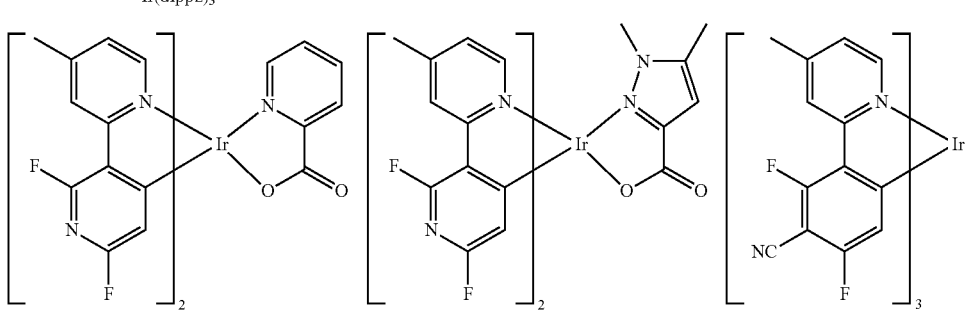
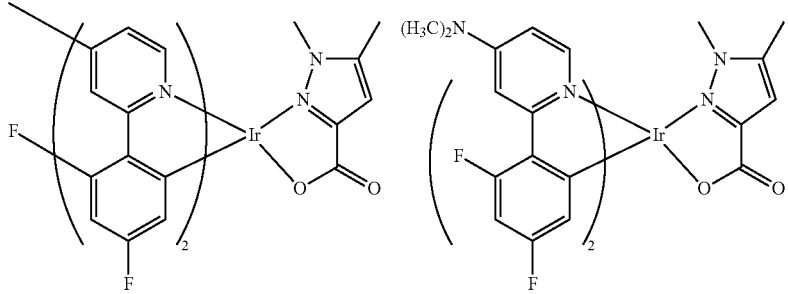
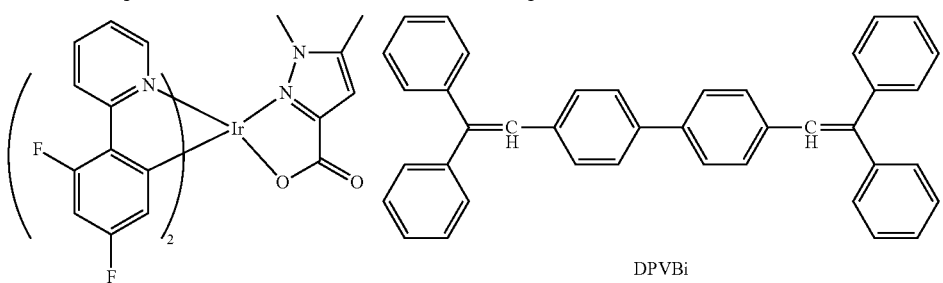
DPVBi
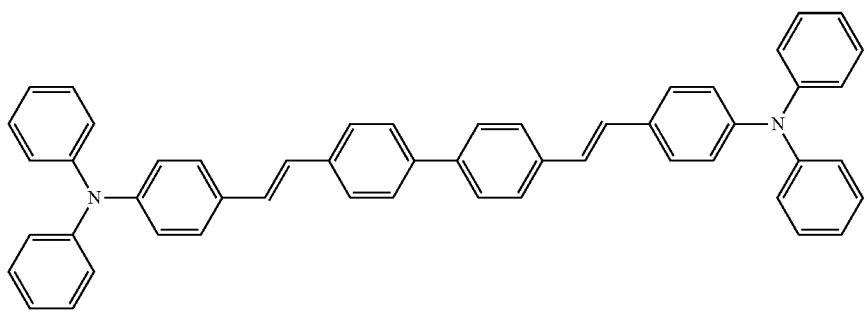
DPAVBi

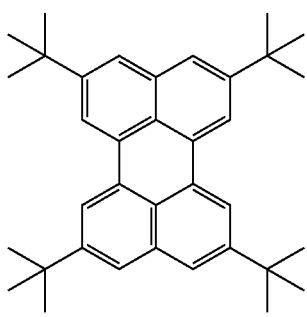
TBPe
For example, compounds illustrated below may be used as a red dopant, but the red dopant is not limited thereto. According to another embodiment of the present invention, DCM or DCJTB may be used as the red dopant.
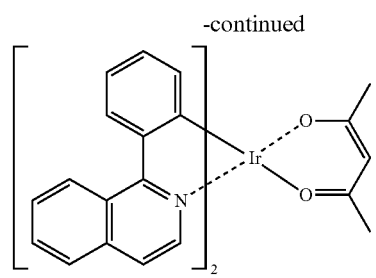
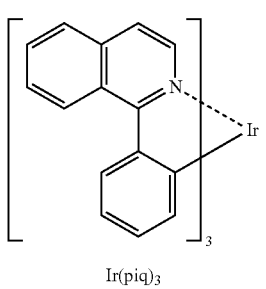
PtOEP
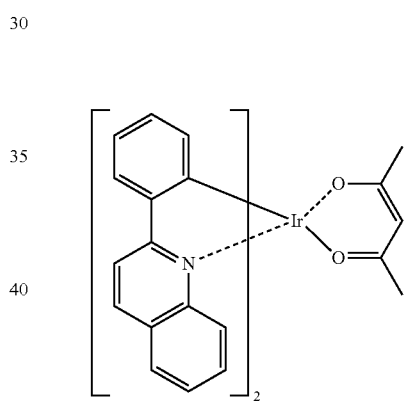
Ir(pq)₂(acac)
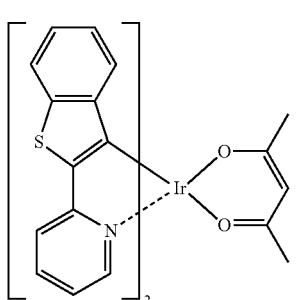
Ir(piq)₃
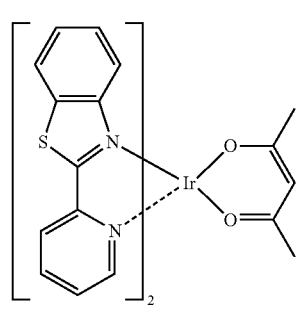
Btp₂Ir(acac)
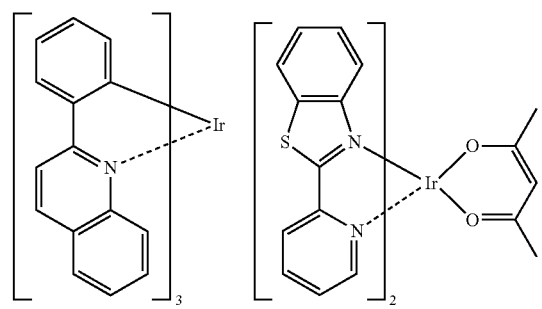
Ir(2-phq)₃          Ir(BT)₂(acac)

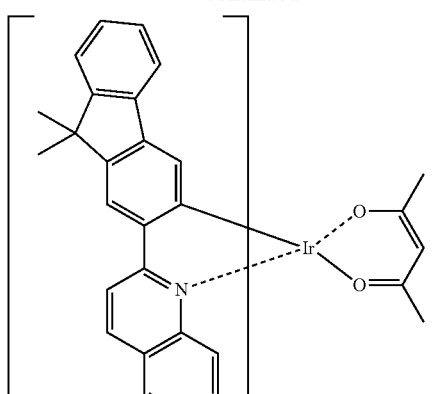
Ir(flq)₂(acac)
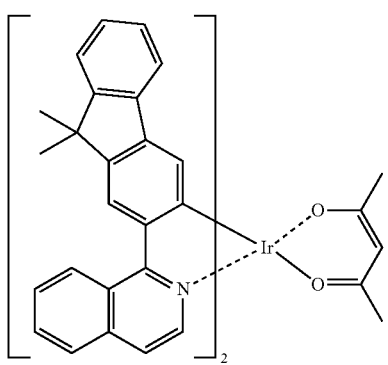
Ir(fliq)₂(acac)
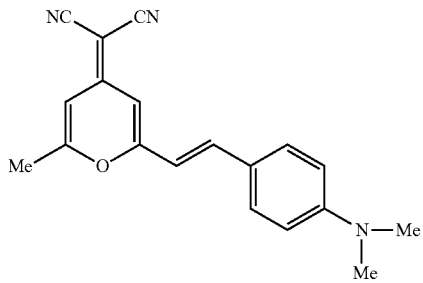
DCM
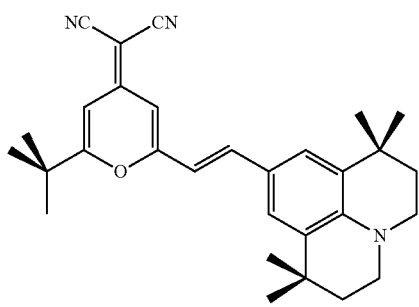
DCJTB
For example, compounds illustrated below may be used as a green dopant, but the green dopant is not limited thereto. For example, C545T may be used as the green dopant.
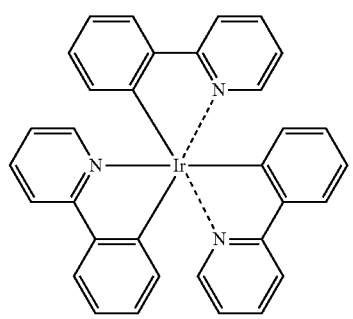
Ir(ppy)₃
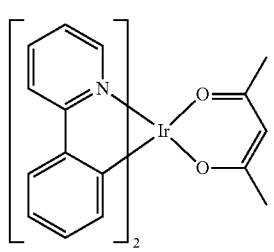
Ir(ppy)₂(acac)
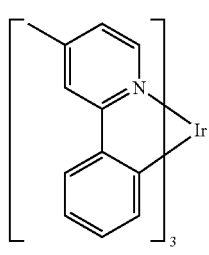
Ir(mpyp)₃
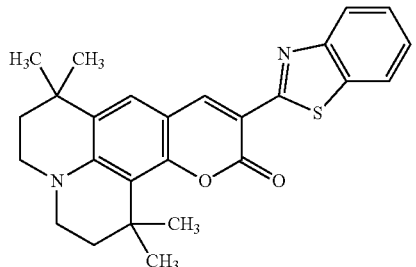
C545T
Non-limiting examples of the dopant that may be used in the EML are complexes represented by the following formulae:
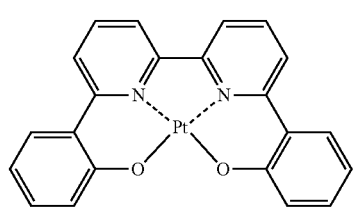
D1

-continued
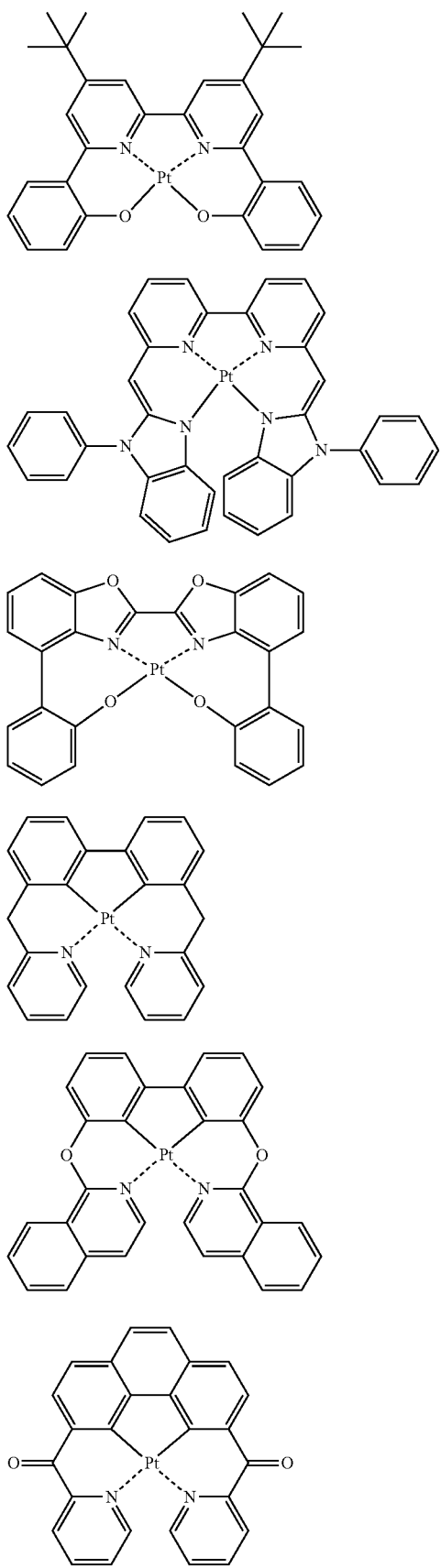
-continued
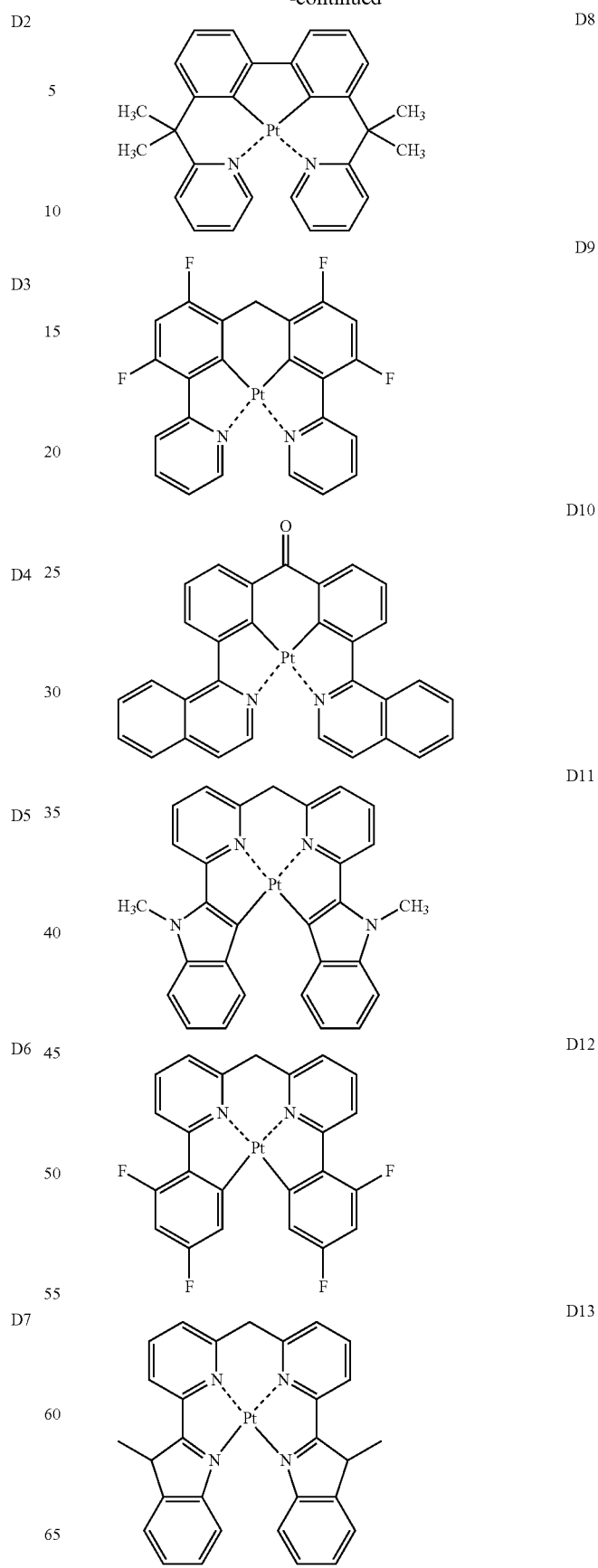

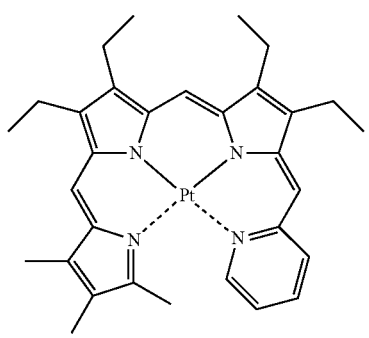
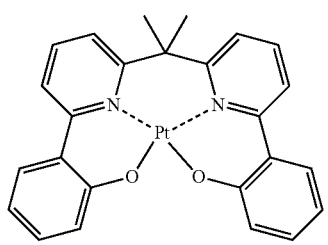
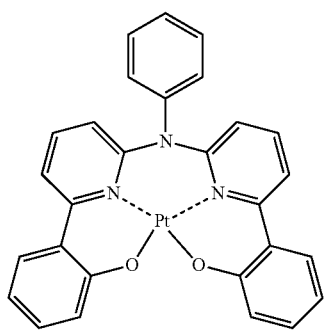
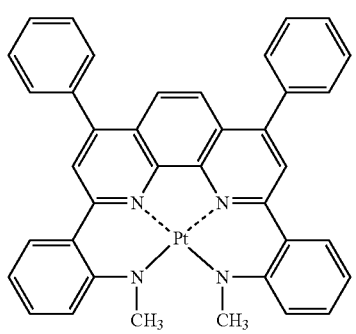
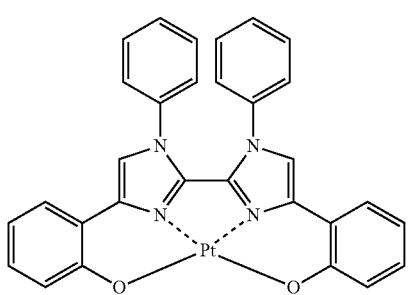
D14
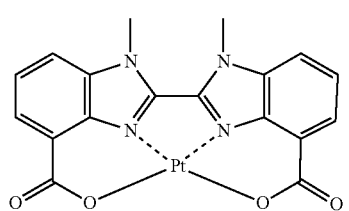
D15
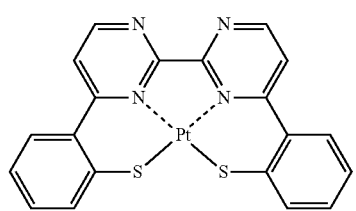
D16
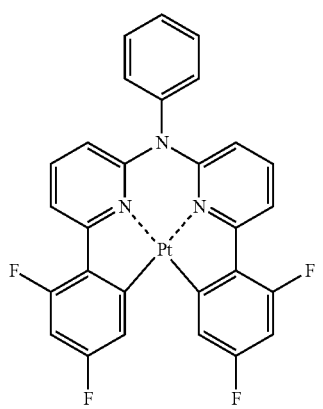
D17
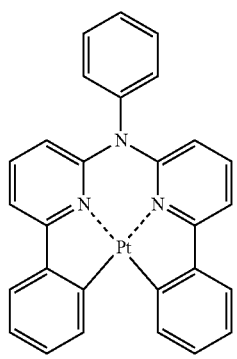
D18
D19
D20
D21
D22
D23
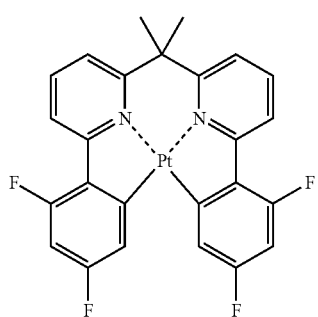

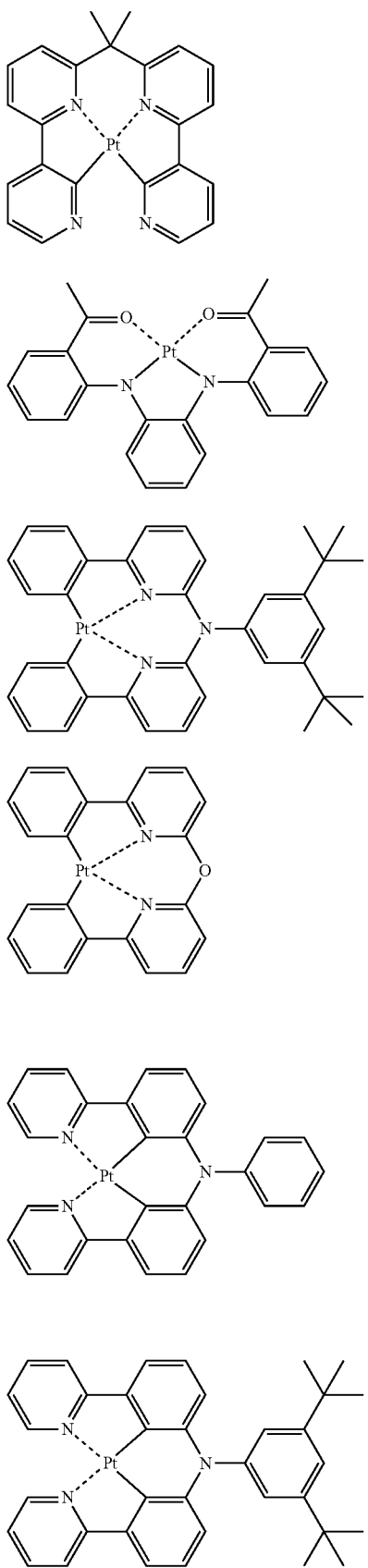
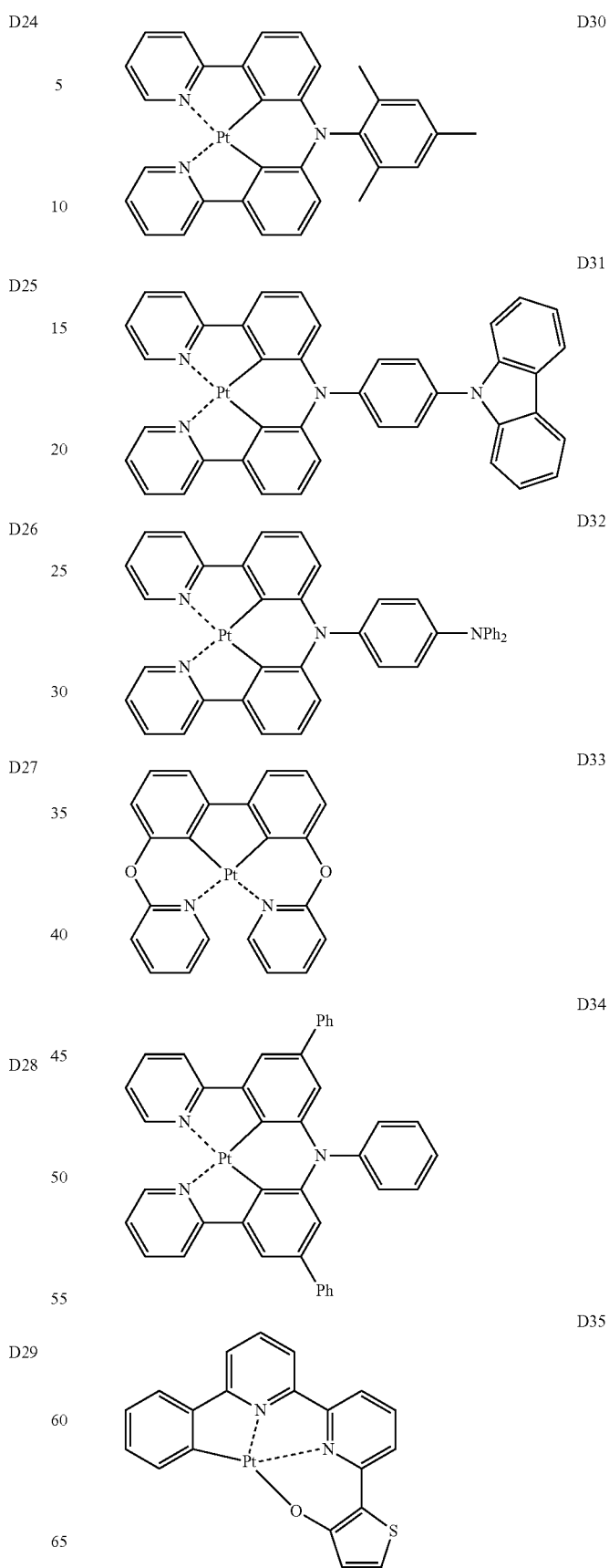

-continued
D36
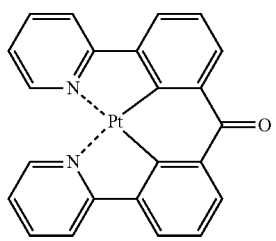
D37
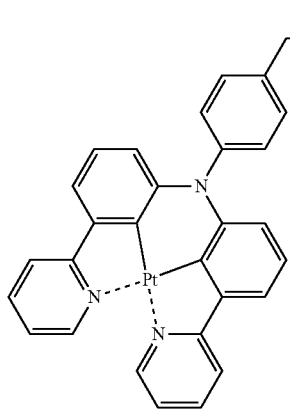
D38
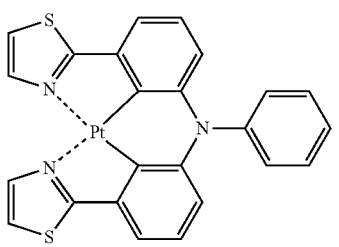
D39
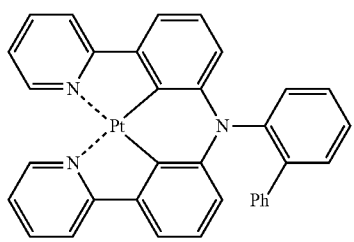
D40
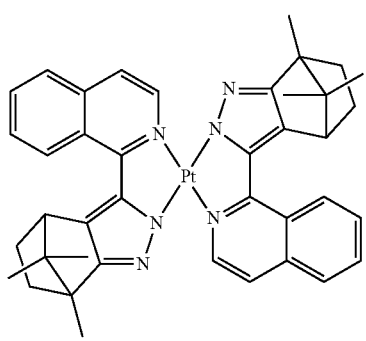
-continued
D41
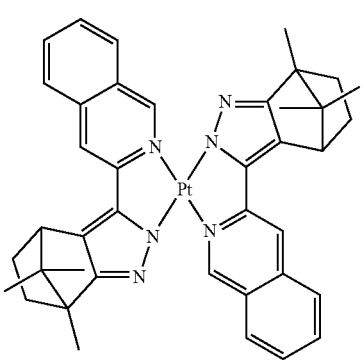
D42
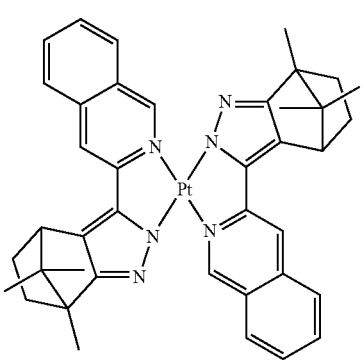
D43
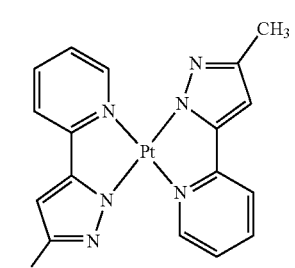
D44
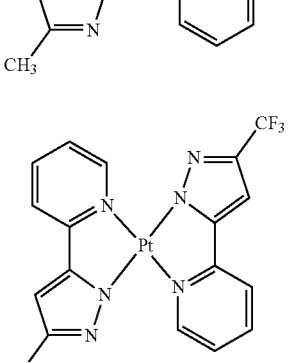
D45
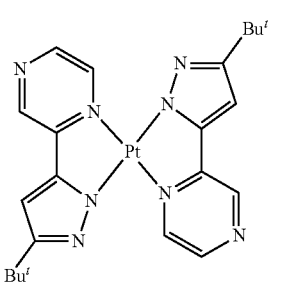

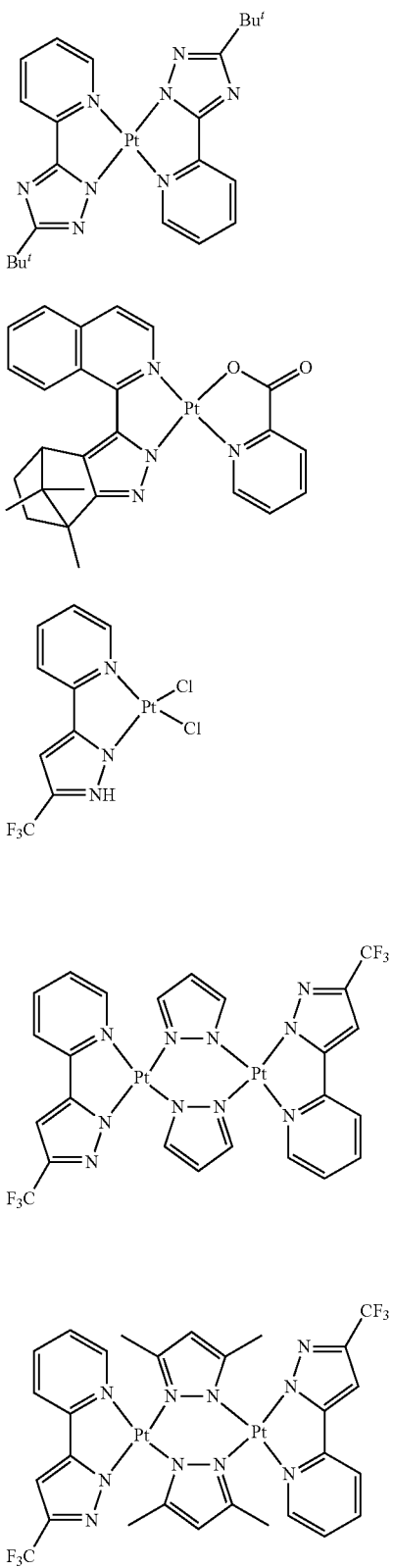
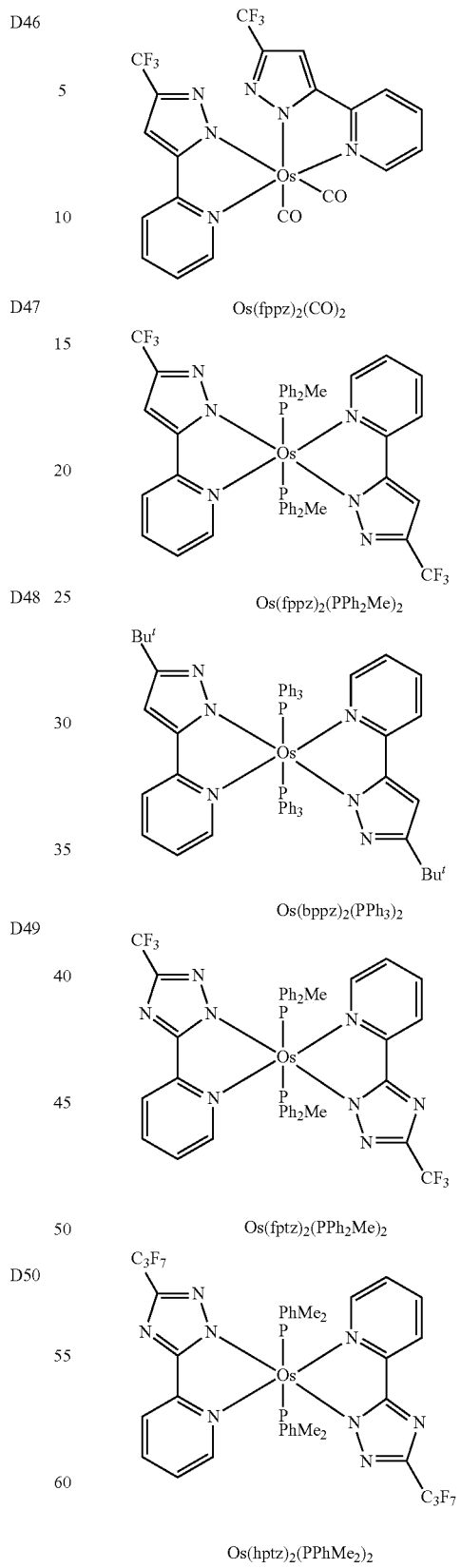
Os(fppz)₂(CO)₂
Os(fppz)₂(PPh₂Me)₂
Os(bppz)₂(PPh₃)₂
Os(fptz)₂(PPh₂Me)₂
Os(hptz)₂(PPhMe₂)₂
Non-limiting examples of the dopant that may be used in the EML are Os complexes represented by the following formulae:
When the EML includes both a host and a dopant, the amount of the dopant may be from about 0.01 parts to about 15 parts by weight based on 100 parts by weight of the host. However, the amount of the dopant is not limited to this range.

A thickness of the HIL may be in a range of about 100 Å to about 10000 Å, for example, about 200 Å to about 600 Å. When the thickness of the EML is within these ranges, the EML may have improved light emitting ability without a substantial increase in driving voltage.

Next, an electron transport layer (ETL) is formed on the EML using various methods, for example, by vacuum deposition, spin coating, casting, or the like. When the ETL is formed using vacuum deposition or spin coating, the deposition and coating conditions may be similar to those for the formation of the HIL, though the conditions for deposition and coating may vary according to the material that is used to form the ETL. The material for the ETL may be any one of various known electron transport materials that stably transport electrons injected from an electron injection electrode (cathode). Non-limiting examples of materials for forming the ETL are a quinoline derivative, such as tris(8-quinolinorate)aluminum (Alq3), TAZ, BAlq, beryllium bis(benzoquinolin-10-olate (Bebq2), 9,10-di(naphthalene-2-yl)anthracene (ADN), Compound 201, and Compound 202.

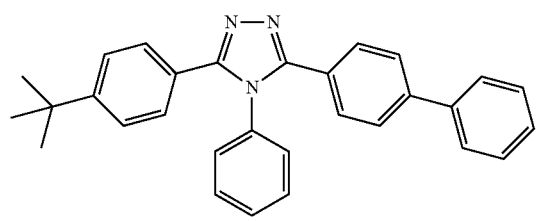

TAZ

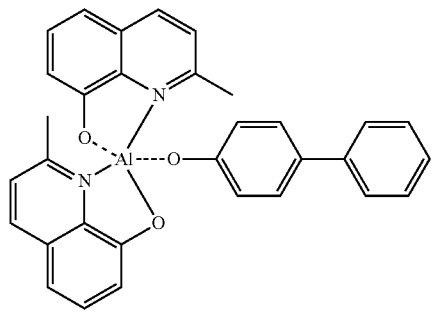

BAlq

<Compound 201>

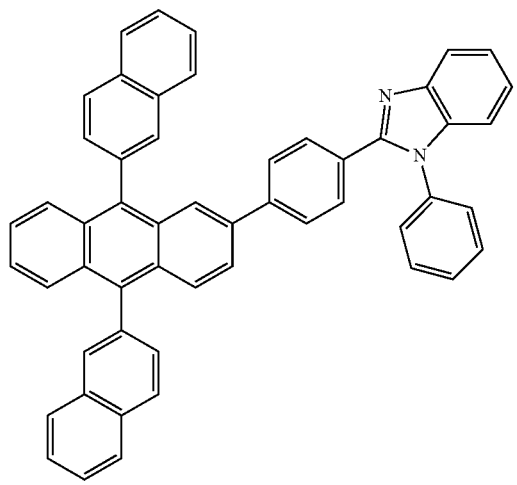

<Compound 202>

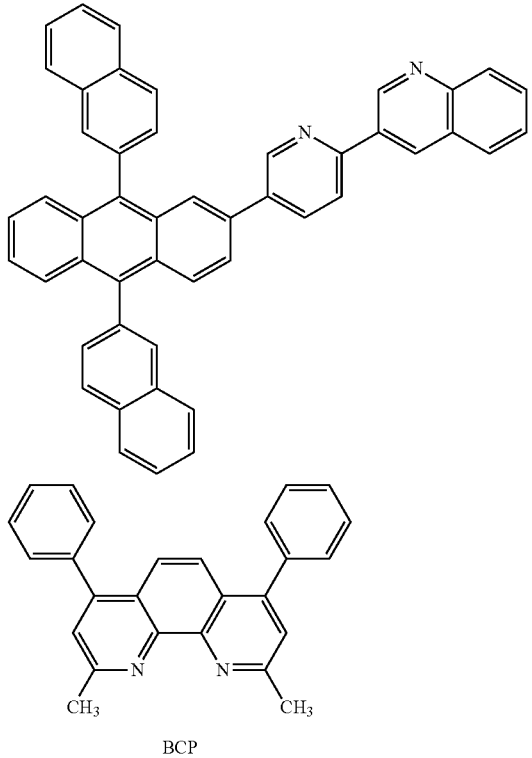

BCP

A thickness of the ETL may be in a range of about 100 Å to about 10000 Å, for example, about 150 Å to about 500 Å. When the thickness of the ETL is within these ranges, the ETL may have satisfactory electron transporting ability without a substantial increase in driving voltage.

The ETL may further include, in addition to such electron transport organic materials, a metal-containing material.

The metal-containing material may include a lithium (Li) complex. Non-limiting examples of the Li complex are lithium quinolate (LiQ) and Compound 203 below:

<Compound 203>

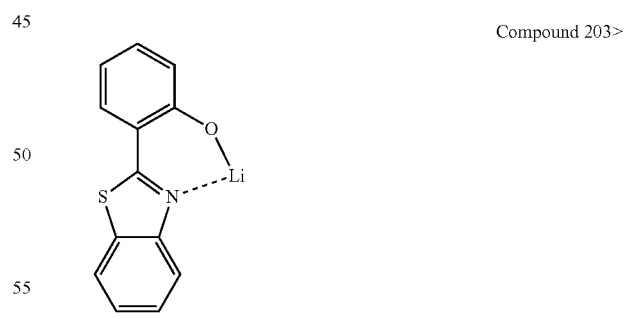

Then, an electron injection layer (EIL), which facilitates injection of electrons from the second electrode, may be formed on the ETL. Any suitable electron-injecting material may be used to form the EIL.

Non-limiting examples of materials for forming the EIL are LiF, NaCl, CsF, $Li_2O$, and BaO, which are known in the art. The deposition or coating conditions of the EIL may be similar to those used to form the HIL, although the deposition and coating conditions may vary according to the material that is used to form the EIL.

The thickness of the EIL may be from about 1 Å to about 100 Å, and in some embodiments, may be from about 3 Å to about 90 Å. When the thickness of the EIL is within these ranges, the EIL may have satisfactory electron injection ability without a substantial increase in driving voltage.

The second electrode 17 is disposed on the organic layer 15. The second electrode 17 may be a cathode, which is an electron injecting electrode. A metal for forming the second electrode may be a metal, an alloy, an electrically conductive compound, which have a low-work function, or a mixture thereof. In this regard, the second electrode 17 may be formed of lithium (Li), magnesium (Mg), aluminum (Al), aluminum (Al)-lithium (Li), calcium (Ca), magnesium (Mg)-indium (In), magnesium (Mg)-silver (Ag), or the like, and may be formed as a thin film type transmission electrode. In some embodiments, to manufacture a top-emission light-emitting diode, the transmission electrode may be formed of indium tin oxide (ITO) or indium zinc oxide (IZO).

Hereinbefore, an organic light-emitting diode 10 according to an embodiment of the present invention has been described with reference to FIG. 1, but is not limited to the structure illustrated in FIG. 1.

In addition, when the EML is formed using a phosphorescent dopant, to prevent diffusion of triplet excitons or holes toward the ETL, a hole blocking layer (HBL) may be formed between the HTL and the EML or between the H-functional layer and the EML by a method, for example, vacuum deposition, spin coating, casting, LB, or the like. When the HBL is formed using vacuum deposition or spin coating, the deposition and coating conditions may be similar to those for the formation of the HIL, though the conditions for deposition and coating may vary according to the material that is used to form the HBL. Any known hole-blocking material may be used. Non-limiting examples of hole-blocking materials are oxadiazole derivatives, triazole derivatives, and phenanthroline derivatives. For example, BCP illustrated below may be used as a material for the HBL.

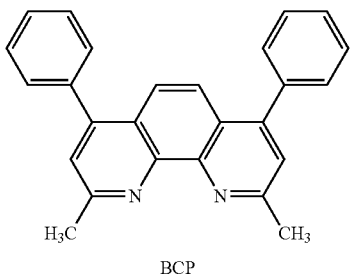 [SMILES: Cc1cc(-c2ccccc2)c2ccc3c(-c4ccccc4)cc(C)nc3c2n1 ; "BCP"]

BCP

A thickness of the HBL may be in a range of about 20 Å to about 10000 Å, for example, about 30 Å to about 300 Å. When the thickness of the HBL is within these ranges, the HBL may have excellent hole blocking characteristics without a substantial increase in driving voltage.

The unsubstituted $C_1$-$C_{60}$ alkyl group (or $C_1$-$C_{60}$ alkyl group) used herein may be a $C_1$-$C_{60}$ linear or branched alkyl group, such as methyl, ethyl, propyl, isobutyl, sec-butyl, pentyl, iso-amyl, or hexyl, and at least one substituent of the substituted $C_1$-$C_{60}$ alkyl group may be selected from a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a $C_3$-$C_{10}$ cycloalkyl group; a $C_3$-$C_{10}$ heterocycloalkyl group; a $C_3$-$C_{10}$ cycloalkenyl group; a $C_3$-$C_{10}$ heterocycloalkenyl group; a $C_6$-$C_{60}$ aryl group; a $C_6$-$C_{60}$ aryloxy group; a $C_6$-$C_{60}$ arylthio group, and a $C_2$-$C_{60}$ heteroaryl group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group, and a $C_2$-$C_{60}$ heteroaryl group, substituted with at least one of a deuterium atom, a halogen atom, a hydroxyl group, a cyano group, a nitro group, an amino an amidino group, a hydrazine, a hydrazone, a carboxyl group or a salt thereof, a sulfonic acid group or a salt thereof, a phosphoric acid group or a salt thereof, $C_1$-$C_{60}$ alkyl group, $C_2$-$C_{60}$ alkenyl group, $C_2$-$C_{60}$ alkynyl group, $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —N($Q_{11}$)($Q_{12}$); and —Si($Q_{11}$)($Q_{12}$)($Q_{13}$) where the $Q_{11}$ and $Q_{12}$ may be each independently a $C_1$-$C_{60}$ aryl group or a $C_2$-$C_{60}$ heteroaryl group, and $Q_{13}$ to $Q_{15}$ may be each independently a $C_1$-$C_{60}$ alkyl group, a $C_1$-$C_{60}$ alkoxy group, a $C_6$-$C_{60}$ aryl group, or a $C_2$-$C_{60}$ heteroaryl group, but is not limited thereto.

The unsubstituted $C_1$-$C_{60}$ alkoxy group (or $C_1$-$C_{60}$ alkoxy group) used herein has a formula of —OA (where A is the unsubstituted $C_1$-$C_{60}$ alkyl group described above), and detailed examples thereof are methoxy, ethoxy, and isopropyloxy, and at least one hydrogen atom of these alkoxy groups may be substituted with the same substituent as described above in connection with the substituted $C_1$-$C_{60}$ alkyl group.

The unsubstituted $C_2$-$C_{60}$ alkenyl group (or $C_2$-$C_{60}$ alkenyl group) used herein refers to an unsubstituted $C_2$-$C_{60}$ alkyl group having one or more carbon double bonds at a center or end thereof. Examples of the unsubstituted $C_2$-$C_{60}$ alkenyl group are ethenyl, prophenyl, and butenyl. At least one hydrogen atom of these unsubstituted $C_2$-$C_{60}$ alkenyl groups may be substituted with the same substituent as described above in connection with the substituted $C_1$-$C_{60}$ alkyl group.

The unsubstituted $C_2$-$C_{60}$ alkynyl group (or $C_2$-$C_{60}$ alkynyl group) used herein refers to an unsubstituted $C_2$-$C_{60}$ alkyl group having one or more carbon triple bonds at a center or end thereof. Examples of the unsubstituted $C_2$-$C_{60}$ alkynyl group are ethynyl, propynyl, and the like. At least one hydrogen atom of these alkynyl groups may be substituted with the same substituent as described above in connection with the substituted $C_1$-$C_{60}$ alkyl group.

The unsubstituted C6-C60 aryl group is a monovalent group having a carbocyclic aromatic system having 6 to 60 carbon atoms including at least one aromatic ring. The unsubstituted C6-C60 arylene group is a divalent group having a carbocyclic aromatic system having 6 to 60 carbon atoms including at least one aromatic ring. When the aryl group and the arylene group include two or more rings, the rings may be fused to each other. At least one hydrogen atom of these aryl groups and arylene groups may be substituted with the same substituent as described above in connection with the substituted $C_1$-$C_{60}$ alkyl group.

Examples of the substituted or unsubstituted $C_6$-$C_{60}$ aryl group are a phenyl a $C_1$-$C_{10}$ alkylphenyl group (for example, ethylphenyl group), a $C_1$-$C_{10}$ alkylbiphenyl group (for example, ethylbiphenyl group), a halophenyl group (for example, an o-, m- or p-fluorophenyl group, a dichlorophenyl group), a dicyanophenyl group, trifluoromethoxyphenyl group, o-, m-, and p-tolyl groups, o-, m- and p-cumenyl groups, a mesityl group, a phenoxyphenyl group, a (α,α-dimethylbenzene)phenyl group, a (N,N'-dimethyl)aminophenyl group, a (N,N'-diphenyl)aminophenyl group, a pentalenyl group, an indenyl group, a naphthyl group, halonaphthyl group (for example, a fluoronaphthyl group), a $C_1$-$C_{10}$ alkylnaphthyl group (for example, a methylnaphthyl group), a $C_1$-$C_{10}$ alkoxynaphthyl group (for example, a methoxynaphthyl group), an anthracenyl group, azrenyl group, a heptalenyl group, an acenaphthylenyl group, a phenalenyl group, a fluorenyl group, anthraquinolinyl group, a methylanthryl group, a phenanthryl group, a triphenylenyl group, a pyreny group, a chrysenyl group, an ethyl-chrysenyl group, a picenyl group, perylenyl group, a chloroperylenyl group, a pentaphenyl group, a pentasenyl group, a tetraphenylenyl group, a hexaphenyl group, a hexacenyl group, a rubicenyl group, a coroneryl group, a trinaphthylenyl group, a heptaphenyl group, a heptacenyl group, a piranthrenyl group, and an obarenyl group, and examples of the substituted $C_6$-$C_{60}$ aryl group may be easily understood by referring to the examples of the unsubstituted $C_6$-$C_6$ aryl group and the substituents of the substituted $C_1$-$C_{60}$ alkyl group. Examples of the substituted or unsubstituted $C_6$-$C_{60}$ arylene group may be easily understood by referring to examples of the substituted or unsubstituted $C_6$-$C_{60}$ aryl group.

The unsubstituted $C_2$-$C_{60}$ heteroaryl group used herein refers to a monovalent group having one or more of an aromatic ring having at least one hetero atom selected from nitrogen (N), oxygen (O), phosphorous (P), and sulfur (S) and carbon atoms as the remaining ring atoms. The unsubstituted $C_2$-$C_{60}$ heteroarylene group used herein refers to a divalent group having one or more of an aromatic ring having at least one hetero atom selected from nitrogen (N), oxygen (O), phosphorous (P), and sulfur (S) and carbon atoms as the remaining ring atoms. In this regard, when the heteroaryl group and the heteroarylene group include two or more rings, the rings may be fused to each other. At least one hydrogen atom of the heteroaryl group and the heteroarylene group may be substituted with the same substituent described in connection with the $C_1$-$C_{60}$ alkyl group.

Examples of the unsubstituted $C_2$-$C_{60}$ heteroaryl group are a pyrazolyl group, an imidazolyl group, an oxazolyl group, a thiazolyl group, a triazolyl group, a tetrazolyl group, an oxadiazolyl group, a pyridinyl group, a pyridazinyl group, a pyrimidinyl group, a triazinyl group, a carbazolyl group, an indolyl group, a quinolinyl group, an isoquinolinyl group, a benzoimidazolyl group, an imidazopyridinyl group, and an imidazopyrimidinyl group. Examples of the unsubstituted $C_2$-$C_{60}$ heteroarylene group may be easily understood by referring to the examples of the substituted or unsubstituted $C_2$-$C_{60}$ arylene group.

The substituted or unsubstituted $C_6$-$C_{60}$ aryloxy group indicates —$OA_2$ (where $A_2$ is the substituted or unsubstituted $C_6$-$C_{60}$ aryl group), and the substituted or unsubstituted $C_5$-$C_{60}$ arylthio group indicates —$SA_3$ (where $A_3$ is the substituted or unsubstituted $C_6$-$C_{60}$ aryl group).

Hereinafter, an organic light-emitting diode according to an embodiment of the present invention is described in detail with reference to Synthesis Examples and examples. However, the organic light-emitting diode according to an embodiment of the present invention is not limited to the Synthesis Examples and examples. Regarding Synthesis Examples below, the wording "B was used instead of A" includes the meaning that a molar equivalent amount of B is identical to that of A.

EXAMPLE

Synthesis Example 1

Synthesis of Compound 4

Compound 4 was synthesized according to Reaction Scheme 1 below:

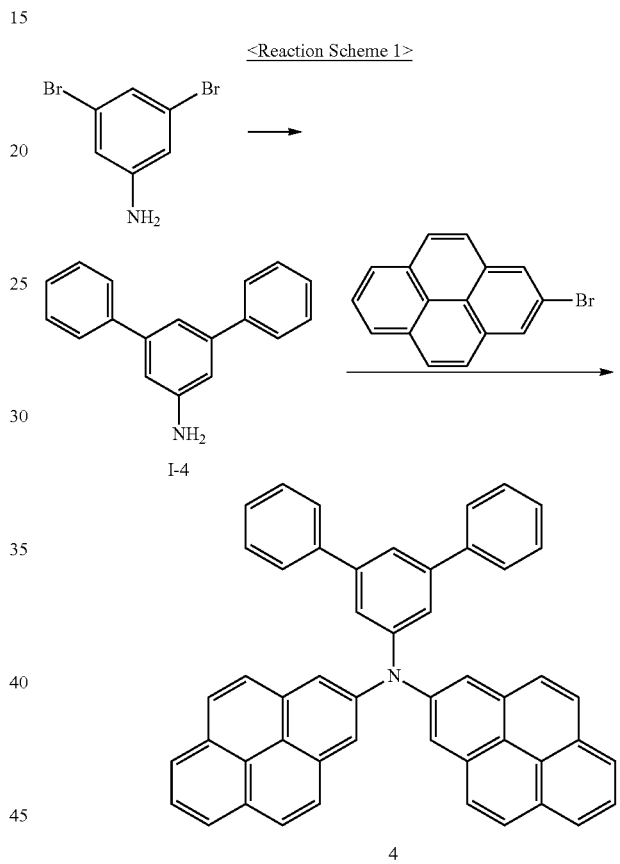

Synthesis of Intermediate I-4

2.51 g (10.0 mmol) of 3,5-dibromophenylamine, 4.48 g (22.0 mmol) of iodobenzene, 0.58 g (0.5 mmol) of tetrakis(triphenylphosphine)palladium(0) (Pd(PPh$_3$)$_4$), and 6.21 g (45.0 mmol) of $K_2CO_3$ were dissolved in 40 mL of a tetrahydrofuran (THF)/$H_2O$ (2/1) mixed solution, and then, the mixture was stirred at a temperature of 80° C. for 5 hours. The reaction solution was cooled to room temperature, and then, was extracted three times with 40 mL of water and 40 mL of diethylether. An organic layer obtained therefrom was dried with magnesium sulfate and a solvent was evaporated and the residual was separation-purified by silicagel column chromatography to obtain Intermediate I-4 (2.11 g, 86% of yield). The obtained compound was identified by LC-MS.

$C_1H_{15}N$ M$^+$ 245.1

Synthesis of Compound 4

1.40 g (5.0 mmol) of 2-bromopyrene, 1.23 g (5.0 mmol) of Intermediate I-4, 0.09 g (0.1 mmol) of tris(dibenzylideneacetone)dipalladium(0) ($Pd_2(dba)_3$), 0.01 g (0.1 mmol) of tri-tert-butylphosphine ($PtBu_3$), and 1.38 g (10.0 mmol) of KOtBu were dissolved in 20 mL of toluene and then, the mixture was stirred at a temperature of 85° C. for 2 hours. The reaction solution was cooled to room temperature and then extracted three times with 20 mL of water and mL of diethylether. An organic layer obtained therefrom was dried with magnesium sulfate and a solvent was evaporated, and the obtained residual was dissolved in 20 mL of toluene, and 6.18 g (5.0 mmol) of 2-bromopyrene, 0.09 g (0.1 mmol) of $Pd_2(dba)_3$, 0.01 g (0.1 mmol) of $PtBu_3$, and 1.38 g (10.0 mmol) of KOtBu were added thereto and the resultant mixture was stirred at a temperature of 85° C. for 2 hours. The reaction solution was cooled to room temperature and then extracted three times with 20 mL of water and 20 mL of diethylether. An organic layer obtained therefrom was dried with magnesium sulfate and a solvent was evaporated and the residual was separation-purified by silicagel column chromatography to obtain Compound 4 (2.74 g, 85% of yield) The obtained compound was identified by MS/FAB and $^1H$ NMR.

$C_{50}H_{31}N$ cal. 645.25, found 646.26

$^1H$ NMR (400 MHz, $CDCl_3$) δ (ppm) •8.22 (d, 4H), 8.05-8.01 (m, 6H), 7.69-7.64 (m, 4H), 7.55 (d, 4H), 7.52-7.51 (m, 5H), 7.46-7.39 (m, 6H), 7.12 (s, 2H)

Synthesis Example 2

Synthesis of Compound 42

Compound 42 was synthesized according to Reaction Scheme 2 below:

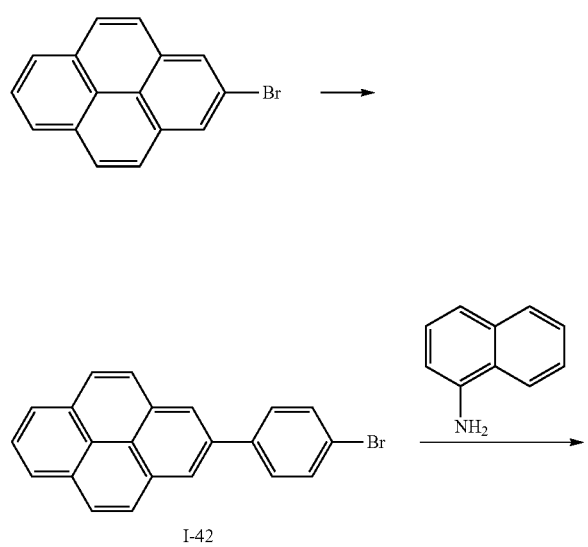

I-42

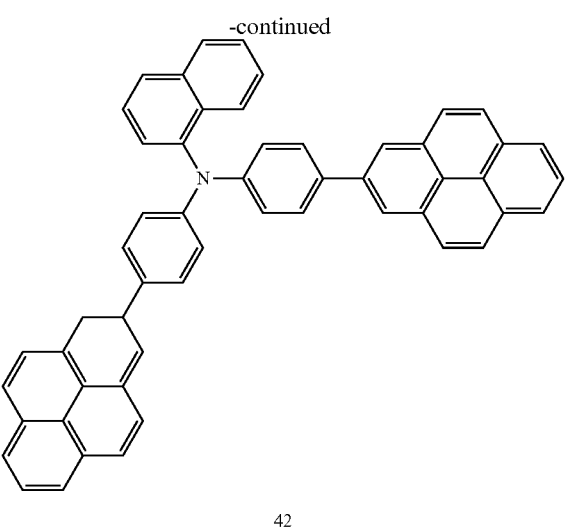

42

Synthesis of Intermediate I-42

6.75 g (24.0 mmol) of 2-bromopyrene, 4.00 g (20.0 mmol) of 4-bromobenzene-1-boronic acid, 1.15 g (1.0 mmol) of $Pd(PPh_3)_4$, and 4.14 g (30.0 mmol) of $K_2CO_3$ were dissolved in 60 mL of tetrahydrofuran (THF)/$H_2O$ (2/1) mixed. The reaction solution was cooled to room temperature, and then, extracted three times using 60 mL of water and 60 mL of diethylether. An organic layer obtained therefrom was dried with magnesium sulfate and a solvent was evaporated and the residual was separation-purified by silicagel column chromatography to obtain 5.43 g (yield: 76%) of Intermediate I-42. The obtained compound was identified by LC-MS.

$C_{22}H_{13}Br$ M$^+$ 356.0

Synthesis of Compound 42

0.72 g (5.0 mmol) of 1-aminonaphthalene, 1.78 g (5.0 mmol) of Intermediate I-42, 0.09 g (0.1 mmol) of $Pd_2(dba)_3$, 0.01 g (0.1 mmol) of $PtBu_3$, and 1.38 g (10.0 mmol) of KOtBu were dissolved in 20 mL of toluene and then, the mixture was stirred at a temperature of 85° C. for 2 hours. The reaction solution was cooled to room temperature and then extracted three times with 20 mL of water and 20 mL of diethylether. An organic layer obtained therefrom was dried with magnesium sulfate and a solvent was evaporated and the residual was dissolved in 20 mL of toluene, and then, 1.78 g (5.0 mmol) of Intermediate I-42, 0.09 g (0.1 mmol) of $Pd_2(dba)_3$, 0.01 g (0.1 mmol) of $PtBu_3$, and 1.38 g (10.0 mmol) of KOtBu were added thereto and the mixture was stirred at a temperature of 85° C. for 2 hours. The reaction solution was cooled to room temperature and then extracted three times with 20 mL of water and 20 mL of diethylether. An organic layer obtained therefrom was dried with magnesium sulfate and a solvent was evaporated and the residual was separation-purified by silicagel column chromatography to obtain Compound 42(2.67 g, 77% of yield). The obtained compound was identified by MS/FAB and $^1H$ NMR.

$C_{54}H_{33}N$ cal. 695.26, found 696.27

$^1H$ NMR (400 MHz, $CDCl_3$) δ (ppm) •8.24-8.20 (m, 8H), 8.16 (d, 1H), 8.07-8.01 (m, 6H), 7.87-7.81 (m, 5H), 7.52-7.40 (m, 7H), 7.25-7.21 (m, 1H), 7.06 (d, 4H), 6.99 (d, 1H)

Synthesis Example 3

Synthesis of Compound 52

Compound 52 was synthesized according to Reaction Scheme 3 below:

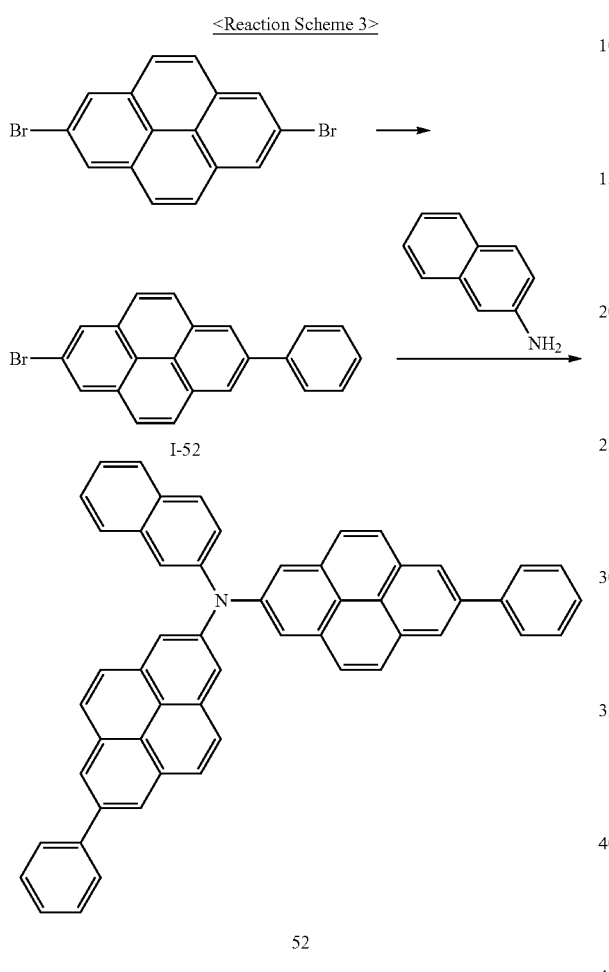

Synthesis of Intermediate I-52

10.8 g (30.0 mmol) of 2,7-dibromopyrene, 2.44 g (20 mmol) of phenyl boronic acid, 1.15 g (1.0 mmol) of Pd(PPh$_3$)$_4$, and 4.14 g (30.0 mmol) of K$_2$CO$_3$ were dissolved in 60 mL of tetrahydrofuran (THF)/H$_2$O (2/1) mixed The reaction solution was cooled to room temperature, and then, extracted three times using 60 mL of water and 60 mL of diethylether. An organic layer obtained therefrom was dried with magnesium sulfate and a solvent was evaporated and the residual was separation-purified by silicagel column chromatography to obtain 4.07 g (yield: 57%) of Intermediate I-52. The obtained compound was identified by LC-MS.

C$_{22}$H$_{13}$Br M$^+$ 356.0

Synthesis of Compound 52

Compound 52 (2.82 g, 81% of yield) was obtained in the same manner as in Synthesis of Compound 42 of Synthesis Example 2, except that naphthalen-2-amine and Intermediate I-52 were respectively used instead of 1-aminonaphthalene and Intermediate I-42 in synthesizing Compound 42. The obtained compound was identified by MS/FAB and $^1$H NMR.

C$_{54}$H$_{33}$N cal. 695.26, found 696.27

$^1$H NMR (400 MHz, CDCl$_3$) δ (ppm) •8.29 (s, 4H), 7.83-7.73 (m, 10H) 7.61 (d, 4H), 7.58-7.53 (m, 3H), 7.47-7.37 (m, 11H), 7.13 (d, 1H)

Synthesis Example 4

Synthesis of Compound 54

Compound 54 was synthesized according to Reaction Scheme 4 below:

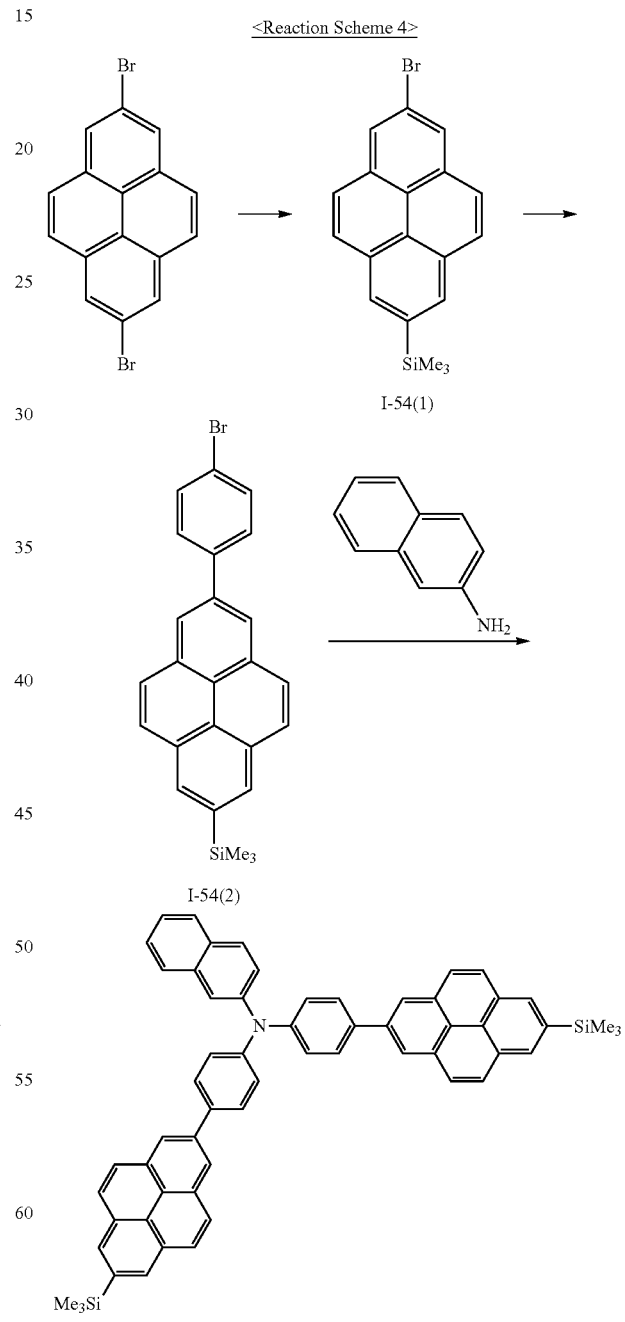

Synthesis of Intermediate I-54(1)

10.8 g (30.0 mmol) of 2,7-dibromopyrene was dissolved in THF 80 mL of THF, and then, n-BuLi 12.0 mL (30.0 mmol, 2.5M in Hexane) was slowly dropped thereto at a temperature of −78° C., and then, stirred at a temperature of −78° C. for 1 hour. 4.19 mL (33.0 of chlorotrimethylsilane was slowly added to the solution at a temperature of −78° C., and then, the mixture was stirred for 1 hour, and then, the temperature was increased to room temperature and then the resultant mixture was stirred for 2 hours. 70 mL of water and 30 mL of saturated NH4Cl aqueous solution were added to the reaction solution, and then, an organic layer was separated and extracted three times with 50 mL of diethylether. An organic layer obtained therefrom was dried with magnesium sulfate and a solvent was evaporated and the residual was separation-purified by silicagel column chromatography to obtain 7.21 g (yield: 68%) of Intermediate I-54(1). The obtained compound was identified by LC-MS.

$C_{19}H_{17}BrSi$ M+ 352.0

Synthesis of Intermediate I-54(2)

Intermediate I-54(2) (4.38 g, 60% of yield) was obtained in the same manner as in Synthesis of Intermediate I-42 of Synthesis Example 2, except that Intermediate I-54(1) was used instead of 2-bromopyrene in synthesizing Intermediate I-42. The obtained compound was identified by LC-MS.

$C_{25}H_{21}BrSi$ M+ 428.0

Synthesis of Compound 54

Compound 54 (3.06 g, 73% of yield) was obtained in the same manner as in Synthesis of Compound 42 of Synthesis Example 2, except that naphthalen-2-amine and Intermediate I-54(2) were respectively used instead of 1-aminonaphthalene and Intermediate I-42 in synthesizing Compound 42. The obtained compound was identified by MS/FAB and $^1$H NMR.

$C_{60}H_{49}NSi_2$ cal. 839.34, found 840.35
$^1$H NMR (400 MHz, CDCl$_3$) δ (ppm) •8.20 (s, 4H), 7.98-7.88 (m, 12H), 7.78 (d, 1H), 7.66 (d, 1H), 7.58-7.51 (m, 7H), 7.41-7.38 (m, 18), 7.13 (d, 1H), 7.05 (d, 4H), 0.36 (s, 18H)

Synthesis Example 5

Synthesis of Compound 10

Synthesis of Intermediate I-10

Intermediate I-10 was synthesized in the same manner as in Synthesis of Intermediate I-4 of Synthesis Example 1, except that 4-bromobenzenamine was used instead of 3,5-dibromophenylamine in synthesizing Intermediate I-4.
<Intermediate I-10>

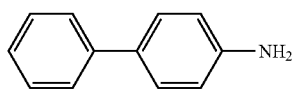 [SMILES: Nc1ccc(-c2ccccc2)cc1]

Synthesis of Compound 10

Compound 10 (2.31 g, 81% of yield) was synthesized in the same manner as in Synthesis of Compound 4 of Synthesis Example 1, except that Intermediate I-10 was used instead of Intermediate I-4 in synthesizing Compound 4. The obtained compound was identified by MS/FAB and $^1$H NMR.

$C_{44}H_{27}N$ cal. 569.21, found 570.23
$^1$H NMR (400 MHz, CDCl$_3$) δ (ppm) •8.22 (d, 4H), 8.05-8.01 (m, 611), 7.65-7.61 (m, 2H), 7.57 (d, 4H) 7.53-7.45 (m, 8H), 7.42-7.36 (m, 1H), 7.09 (d, 2H)

Synthesis Example 6

Synthesis of Compound 12

Compound 12 (3.04 g, 83% of yield) was synthesized in the same manner as in Synthesis of Compound 4 of Synthesis Example 1, except that 9,9-diphenyl-9H-fluoren-2-amine was used instead of Intermediate I-4 in synthesizing Compound 4. The obtained compound was identified by MS/FAB and $^1$H NMR.

$C_{57}H_{34}N$ cal. 733.28, found 734.29
$^1$H NMR (400 MHz, CDCl$_3$) δ (ppm) 8.22 (d, 4H), 8.06-8.01 (m, 6H), 7.86 (d, 7.56 (d, 4H), 7.49 (s, 4H), 7.47-7.42 (m, 2H), 7.21-7.08 (m, 11H), 7.06-7.03 (m, 2H), 6.97 (d, 1H)

Synthesis Example 7

Synthesis of Compound 14

Compound 14 (2.60 g, 79 of yield) was synthesized in the same manner as in Synthesis of Compound 4 of Synthesis Example 1, except that 9-phenyl-9H-carbazol-3-amine was used instead of Intermediate I-4 in synthesizing Compound 4. The obtained compound was identified by MS/FAB and $^1$H NMR.

$C_{50}H_{30}N$ cal. 658.24, found 659.27
$^1$H NMR (400 MHz, CDCl$_3$) δ (ppm) •8.23-8.20 (m, 5H), 8.06-8.00 (m, 6H), 7.56 (d, 4H), 7.53-7.47 (m, 8H), 7.39-7.35 (m, 3H), 7.32-7.23 (m, 3H), 7.03 (d, 1H)

Synthesis Example 8

Synthesis of Compound 15

Compound 15 (2.54 g, 77 of yield) was synthesized in the same manner as in Synthesis of Compound 4 of Synthesis Example 1, except that 4-(9H-carbazol-9-yl)benzenamine was used instead of Intermediate I-4 in synthesizing Compound 4. The obtained compound was identified by MS/FAB and $^1$H NMR.

$C_{50}H_{32}N_2$ cal. 658.24, found 659.25
$^1$H NMR (400 MHz, CDCl$_3$) δ (ppm) •8.22 (d, 4H), 8.12 (d, 2H), 8.05-8.01 (m, 6H), 7.56 (d, 4H), 7.51 (s, 4H), 7.37-7.25 (m, 6H), 7.17-7.13 (m, 2H), 7.02 (d, 2H)

Synthesis Example 9

Synthesis of Compound 20

Compound 20 (2.13 g, 88 of yield) was synthesized in the same manner as in Synthesis of Compound 4 of Synthesis Example 1, except that pyridin-2-amine was used instead of Intermediate I-4 in synthesizing Compound 4. The obtained compound was identified by MS/FAB and $^1$H NMR.

$C_{37}H_{22}N_2$ cal. 494.18, found 495.19
$^1$H NMR (400 MHz, CDC$_3$) δ (ppm) •8.25 (d, 1H), 8.22 (d, 4H), 8.05-8.01 (m, 6H), 7.64 (s, 4H), 7.62 (d, 4H), 7.48-7.44 (m, 1H), 7.14 (d, 1H), 7.05 (dt, 1H)

Synthesis Example 10

Synthesis of Compound 23

Compound 23 (2.29 g, 72% of yield) was synthesized in the same manner as in Synthesis of Intermediate I-4 of Example 1, except that chlorotrimethylsilane was used instead of iodobenzene in synthesizing Intermediate I-4. The obtained compound was identified by MS/FAB and $^1$H NMR.

$C_{44}H_{39}NSi_2$ cal. 637.26, found 638.28

$^1$H NMR (400 MHz, CDCl$_3$) δ (ppm) •8.22 (d, 4H), 8.05-8.01 (m, 6H), 7.57-7.55 (m, 5H), 7.24 (s, 2H), 7.10 (s, 4H), 0.18 (s, 18H)

Synthesis Example 11

Synthesis of Compound 28

Compound 28 (1.94 g, 68 of yield) was synthesized in the same manner as in Synthesis of Compound 4 of Synthesis Example 1, except that 3-(pyridin-3-yl)benzenamine was used instead of Intermediate I-4 in synthesizing Compound 4. The obtained compound was identified by MS/FAB and $^1$H NMR.

$C_{43}H_{26}N_2$ cal. 570.21, found 571.21

$^1$H NMR (400 MHz, CDCl$_3$) δ (ppm) •8.86 (s, 1H), 8.65 (d, 1H), 8.22 (d, 4H), 8.05-8.01 (m, 6H), 7.85 (d, 1H), 7.56 (d, 4H), 7.50 (s, 4H), 7.43-7.40 (m, 1H), 7.25-7.15 (m, 7.06 (s, 1H), 6.96 (d, 1H)

Synthesis Example 12

Synthesis of Compound 30

Compound 30 (3.02 g, 81% of yield) was synthesized in the same manner as in Synthesis Example 3, except that when Intermediate I-52 of Synthesis Example 3 was synthesized, a pyridin-2-yl-2-boronic acid was used instead of the phenyl boronic acid and when Compound 52 of Synthesis Example 3 was synthesized, phenanthren-9-amine was used instead of naphthalen-2-amine. The obtained compound was identified by MS/FAB and $^1$H NMR.

$C_{56}H_{33}N_3$ cal. 747.27, found 748.28

$^1$H NMR (400 MHz, CDCl$_3$) δ (ppm) •8.68 (d, 2H), 8.56 (d, 1H), 8.50 (s, 4H), 8.20-8.15 (m, 1H), 8.09 (d, 4H), 8.03-8.01 (m, 1H), 7.85 (d, 2H), 7.77-7.67 (m, 8H), 7.60-7.53 (m, 2H), 7.43-7.41 (m, 1H), 7.32-7.27 (m, 6H), 6.97 (s, 1H)

Synthesis Example 13

Synthesis of Compound 34

Synthesis of Intermediate I-34

Intermediate I-34 below was synthesized in the same manner as in Synthesis of Intermediate I-42 of Synthesis Example 2, except that 7-bromo-9,9-dimethyl-9H-fluoren-2-yl-2-boronic acid was used instead of 4-bromobenzene-1-boronic acid in synthesizing Intermediate I-42.

<Intermediate I-34>

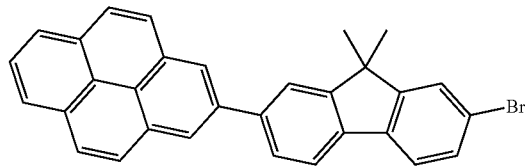 [SMILES: CC1(C)c2cc(Br)ccc2-c2ccc(-c3cc4ccc5cccc6ccc(c3)c4c56)cc21]

Synthesis of Compound 34

1.40 g (5.0 mmol) of 2-bromopyrene, 0.46 g (5.0 mmol) of aniline, 0.09 g (0.1 mmol) of tris(dibenzylideneacetone)dipalladium(0) (Pd$_2$(dba)$_3$), 0.01 g (0.1 mmol) of tri-tert-butylphosphine (PtBu$_3$), and 1.38 g (10.0 mmol) of KOtBu were dissolved in 20 mL of toluene, and then, the mixture was stirred at a temperature of 85° C. for 2 hours. The reaction solution was cooled to room temperature, and then, extracted three times with 20 mL of water and 20 mL of diethylether. An organic layer obtained therefrom was dried with magnesium sulfate and a solvent was evaporated, and the obtained residual was dissolved in 20 mL of toluene, and 2.36 g (5.0 mmol) of Intermediate I-34, 0.09 g (0.1 mmol) of Pd$_2$(dba)$_3$, 0.01 g (0.1 mmol) of PtBu$_3$, and 1.38 g (10.0 mmol) of KOtBu were added thereto and the resultant mixture was stirred at a temperature of 85° C. for 2 hours. The reaction solution was cooled to room temperature and then extracted three times with 20 mL of water and 20 mL of diethylether. An organic layer obtained therefrom was dried with magnesium sulfate and a solvent was evaporated and the residual was separation-purified by silicagel column chromatography to obtain Compound 34 (2.84 g, 83% of yield) The obtained compound was identified by MS/FAB and $^1$H NMR.

$C_{53}H_{35}N$ cal. 685.28, found 686.30

$^1$H NMR (400 MHz, CDCl$_3$) δ (ppm) •8.23-8.20 (m, 6H), 8.09-7.99 (m, 6H), 7.87 (d, 2H), 7.73 (d, 1H), 7.68-7.55 (m, 5H), 7.48 (s, 2H), 7.21-7.17 (m, 2H), 7.10-7.06 (m, 2H), 7.02 (d, 1H), 6.96 (d, 2H), 1.65 (s, 6H)

Synthesis Example 14

Synthesis of Compound 38

Synthesis of Intermediate I-38 (1)

Intermediate I-38 (1) below was synthesized in the same manner as in Synthesis of Intermediate I-42 of Synthesis Example 2, except that 4-bromonaphthalen-1-yl-1-boronic acid was used instead of 4-bromobenzene-1-boronic acid in synthesizing Intermediate I-42.

<Intermediate I-38(1)>

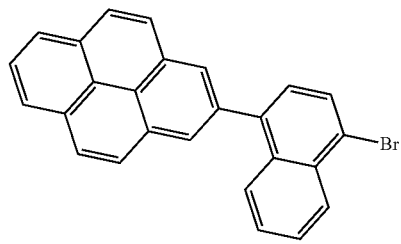 [SMILES: Brc1ccc(-c2cc3ccc4cccc5ccc(c2)c3c45)c2ccccc12]

Synthesis of Compound 38

Compound 38 (2.87 g, 81% of yield) was prepared in the same manner as in Synthesis of Compound 34 of Synthesis Example 13, except that Intermediate I-38(2) below was used instead of aniline, and the Intermediate I-38(1) was used instead of Intermediate I-34 in synthesizing Compound 34. The obtained compound was identified by MS/FAB and $^1$H NMR.

$C_{54}H_{31}NO$ cal. 709.24, found 710.26

$^1$H NMR (400 MHz, CDCl$_3$) δ (ppm) •8.23-8.19 (m, 6H), 8.15 (d, 1H), 8.09-8.02 (m, 6H), 7.92 (d, 2H), 7.84 (d, 1H), 7.73-7.69 (m, 2H), 7.61-7.48 (m, 6H), 7.46-7.40 (m, 3H), 7.35 (d, 1H), 7.19 (dt (1H), 7.12 (d, 1H), 7.03 (d, 1H)

<Intermediate I-38(2)>

Synthesis Example 15

Synthesis of Compound 40

Synthesis of Intermediate I-40

Intermediate I-40 was synthesized in the same manner as in Synthesis of Intermediate I-4 of Synthesis Example 1, except that 3,5-dibromo-2-fluorobenzenamine was used instead of 3,5-dibromophenylamine in synthesizing Intermediate I-4.

<Intermediate I-40>

Synthesis of Compound 40

Compound 40 (2.62 g, 71% of yield) was prepared in the same manner as in Synthesis of Compound 34 of Synthesis Example 13, except that Intermediate I-40 below was used instead of aniline, and the Intermediate I-42 synthesized in Synthesis Example 2 was used instead of Intermediate I-34 in synthesizing Compound 34. The obtained compound was identified by MS/FAB and $^1$H NMR.

$C_{56}H_{34}NF$ cal. 739.27, found 740.26

$^1$H NMR (400 MHz, CDCl$_3$) δ (ppm) •8.23-8.21 (d, 6H), 8.09-8.01 (m, 6H), 7.82 (d, 2H), 7.72-7.61 (m, 7H), 7.55-7.49 (m, 9H), 7.44-7.40 (m, 1H), 7.19 (d, 1H), 7.01 (d, 2H)

Synthesis Example 16

Synthesis of Compound 43

Synthesis of Intermediate I-43

Intermediate I-43 below was synthesized in the same manner as in Synthesis of Intermediate I-42 of Synthesis Example 2, except that 4-bromo-2,5-dimethylphenylboronic acid was used instead of 4-bromobenzene-1-boronic acid in synthesizing Intermediate I-42.

<Intermediate I-43>

Synthesis of Compound 43

Compound 43 (2.64 g, 68% of yield) was prepared in the same manner as in Synthesis of Compound 42 of Synthesis Example 2, except that Intermediate I-10 synthesized in Synthesis Example 5 was used instead of 1-aminonaphthalene, and the Intermediate I-43 was used instead of Intermediate I-42 in synthesizing Compound 42. The obtained compound was identified by MS/FAB and $^1$H NMR.

$C_{60}H_{43}N$ cal. 777.34, found 778.36

$^1$H NMR (400 MHz, CDCl$_3$) δ (ppm) •8.22 (d, 4H), 8.07-8.01 (m, 6H), 7.84-7.80 (m, 8H), 7.64-7.61 (m, 2H), 7.52-7.49 (m, 2H), 7.44-7.36 (m, 5H), 7.12 (s, 2H), 7.02 (d, 2H), 2.19 (s, 6H), 2.00 (s, 6H)

Synthesis Example 17

Synthesis of Compound 47

Synthesis of Intermediate I-47

Intermediate I-47 below was synthesized in the same manner as in Synthesis of Intermediate I-42 of Synthesis Example 2, except that 3-bromophenylboronic acid was used instead of 4-bromobenzene-1-boronic acid in synthesizing Intermediate I-42.

<Intermediate I-47>

Synthesis of Compound 47

Compound 47 (2.35 g, 65% of yield) was prepared in the same manner as in Synthesis of Compound 42 of Synthesis Example 2, except that 3-(pyridin-3-yl)benzenamine was used instead of 1-aminonaphthalene, and the Intermediate I-47 above was used instead of Intermediate I-42 in synthesizing Compound 42. The obtained compound was identified by MS/FAB and $^1$H NMR.

$C_{55}H_{34}N_2$ cal. 722.27, found 723.28

$^1$H NMR (400 MHz, CDCl$_3$) δ (ppm) •8.868.65 (m, 8H), 8.32 (d, 1H), 8.08-8.00 (m, 6H), 7.86-7.83 (m, 5H), 7.50-7.42 (m, 7H), 7.34-7.18 (m, 1H), 7.09 (d, 4H), 6.99 (d, 1H)

Synthesis Example 18

Synthesis of Compound 48

1.78 g (5.0 mmol) of Intermediate I-34 (see Synthesis Example 13), 1.04 g (5.0 mol) of 9,9-dimethyl-9H-fluoren-2-amine, 0.09 g (0.1 mmol) of tris(dibenzylideneacetone)dipalladium(0) ($Pd_2(dba)_3$), 0.01 g (0.1 mmol) of tri-tert-butylphosphine ($PtBu_3$), and 1.38 g (10.0 mmol) of KOtBu were dissolved in 20 mL of toluene, and then, the mixture was stirred at a temperature of 85° C. for 2 hours. The reaction solution was cooled to room temperature, and then, extracted three times with 20 mL of water and 20 mL of diethylether. An organic layer obtained therefrom was dried with magnesium sulfate and a solvent was evaporated, and the obtained residual was dissolved in 20 mL of toluene, and 2.37 g 3 (5.0 mmol) of Intermediate I-42 (see Synthesis Example 2), 0.09 g (0.1 mmol) of $Pd_2(dba)_3$, 0.01 g (0.1 mmol) of $PtBu_3$, and 1.38 g (10.0 mmol) of KOtBu were added thereto and the resultant mixture was stirred at a temperature of 85° C. for 2 hours. The reaction solution was cooled to room temperature and then extracted three times with 20 mL of water and 20 mL of diethylether. An organic layer obtained therefrom was dried with magnesium sulfate and a solvent was evaporated and the residual was separation-purified by silicagel column chromatography to obtain Compound 48 (3.38 g, 77% % of yield) The obtained compound was identified by MS/FAB and $^1$H NMR.

$C_{68}H_{47}N$ cal. 877.37, found 878.39

$^1$H NMR (400 MHz, $CDCl_3$) δ (ppm) •8.22-8.19 (m, 8H), 8.07-7.99 (m, 6H), 7.86-7.81 (m, 4H), 7.78-7.73 (m, 2H), 7.68-7.52 (m, 6H), 7.41-7.39 (m, 1H), 7.23-719 (m, 2H), 7.08-7.04 (m, 2H), 6.98-6.95 (m, 4H), 1.63 (s, 6H), 1.61 (s, 6H)

Synthesis Example 19

Synthesis of Compound 51

Synthesis of Intermediate I-51

Intermediate I-51 was synthesized in the same manner as in Synthesis of Intermediate I-4 of Synthesis Example 1, except that 4-bromophenylamine was used instead of 3,5-dibromophenylamine and 2-bromopyrene was used instead of iodobenzene in synthesizing Intermediate I-4.

<Intermediate I-51>

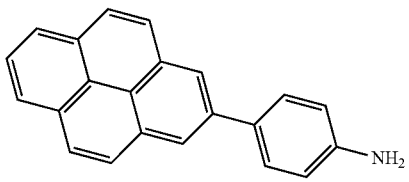 [SMILES: Nc1ccc(-c2cc3ccc4cccc5ccc(c2)c3c45)cc1]

Synthesis of Compound 51

Compound 51 (3.42 g, 81% of yield) was synthesized in the same manner as in Synthesis of Compound 42 of Synthesis Example 2, except that Intermediate I-50 was used instead of 1-aminonaphthalene in synthesizing Compound 42. The obtained compound was identified by MS/FAB and $^1$H NMR.

$C_{66}H_{39}N$ cal. 845.31, found 846.32

$^1$H NMR (400 MHz, $CDCl_3$) δ (ppm) •8.21 (d, 12H), 8.08-8.00 (m, 9H), 7.82 (d, 6H), 7.52 (d, 6H), 7.03 (d, 6H)

Example 1

An anode was prepared by cutting a Corning 15 Ω/cm² (1200 Å) ITO glass substrate to a size of 50 mm×50 mm×0.7 mm, ultrasonically cleaning the glass substrate using isopropyl alcohol and pure water for 5 minutes each, and then irradiating UV light thereto for 30 minutes and exposing to ozone to clean. Then, the glass substrate was loaded into a vacuum deposition apparatus.

2-TNATA was deposited on the ITO layer to form an HIL having a thickness of 600 Å, and then, Compound 4 was deposited on the HIL to form an HTL having a thickness of 300 Å.

Subsequently, 9,10-di-naphthalen-2-yl-anthracene (AND, host) and DPAVBi (dopant) were co-deposited on the HTL at a weight ratio of 98:2 to form an EML having a thickness of 300 Å.

Thereafter, Alq3 was deposited on the EML to form an ETL having a thickness of 300 Å, and LiF was deposited on the ETL to form an EIL having a thickness of 10 Å, and then, Al was deposited on the EIL to form a second electrode (cathode) having a thickness of 3000 Å, thereby completing manufacturing of an organic light-emitting diode.

Example 2

An organic light-emitting diode was manufactured in the same manner as in Example 1, except that Compound 12 was used instead of Compound 4 when an HTL was formed.

Example 3

An organic light-emitting diode was manufactured in the same manner as in Example 1, except that Compound 14 was used instead of Compound 4 when an HTL was formed.

Example 4

An organic light-emitting diode was manufactured in the same manner as in Example 1, except that Compound 23 was used instead of Compound 4 when an HTL was formed.

Example 5

An organic light-emitting diode was manufactured in the same manner as in Example 1, except that Compound 43 was used instead of Compound 4 when an HTL was formed.

Example 6

An organic light-emitting diode was manufactured in the same manner as in Example 1, except that Compound 47 was used instead of Compound 4 when an HTL was formed.

Example 7

An organic light-emitting diode was manufactured in the same manner as in Example 1, except that when an HTL was formed, NPB was used instead of Compound 4, and when an EML was formed, Compound 12 was used instead of DPAVBi.

Example 8

An organic light-emitting diode was manufactured in the same manner as in Example 7, except that when an EML was formed, Compound 40 was used instead of Compound 12.

Example 9

An organic light-emitting diode was manufactured in the same manner as in Example 7, except that when an EML was formed, Compound 42 was used instead of Compound 12.

Example 10

An organic light-emitting diode was manufactured in the same manner as in Example 7, except that when an EML was formed, Compound 43 was used instead of Compound 12.

Example 11

An organic light-emitting diode was manufactured in the same manner as in Example 7, except that when an EML was formed, Compound 52 was used instead of Compound 12.

Comparative Example 1

An organic light-emitting diode was manufactured in the same manner as in Example 1, except that NPB was used instead of Compound 4 when an HTL was formed.

Comparative Example 2

An organic light-emitting diode was manufactured in the same manner as in Example 7, except that Compound A was used instead of DPAVBi when an EML was formed.

<Compound A>

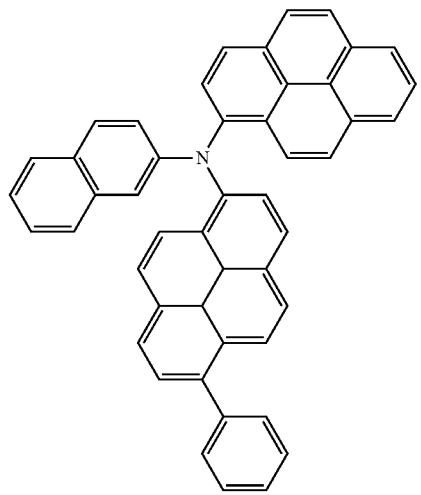

Evaluation Example 1

Driving voltage, current density, brightness, luminescence color, efficiency, and half-life lifetime (@50 mA/cm$^2$) of the organic light-emitting diodes of Examples 1 to 11 and Comparative Examples 1 and 2 were evaluated by using PR650 Spectroscan Source Measurement Unit, (product of Photo-Research Company). Results thereof are shown in Table 1 below. Results thereof are shown in Table 1 below.

TABLE 1

| | HTL | Dopant | Driving voltage (V) | Current density (mA/cm$^2$) | Brightness (cd/m$^2$) | Efficiency (cd/A) | Luminescence color | Half-life lifetime (hr) |
|---|---|---|---|---|---|---|---|---|
| Example 1 | Compound 4 | DPAVBi | 5.67 | 50 | 3,485 | 5.89 | Blue | 295 |
| Example 2 | Compound 12 | DPAVBi | 5.56 | 50 | 3,445 | 5.91 | Blue | 299 |
| Example 3 | Compound 14 | DPAVBi | 5.34 | 50 | 3,240 | 5.84 | Blue | 312 |
| Example 4 | Compound 23 | DPAVBi | 5.66 | 50 | 2,935 | 5.87 | Blue | 288 |
| Example 5 | Compound 43 | DPAVBi | 5.52 | 50 | 3,435 | 5.92 | Blue | 324 |
| Example 6 | Compound 47 | DPAVBi | 5.64 | 50 | 3,265 | 5.72 | Blue | 294 |
| Example 7 | NPB | Compound 12 | 6.71 | 50 | 6,920 | 13.84 | Bluish green | 324 |
| Example 8 | NPB | Compound 40 | 6.68 | 50 | 3,560 | 6.97 | Blue | 356 |
| Example 9 | NPB | Compound 42 | 6.67 | 50 | 3,380 | 6.86 | Blue | 343 |
| Example 10 | NPB | Compound 43 | 6.67 | 50 | 2,385 | 6.77 | Blue | 316 |
| Example 11 | NPB | Compound 52 | 6.65 | 50 | 7,690 | 15.38 | Green | 311 |
| Comparative Example 1 | NPB | DPAVBi | 7.35 | 50 | 2,065 | 4.12 | Blue | 145 |
| Comparative Example 2 | NPB | Compound A | 6.79 | 50 | 5,470 | 10.94 | Bluish green | 232 |

From Table 1, the organic light-emitting diodes of Examples 1 to 6 (the compound of Formula 1 was used as an HTL material) had better driving voltage, efficiency and lifetime characteristics than the organic light-emitting diode of Comparative Example 1. In addition, the organic light-emitting diodes of Examples 8 to 10 (blue-light emitting organic light-emitting diodes using the compound of Formula 1 as an EML material) had better driving voltage, efficiency and lifetime characteristics of the organic light-emitting diode of Comparative Example 1. Finally, the organic light-emitting diodes of Examples 7 to 11 (green-light emitting organic light-emitting diodes using the compound of Formula 1 as a material of the EML) had better driving voltage, efficiency and lifetime characteristics of the organic light-emitting diode of Comparative Example 2.

An organic light-emitting diode including the amine-based compound may have a low driving voltage, high brightness, high efficiency, and a long lifespan.

What is claimed is:

1. An organic light-emitting diode comprising: a first electrode; a second electrode facing the first electrode; and an organic layer interposed between the first electrode and the second electrode, wherein the organic layer comprises at least one amine-based compound of Formula 1:

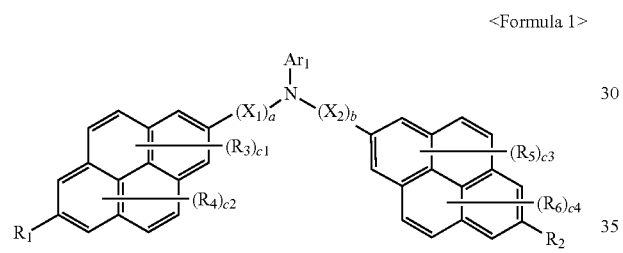

<Formula 1> in Formula 1, $X_1$ and $X_2$ are each independently a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, or a substituted or unsubstituted $C_2$-$C_{60}$ heteroarylene group;

a and b are each independently an integer of 0 to 5;

$Ar_1$ is a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, or a substituted or unsubstituted $C_2$-$C_{60}$ heteroaryl group;

$R_1$ to $R_6$ are independently a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_2$-$C_{10}$ heterocycloalkyl group, a substituted or unsubstituted $C_3$-$C_{10}$ cycloalkenyl group, a substituted or unsubstituted $C_2$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_2$-$C_{60}$ heteroaryl group, or —Si($Q_3$)($Q_4$)($Q_5$) where $Q_3$ to $Q_5$ are a $C_1$-$C_{60}$ alkyl group, a $C_1$-$C_{60}$ alkoxy group, a $C_6$-$C_{60}$ aryl group, or a $C_2$-$C_{60}$ heteroaryl group; and c1 to c4 are independently integers of 1 to 4;

wherein the organic layer comprises an emission layer, and the emission layer comprises the amine-based compound of Formula 1;

and further wherein the amine-based compound of Formula 1 in the emission layer acts as a fluorescent dopant, and the emission layer further comprises a host.

2. An amine-based compound of claim 1, wherein $X_1$ and $X_2$ are each independently a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted spiro-fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted imidazolylene group, a substituted or unsubstituted pyrazolylene group, a substituted or unsubstituted pyridinylene group, a substituted or unsubstituted pyrazinylene group, a substituted or unsubstituted pyrimidinylene group, a substituted or unsubstituted pyridazinylene group, a substituted or unsubstituted isoindolylene group, a substituted or unsubstituted indolylene group, a substituted or unsubstituted indazolylene group, a substituted or unsubstituted purinylene group, a substituted or unsubstituted quinolinylene group, a substituted or unsubstituted benzoquinolinylene group, a substituted or unsubstituted phthalazinylene group, a substituted or unsubstituted naphthyridinylene group, a substituted or unsubstituted quinoxalinylene group, a substituted or unsubstituted quinazolinylene group, a substituted or unsubstituted cinnolinylene group, a substituted or unsubstituted carbazolylene group, a substituted or unsubstituted phenanthridinylene group, a substituted or unsubstituted acridinylene group, a substituted or unsubstituted phenanthrolinylene group, a substituted or unsubstituted phenazinylene group, a substituted or unsubstituted benzooxazolylene group, a substituted or unsubstituted benzoimidazolylene group, a substituted or unsubstituted furanylene group, a substituted or unsubstituted benzofuranylene group, a substituted or unsubstituted thiophenylene group, a substituted or unsubstituted benzothiophenylene group, a substituted or unsubstituted thiazolylene group, a substituted or unsubstituted isothiazolylene group, a substituted or unsubstituted benzothiazolylene group, a substituted or unsubstituted isoxazolylene group, a substituted or unsubstituted oxazolylene group, a substituted or unsubstituted triazolylene group, a substituted or unsubstituted tetrazolylene group, a substituted or unsubstituted oxadiazolylene group, a substituted or unsubstituted triazinylene group, a substituted or unsubstituted benzooxazolylene group, a substituted or unsubstituted dibenzofuranylene group, a substituted or unsubstituted dibenzothiophenylene group, or a substituted or unsubstituted benzocarbazolyl group.

3. An amine-based compound of claim 1, wherein $X_1$ and $X_2$ are each independently represented by any one of Formulae 2-1 to 2-24 below:

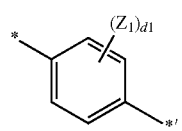

Formula 2-1

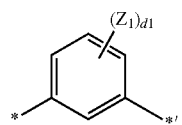

Formula 2-2

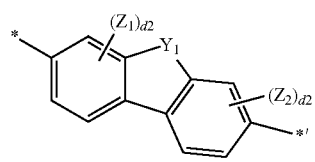

Formula 2-3

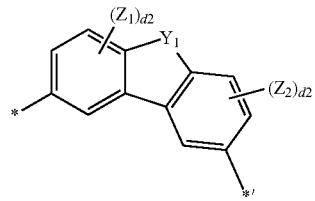

Formula 2-4

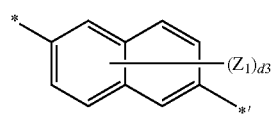

Formula 2-5

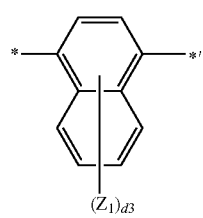

Formula 2-6

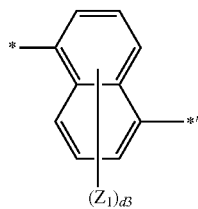

Formula 2-7

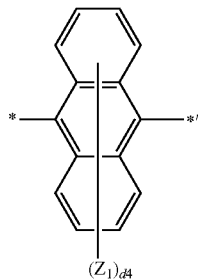

Formula 2-8

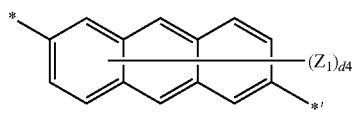

Formula 2-9

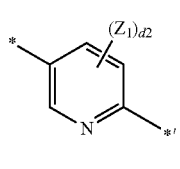

Formula 2-10

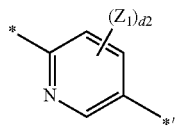

Formula 2-11

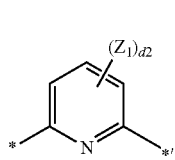

Formula 2-12

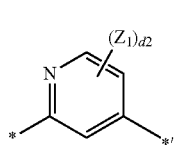

Formula 2-13

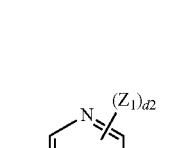

Formula 2-14

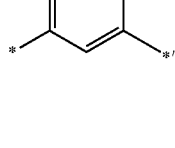

Formula 2-15

Formula 2-16

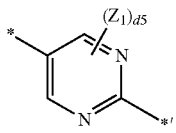

Formula 2-17

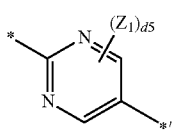

Formula 2-18

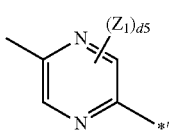

Formula 2-19

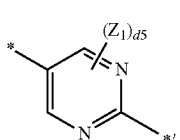

Formula 2-20

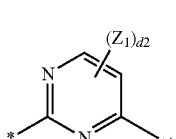

Formula 2-21

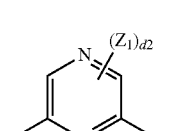

Formula 2-22

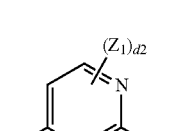

Formula 2-23

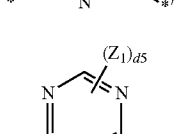

Formula 2-24

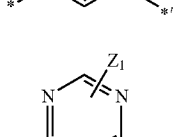

in Formulae 2-1 to 2-24,
$Y_1$ is O, S, $C(R_{21})(R_{22})$, or $N(R_{23})$;
$Z_1$, $Z_2$ and $R_{21}$ to $R_{23}$ are, each independently the same or different within a formula and across formulas, selected from : a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a $C_6$-$C_{20}$ aryl group and a $C_2$-$C_{20}$ heteroaryl group; a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, $C_1$-$C_{60}$ alkyl group, $C_2$-$C_{60}$ alkenyl group, $C_2$-$C_{60}$ alkynyl group, $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —Si($Q_{13}$)($Q_{14}$)($Q_{15}$) where $Q_{13}$ to $Q_{15}$ are each independently a $C_1$-$C_{20}$ alkyl group, a $C_1$-$C_{20}$ alkoxy group, a $C_6$-$C_{20}$ aryl group, or a $C_2$-$C_{20}$ heteroaryl group;
d1 is an integer of 1 to 4;
d2 is an integer of 1 to 3;
d3 is an integer of 1 to 6;
d4 is an integer of 1 to 8;
d5 is an integer of 1, or 2;
\* represents a binding site with "N" in Formula 1 or a binding site with neighboring $X_1$ or $X_2$; and
\*' represents a binding site with a pyrene ring of Formula 1 or a binding site with a neighboring $X_1$ or $X_2$.

4. An amine-based compound of claim 1, wherein
$Z_1$, $Z_2$ and $R_{21}$ to $R_{23}$ are each independently selected from:
a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —Si $(Q_{13})(Q_{14})(Q_{15})$ where $Q_{13}$ to $Q_{15}$ are each independently a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

5. An amine-based compound of claim 1, wherein $X_1$ and $X_2$ are each independently represented by one of Formulae 3-1 to 3-9 below:

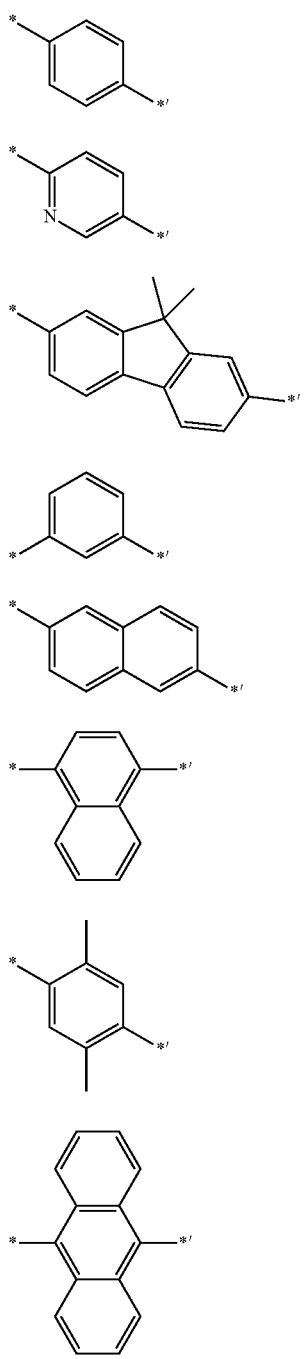

Formula 3-1

Formula 3-2

Formula 3-3

Formula 3-4

Formula 3-5

Formula 3-6

Formula 3-7

Formula 3-8

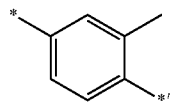

Formula 3-9

\* represents a binding site with "N" in Formula 1 or a binding site with neighboring $X_1$ or $X_2$; and
\*' represents a binding site with a pyrene ring in Formula 1 or a binding site with a neighboring $X_1$ or $X_2$.

6. An amine-based compound of claim 1, wherein
i) a=0 and b=0;
ii) a=1 and b=0;
iii) a=2 and b=0; or
iv) a=1 and b=1.

7. An amine-based compound of claim 1, wherein $Ar_1$ is a substituted or unsubstituted phenyl group, a substituted or unsubstituted pentalenyl group, a substituted or unsubstituted indenyl group, a substituted or unsubstituted naphthyl group, a substituted or unsubstituted azulenyl group, a substituted or unsubstituted heptalenyl group, a substituted or unsubstituted indacenyl group, a substituted or unsubstituted acenaphthyl group, a substituted or unsubstituted fluorenyl group, a substituted or unsubstituted spiro-fluorenyl group, a substituted or unsubstituted phenalenyl group, a substituted or unsubstituted phenanthrenyl group, a substituted or unsubstituted anthryl group, a substituted or unsubstituted fluoranthenyl group, a substituted or unsubstituted triphenylenyl group, a substituted or unsubstituted pyrenyl group, a substituted or unsubstituted chrysenyl group, a substituted or unsubstituted naphthacenyl group, a substituted or unsubstituted picenyl group, a substituted or unsubstituted perylenyl group, a substituted or unsubstituted pentaphenyl group, a substituted or unsubstituted hexacenyl group, a substituted or unsubstituted pyrrolyl group, a substituted or unsubstituted imidazolyl group, a substituted or unsubstituted pyrazolyl group, a substituted or unsubstituted pyridinyl group, a substituted or unsubstituted pyrazinyl group, a substituted or unsubstituted pyrimidinyl group, a substituted or unsubstituted pyridazinyl group, a substituted or unsubstituted isoindolyl group, a substituted or unsubstituted indolyl group, a substituted or unsubstituted indazolyl group, a substituted or unsubstituted purinyl group, a substituted or unsubstituted quinolinyl group, a substituted or unsubstituted benzoquinolinyl group, a substituted or unsubstituted phthalazinyl group, a substituted or unsubstituted naphthyridinyl group, a substituted or unsubstituted quinoxalinyl group, a substituted or unsubstituted quinazolinyl group, a substituted or unsubstituted cinnolinyl group, a substituted or unsubstituted carbazolyl group, a substituted or unsubstituted phenanthridinyl group, a substituted or unsubstituted acridinyl group, a substituted or unsubstituted phenanthrolinyl group, a substituted or unsubstituted phenazinyl group, a substituted or unsubstituted benzooxazolyl, a substituted or unsubstituted benzoimidazolyl group, a substituted or unsubstituted furanyl group, a substituted or unsubstituted benzofuranyl group, a substituted or unsubstituted thiophenyl group, a substituted or unsubstituted benzothiophenyl group, a substituted or unsubstituted thiazolyl group, a substituted or unsubstituted isothiazolyl group, a substituted or unsubstituted benzothiazolyl group, a substituted or unsubstituted isoxazolyl group, a substituted or unsubstituted oxazolyl group, a substituted or unsubstituted triazolyl group, a substituted or unsubstituted tetrazolyl group, a substituted or unsubstituted oxadiazolyl group, a substituted or unsubstituted triazinyl group, a substituted or unsubstituted benzooxazolyl, a substituted or unsubstituted dibenzofuranyl group, a substituted or unsubstituted dibenzothiophenyl group, or a substituted or unsubstituted benzocarbazolyl group.

8. An amine-based compound of claim 1, Ar₁ is represented by one of Formulae 4-1 to 4-22 below:

Formula 4-1
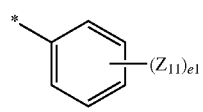

Formula 4-2
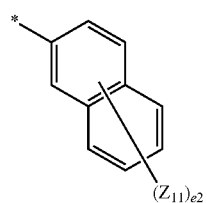

Formula 4-3
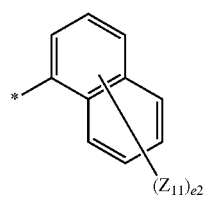

Formula 4-4
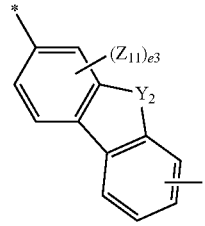

Formula 4-5
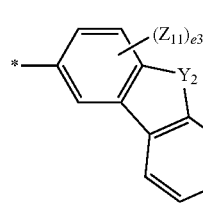

Formula 4-6
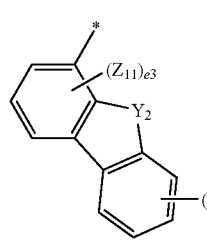

-continued

Formula 4-7
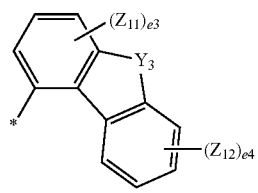

Formula 4-8
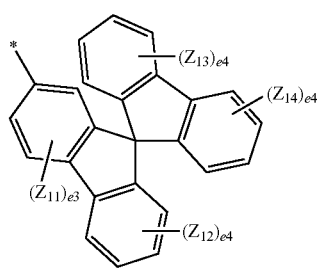

Formula 4-9
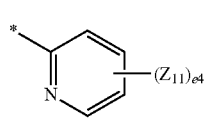

Formula 4-10
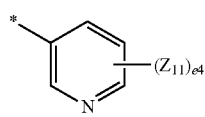

Formula 4-11
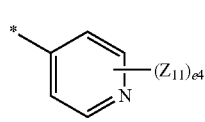

Formula 4-12
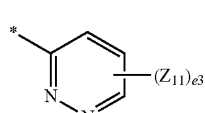

Formula 4-13
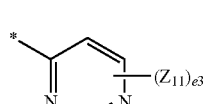

Formula 4-14
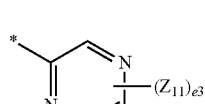

Formula 4-15
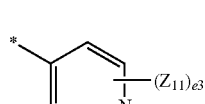

Formula 4-16
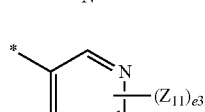

Formula 4-17
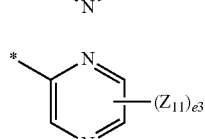

-continued

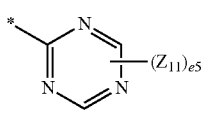
Formula 4-18

Formula 4-19

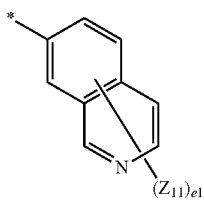
Formula 4-20

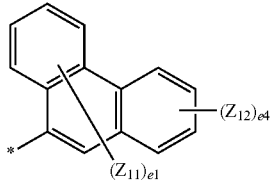
Formula 4-21

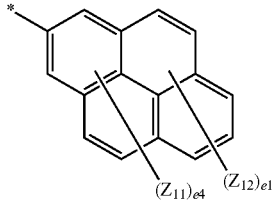
Formula 4-22 in Formulae 4-1 to 4-22, $Y_2$ is O, S, $C(R_{25})(R_{26})$, or $N(R_{27})$;

$Z_{11}$ to $Z_{14}$ and $R_{25}$ to $R_{27}$ are each independently, the same or different within each formula and across formulas, selected from : a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a $C_6$-$C_{20}$ aryl group and a $C_2$-$C_{20}$ heteroaryl group; a $C_6$-$C_{20}$ aryl group and a $C_2$-$C_{20}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —$Si(Q_{13})(Q_{14})(Q_{15})$ where the $Q_{13}$ to $Q_{15}$ are a $C_1$-$C_{20}$ alkyl group, a $C_1$-$C_{20}$ alkoxy group, a $C_6$-$C_{20}$ aryl group, or a $C_2$-$C_{20}$ heteroaryl group;

e1 is an integer of 1 to 5;
e2 is an integer of 1 to 7;
e3 is an integer of 1 to 3;
e4 is an integer of 1 to 4;
e5 is an integer of 1 or 2; and
* represents a binding site with "N" in Formula 1.

9. An amine-based compound of claim 8, wherein
$Z_{11}$ to $Z_{14}$ and $R_{25}$ to $R_{27}$ are each independently selected from : a hydrogen atom, a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —$Si(Q_{13})(Q_{14})(Q_{15})$ where the $Q_{13}$ to $Q_{15}$ are a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

10. An amine-based compound of claim 1, wherein
$Ar_1$ is represented by one of Formulae 5-1 to 5-23 below:

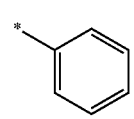
Formula 5-1

| | |
|---|---|
| Formula 5-2 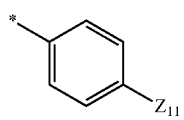 | Formula 5-9 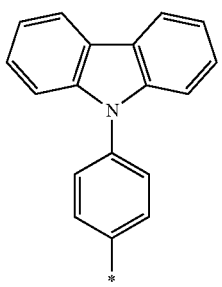 |
| Formula 5-3 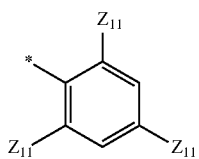 | |
| Formula 5-4 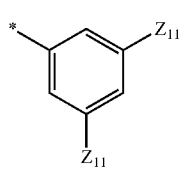 | Formula 5-10 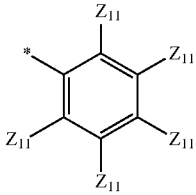 |
| Formula 5-5 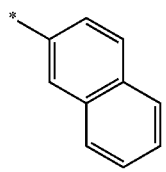 | Formula 5-11 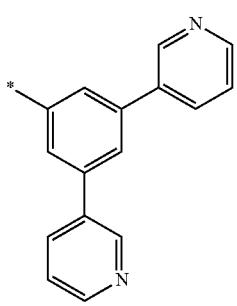 |
| Formula 5-6 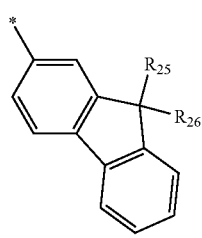 | Formula 5-12 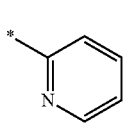 |
| Formula 5-7 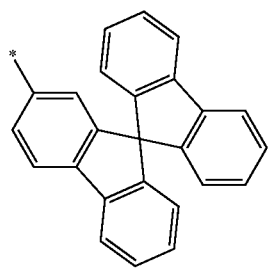 | Formula 5-13 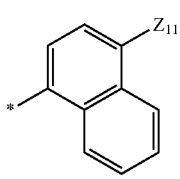 |
| | Formula 5-14 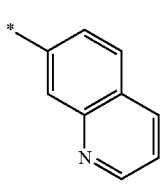 |
| Formula 5-8 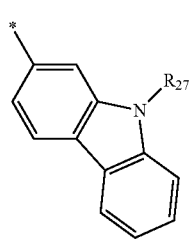 | Formula 5-15 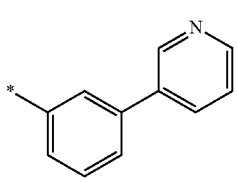 |

-continued

Formula 5-16

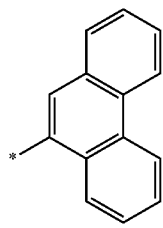

Formula 5-17

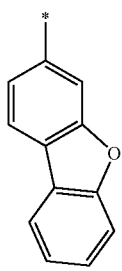

Formula 5-18

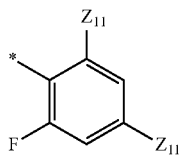

Formula 5-19

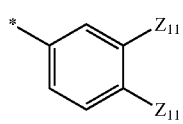

Formula 5-20

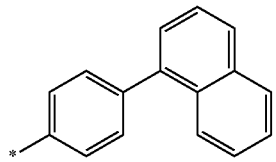

Formula 5-21

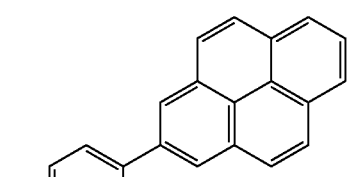

Formula 5-22

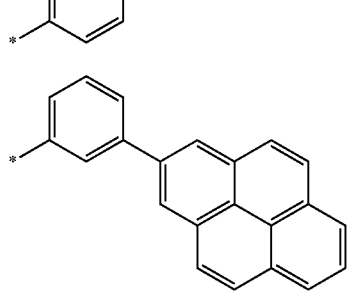

Formula 5-23

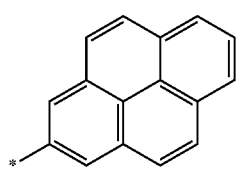

$Z_{11}$ and $R_{25}$ to $R_{27}$ in Formulae 5-1 to 5-23 are, each independently, the same or different within each formula and across formulas, selected from: a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, hydrazone, a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —Si($Q_{13}$)($Q_{14}$)($Q_{15}$) where the $Q_{13}$ to $Q_{15}$ are a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group, and * represents a binding site to "N" in Formula 1.

11. An amine-based compound of claim 1, wherein $X_1$ and $X_2$ are each independently represented by one of Formulae 3-1 to 3-9 below;

i) a=0 and b=0, ii) a=1 and b=0, iii) a=2 and b=0, or iv) a=1 and b=1; and $Ar_1$ is represented by one of Formulae 5-1 to 5-23 below:

Formula 3-1

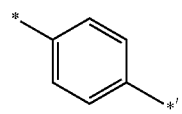

Formula 3-2

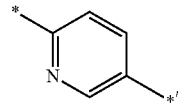

-continued
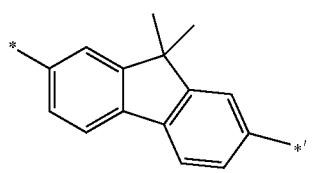
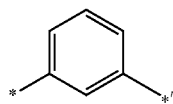
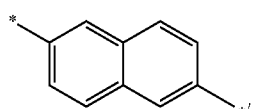
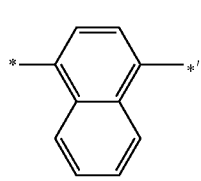
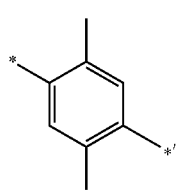
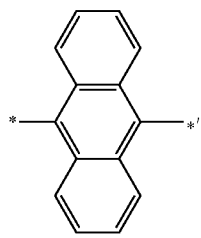
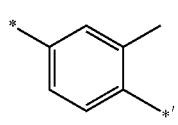
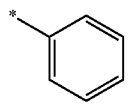
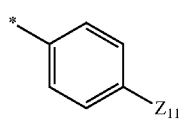
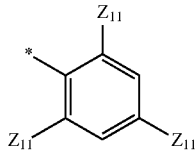
-continued
Formula 3-3
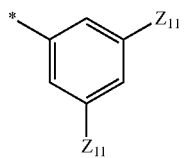
Formula 3-4
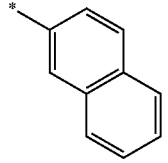
Formula 3-5
Formula 3-6
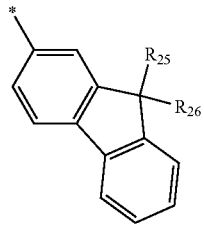
Formula 3-7
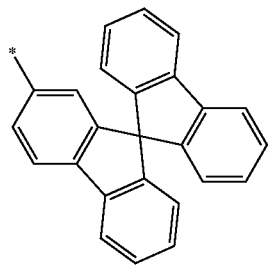
Formula 3-8
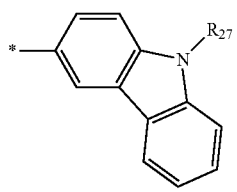
Formula 3-9
Formula 5-1
Formula 5-2
Formula 5-3
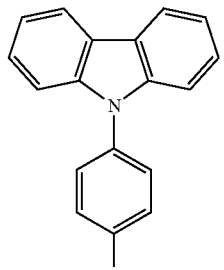
Formula 5-4
Formula 5-5
Formula 5-6
Formula 5-7
Formula 5-8
Formula 5-9
Formula 5-10
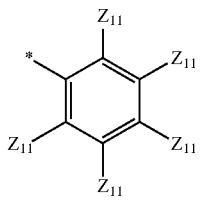

-continued

Formula 5-11
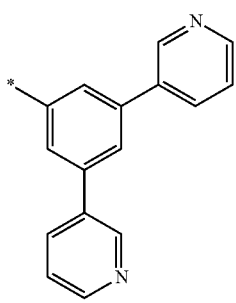

Formula 5-12
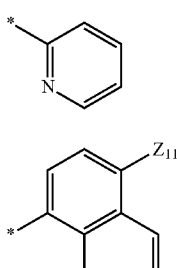

Formula 5-13
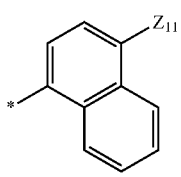

Formula 5-14
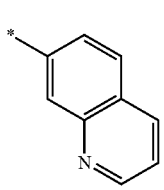

Formula 5-15
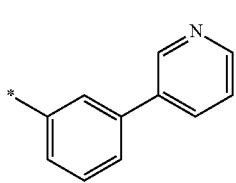

Formula 5-16
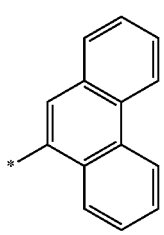

Formula 5-17
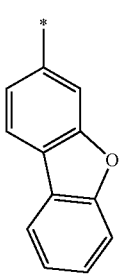

Formula 5-18
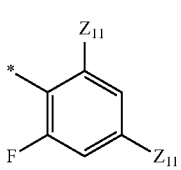

-continued

Formula 5-19
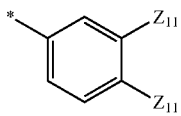

Formula 5-20
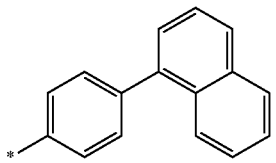

Formula 5-21
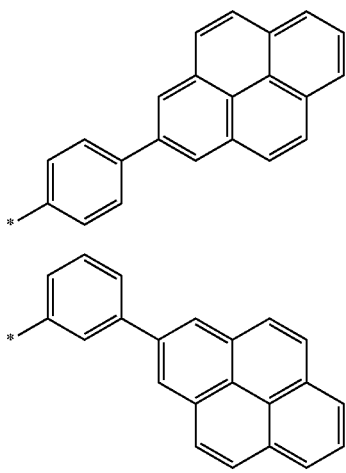

Formula 5-22
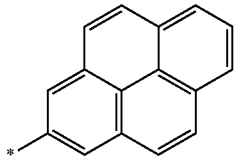

Formula 5-23 in Formulae 3-1 to 3-9, * represents a binding site with "N" in Formula 1 or a binding site with neighboring $X_1$ or $X_2$; and *' represents a binding site with a pyrene ring in Formula 1 or a binding site with a neighboring $X_1$ or $X_2$;

in Formulae 5-1 to 5-23, $Z_{11}$ and $R_{25}$ to $R_{27}$ are, each independently the same or different within each formula and across formulas, selected from: a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, and a $C_1$-$C_{20}$ alkoxy group; a $C_1$-$C_{20}$ alkyl group and a $C_1$-$C_{20}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group; a phenyl group, a naphthyl group, an anthryl group, a fluorenyl group, a carbazolyl group, a pyridinyl group, a pyrimidinyl group, a pyrazinyl group, a pyridazinyl group, a triazinyl group, a quinolinyl group, and an isoquinolinyl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —Si($Q_{13}$)($Q_{14}$)($Q_{15}$) where the $Q_{13}$ to $Q_{15}$ are a $C_1$-$C_{20}$ alkyl group, a $C_1$-$C_{20}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, or an isoquinolinyl group.

12. The amine-based compound of claim 1, wherein the amine-based compound is one of Compounds 1 to 54 below:

1

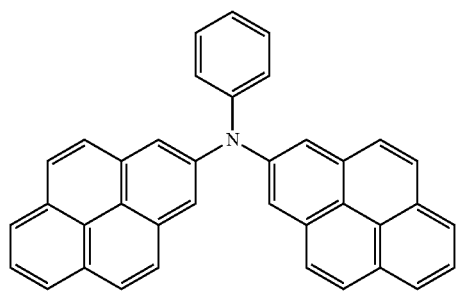

2

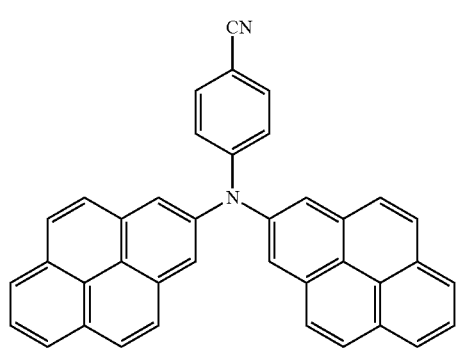

3

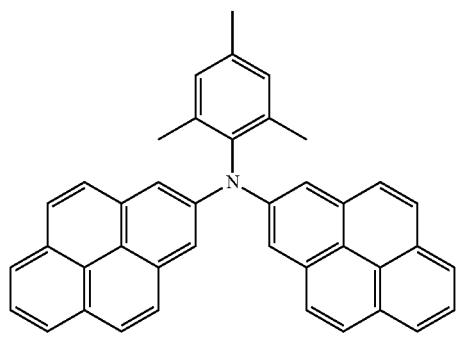

-continued

4

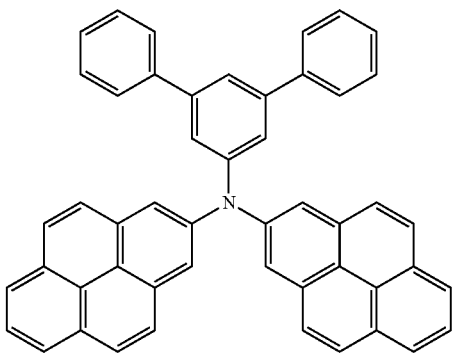

5

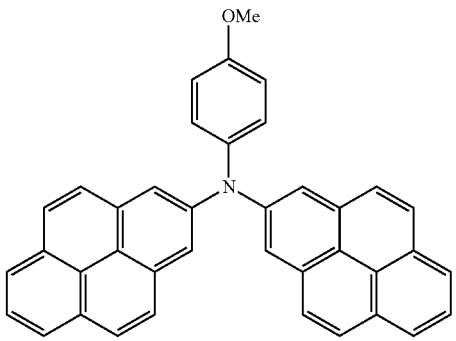

6

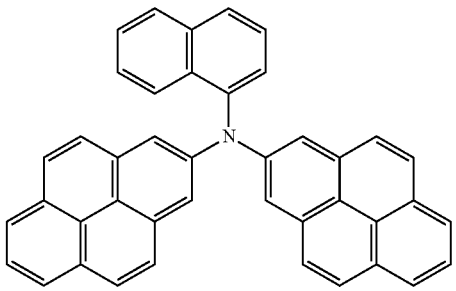

7

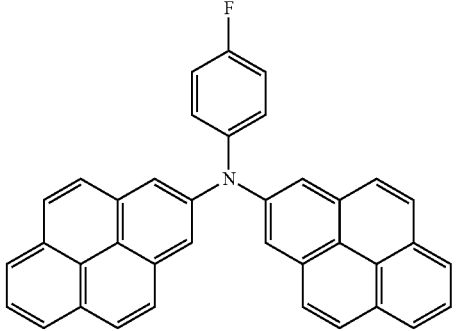

8

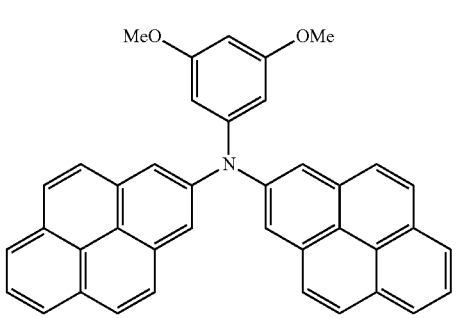

121
-continued
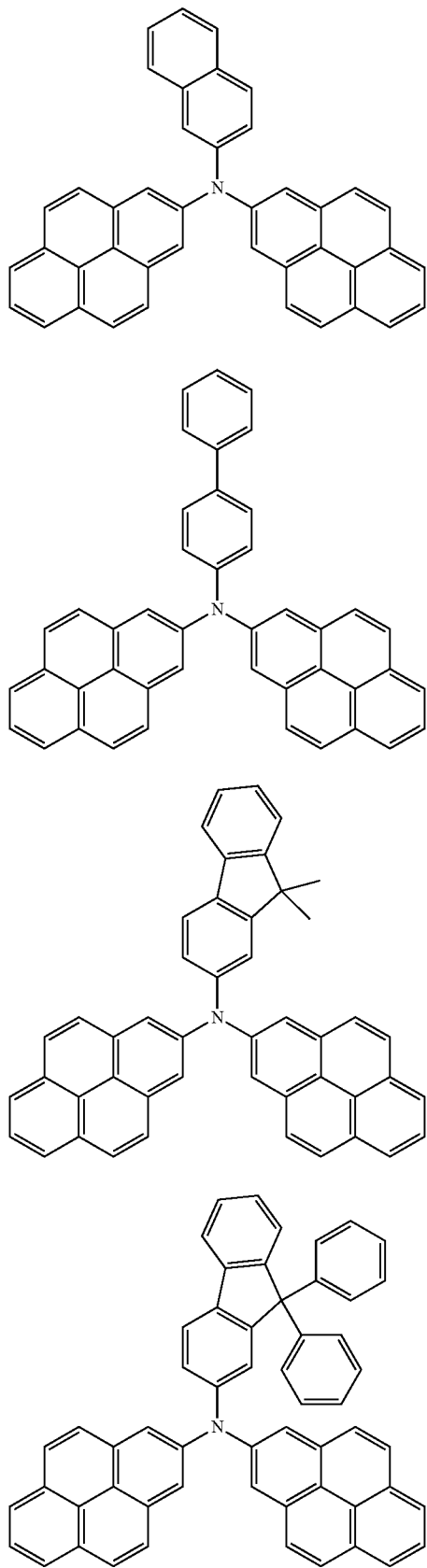
122
-continued
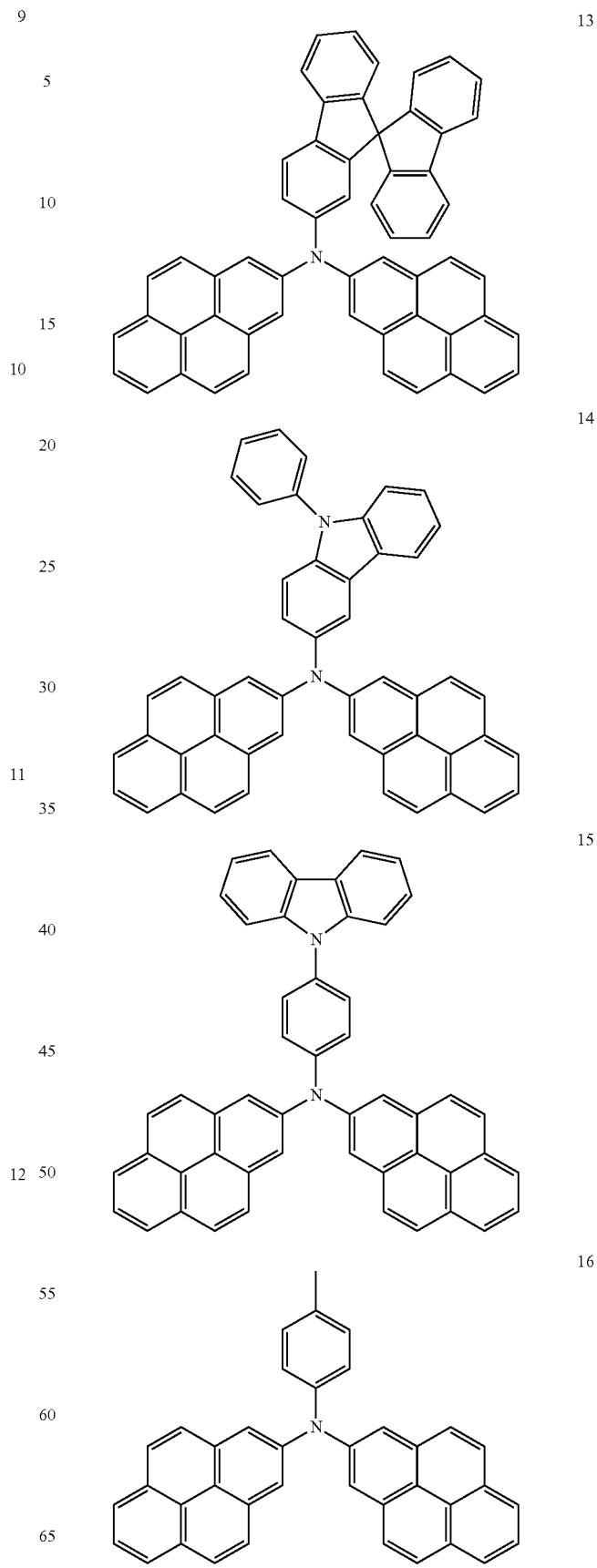

17
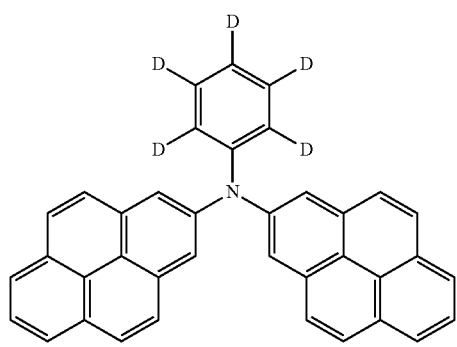
18
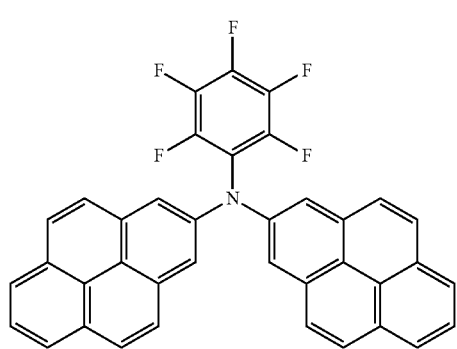
19
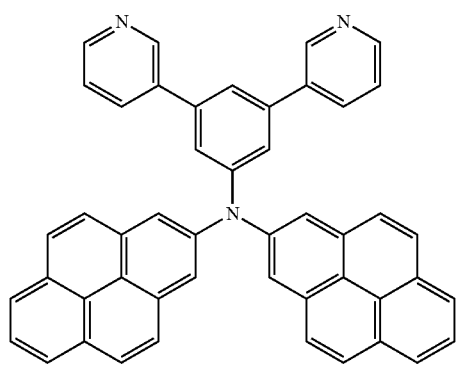
20
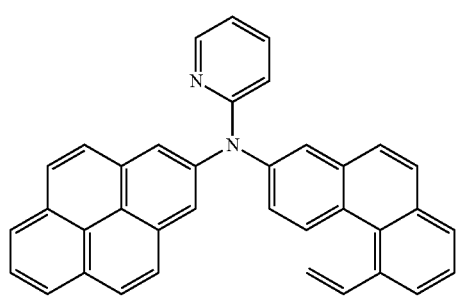
21
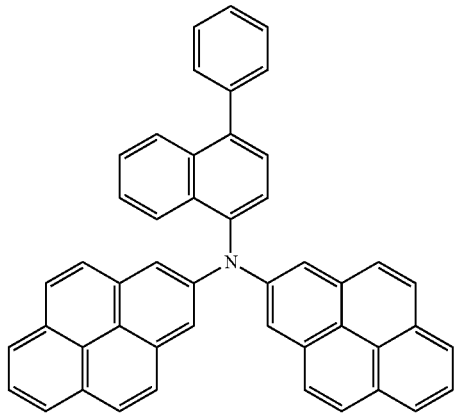
22
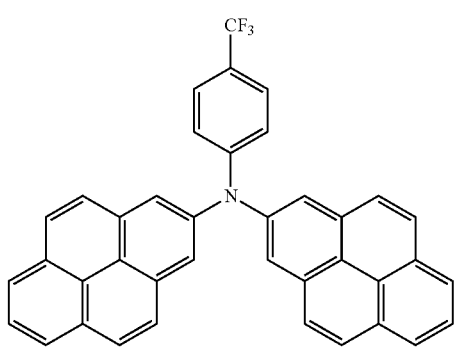
23
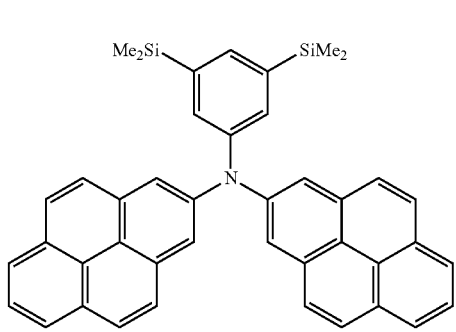
24
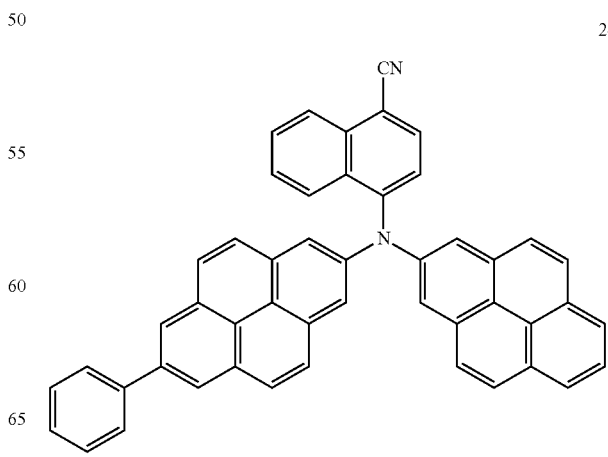

125
-continued
126
-continued
25
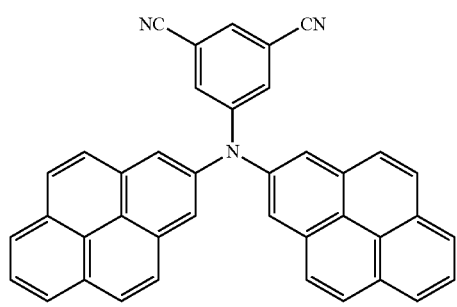
28
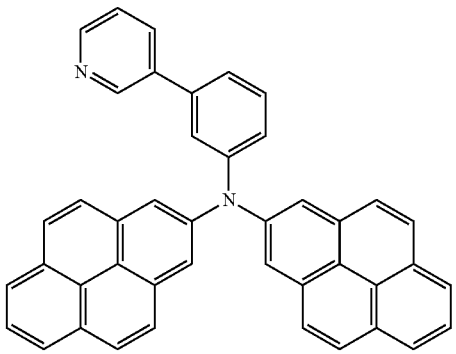
26
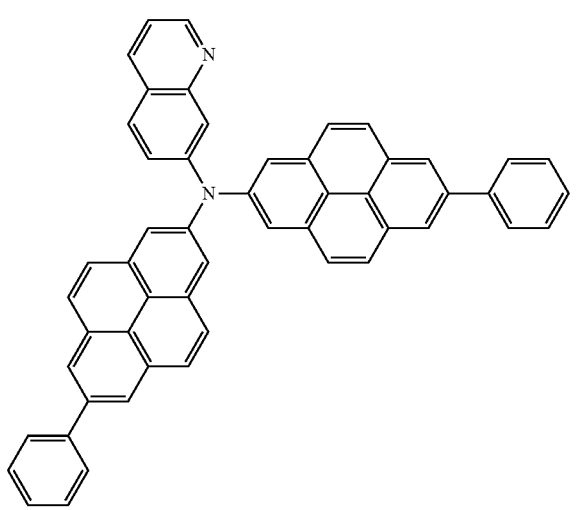
29
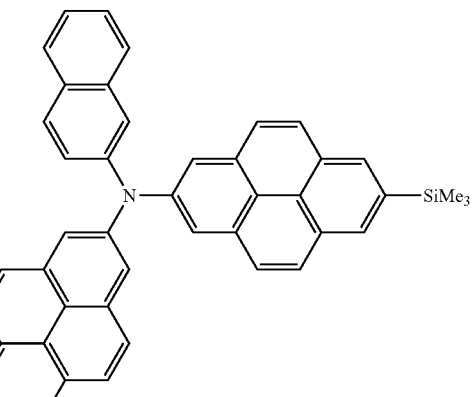
27
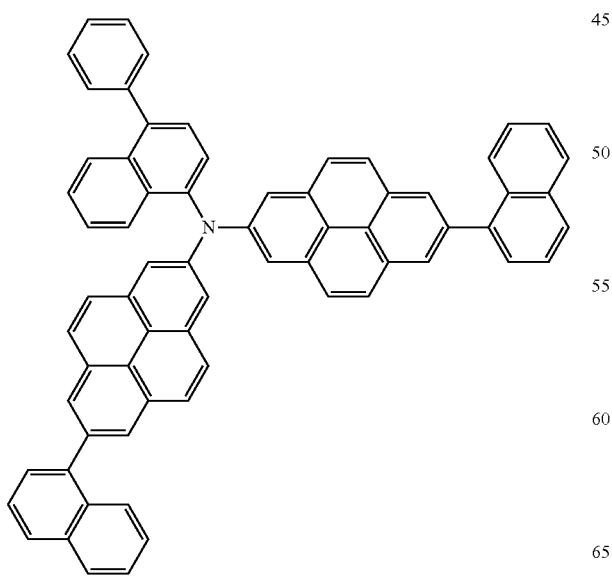
30
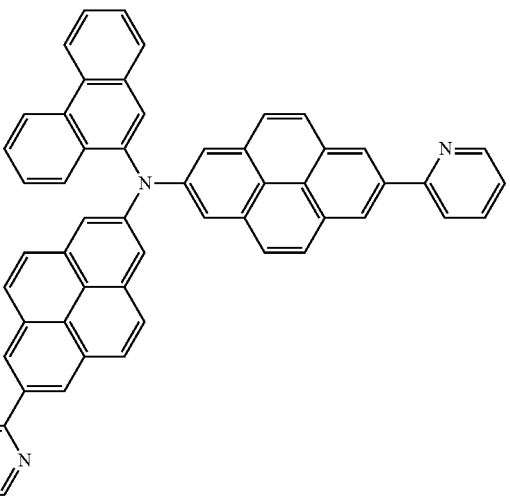

31
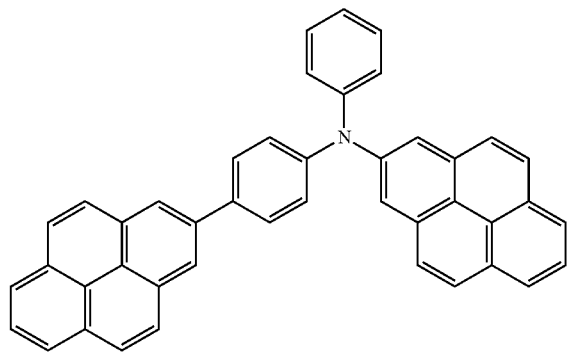
32
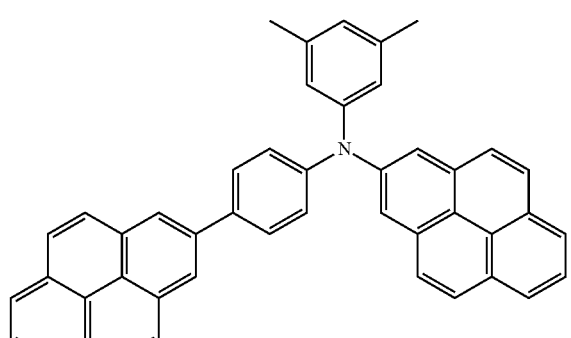
33
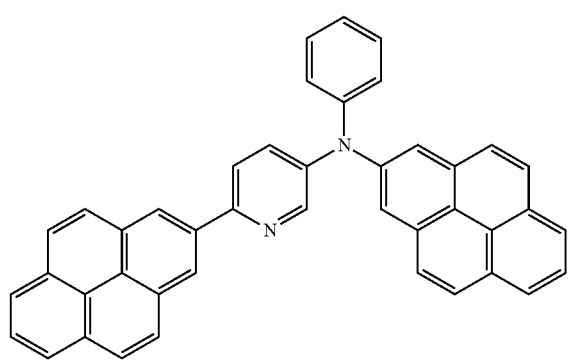
34
35
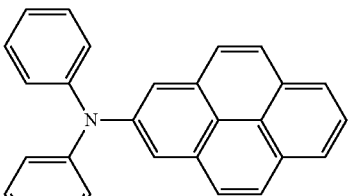
36
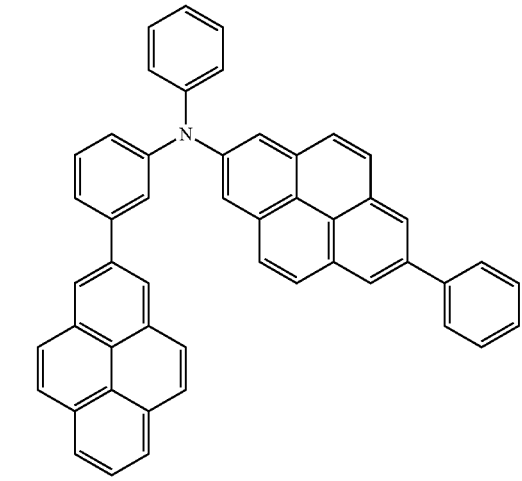
37

38
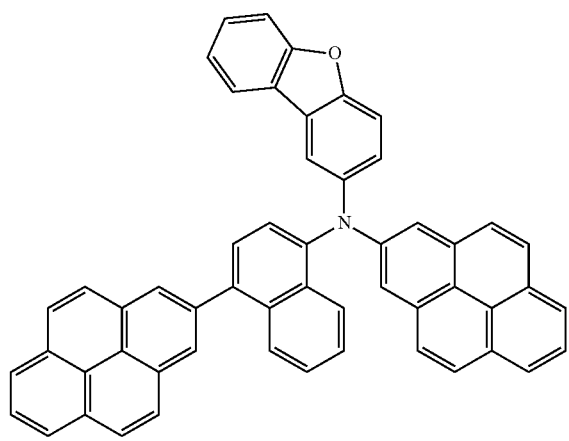
39
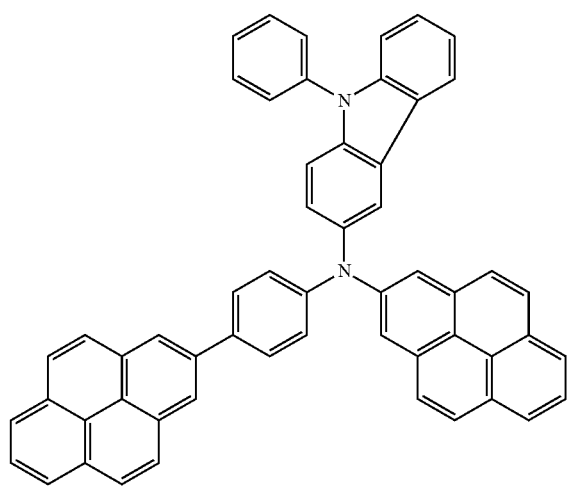
40
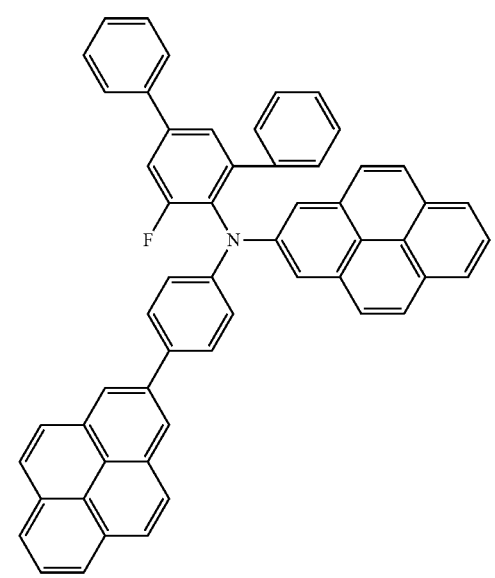
41
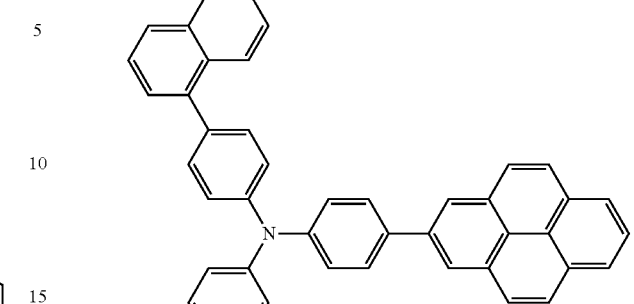
42
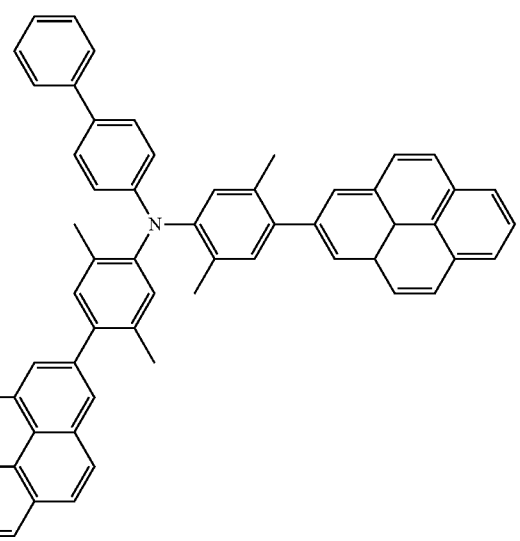
43

44
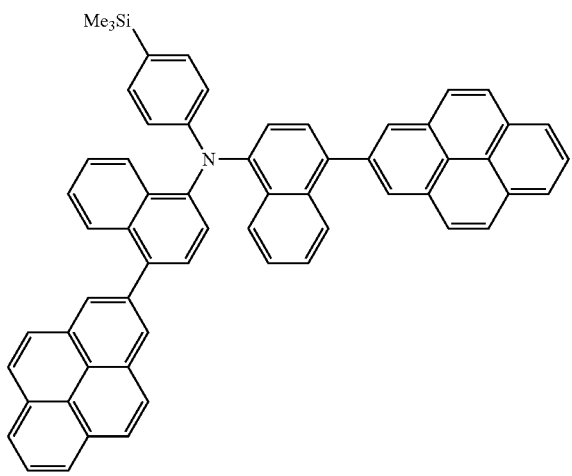
45
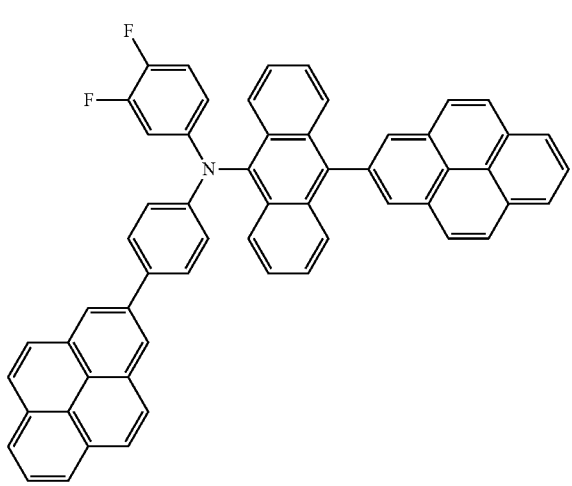
46
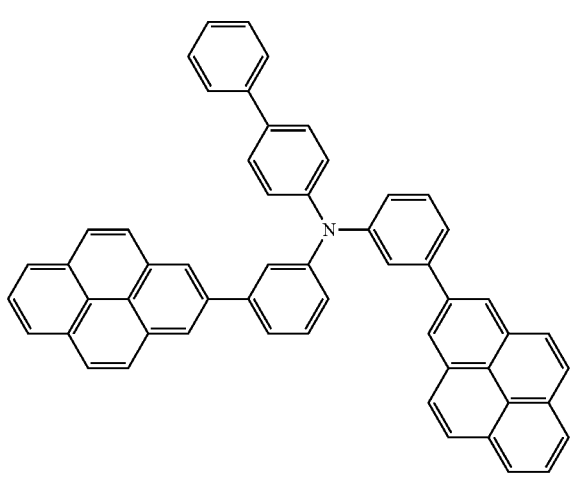
47
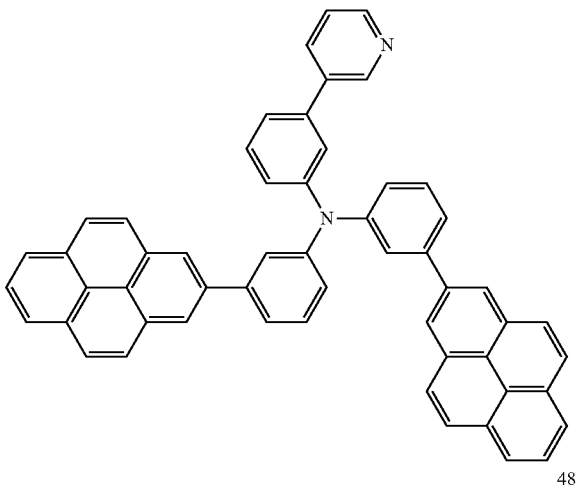
48
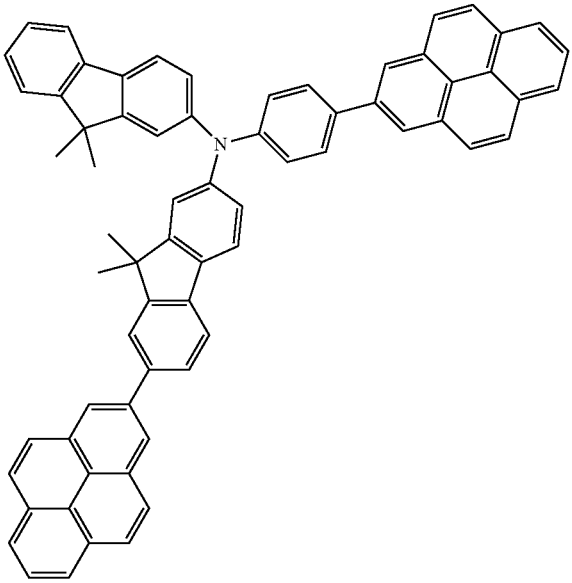
49
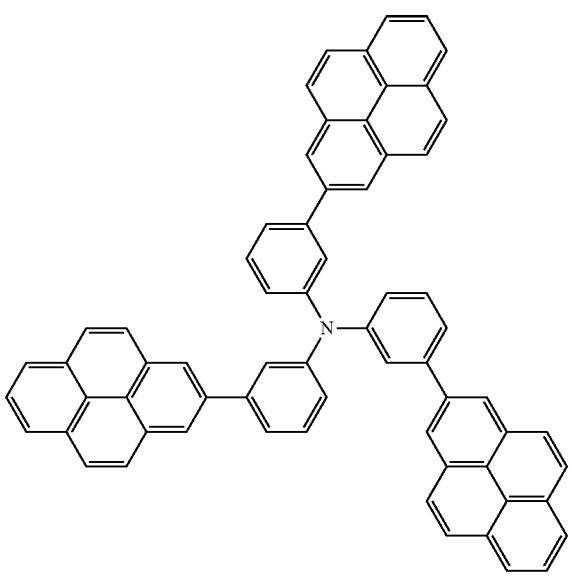

133
-continued

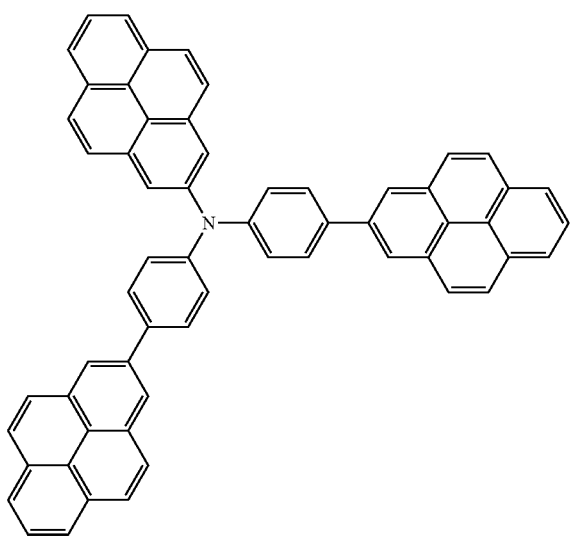
50

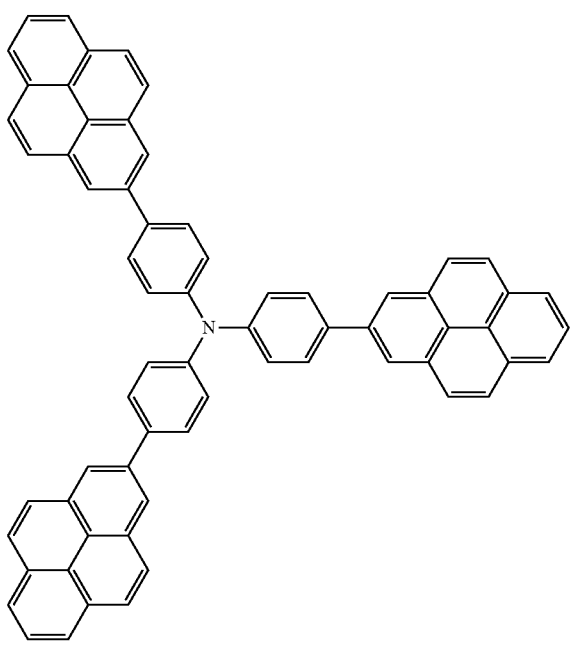
51

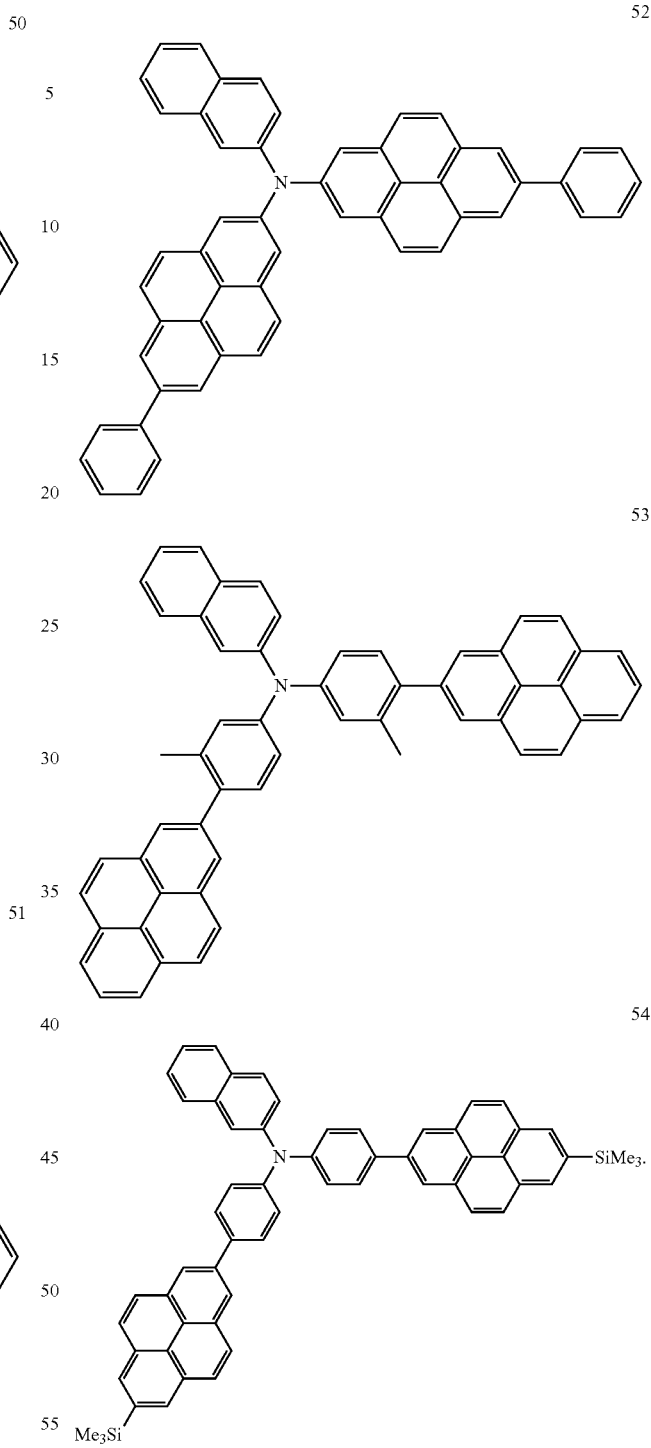

134
-continued

13. The amine-based compound of claim 1, wherein at least one substituent of the substituted $C_3$-$C_{10}$ cycloalkylene group, the substituted $C_2$-$C_{10}$ heterocycloalkylene group, the substituted $C_3$-$C_{10}$ cycloalkenylene group, the substituted $C_2$-$C_{10}$ heterocycloalkenylene group, the substituted $C_6$-$C_{60}$ arylene group, the substituted $C_2$-$C_{60}$ heteroarylene group, the substituted $C_3$-$C_{10}$ cycloalkyl group, the substituted $C_2$-$C_{10}$ heterocycloalkyl group, the substituted $C_3$-$C_{10}$ cycloalkenyl group, the substituted $C_2$-$C_{10}$ heterocycloalkenyl group, the substituted $C_6$-$C_{60}$ aryl group, the substituted $C_2$-$C_{60}$ heteroaryl group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_6$-$C_{60}$ aryloxy group, and the substituted $C_6$-$C_{60}$ arylthio group is selected from : a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group; a $C_1$-$C_{60}$ alkyl group, a $C_2$-$C_{60}$ alkenyl group, a $C_2$-$C_{60}$ alkynyl group, and a $C_1$-$C_{60}$ alkoxy group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, and a phosphoric acid group or a salt thereof; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, a $C_6$-$C_{60}$ aryloxy group, a $C_6$-$C_{60}$ arylthio group and a $C_2$-$C_{60}$ heteroaryl group; a $C_3$-$C_{10}$ cycloalkyl group, a $C_3$-$C_{10}$ heterocycloalkyl group, a $C_3$-$C_{10}$ cycloalkenyl group, a $C_3$-$C_{10}$ heterocycloalkenyl group, a $C_6$-$C_{60}$ aryl group, arylthio group, a $C_6$-$C_{60}$ aryloxy group, and a $C_2$-$C_{60}$ heteroaryl group, substituted with at least one of a deuterium atom, a halogen atom, a hydroxyl group, a cyano group, a nitro group, an amino group, an amidino group, a hydrazine, a hydrazone, a carboxyl group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthryl group, a fluorenyl group, a dimethylfluorenyl group, a diphenylfluorenyl group, a carbazolyl group, a phenylcarbazolyl group, a pyridinyl group, a pyrimidinyl group, a pyrazinyl group, a pyridazinyl group, a triazinyl group, a quinolinyl group, and an isoquinolinyl group; and —Si($Q_{13}$)($Q_{14}$)($Q_{15}$) where $Q_{13}$ to $Q_{15}$ are $C_1$-$C_{60}$ alkyl group, $C_1$-$C_{60}$ alkoxy group, $C_6$-$C_{60}$ aryl group, or $C_2$-$C_{60}$ heteroaryl group.

14. The organic light-emitting diode of claim 1, wherein the organic layer comprises at least one of a hole injection layer, a hole transport layer, a functional layer having a hole injection ability and a hole transport ability, a buffer layer, an electron blocking layer, an emission layer, a hole blocking layer, an electron transport layer, an electron injection layer, and a functional layer including an electron injection and an electron transport ability.

15. The organic light-emitting diode of claim 14, wherein the organic layer comprises at least one of a hole injection layer, a hole transport layer, a functional layer having a hole injection ability and a hole transport ability, and at least one of the hole injection layer, the hole transport layer, the functional layer having a hole injection ability and a hole transport ability comprises the amine-based compound of formula 1.

16. The organic light-emitting diode of claim 15, wherein at least one of the hole injection layer, the hole transport layer, the functional layer having a hole injection ability and a hole transport ability further comprises a charge generation material.

17. The organic light-emitting diode of claim 1, wherein the host comprises an anthracene-based compound.

\* \* \* \* \*